(12) United States Patent
Wang et al.

(10) Patent No.: US 12,051,562 B2
(45) Date of Patent: Jul. 30, 2024

(54) METHOD, APPARATUS, AND SYSTEM FOR WAFER GROUNDING

(71) Applicant: ASML Netherlands B.V., Veldhoven (NL)

(72) Inventors: Yixiang Wang, Fremont, CA (US); Shibing Liu, San Jose, CA (US); Shanhui Cao, San Jose, CA (US); Kangsheng Qiu, San Jose, CA (US); Juying Dou, San Jose, CA (US); Ying Luo, San Jose, CA (US); Yinglong Li, San Jose, CA (US); Qiang Li, Campbell, CA (US); Ronald Van Der Wilk, Knegsel (NL); Jan-Gerard Cornelis Van Der Toorn, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 241 days.

(21) Appl. No.: 17/753,298

(22) PCT Filed: Aug. 25, 2020

(86) PCT No.: PCT/EP2020/073704
§ 371 (c)(1),
(2) Date: Feb. 25, 2022

(87) PCT Pub. No.: WO2021/037827
PCT Pub. Date: Mar. 4, 2021

(65) Prior Publication Data
US 2022/0277926 A1 Sep. 1, 2022

Related U.S. Application Data

(60) Provisional application No. 63/068,839, filed on Aug. 21, 2020, provisional application No. 63/022,374, (Continued)

(51) Int. Cl.
*H01J 37/20* (2006.01)
*H01L 21/683* (2006.01)

(52) U.S. Cl.
CPC .......... *H01J 37/20* (2013.01); *H01L 21/6833* (2013.01); *H01J 2237/0044* (2013.01)

(58) Field of Classification Search
CPC .................................................. H01L 21/6833
See application file for complete search history.

(56) References Cited

U.S. PATENT DOCUMENTS

| 5,179,498 A | 1/1993 | Hongoh et al. |
| 5,459,632 A * | 10/1995 | Birang .................. H02N 13/00 307/130 |

(Continued)

FOREIGN PATENT DOCUMENTS

| CN | 1890806 A | 1/2007 |
| EP | 0680083 A2 | 11/1995 |

(Continued)

OTHER PUBLICATIONS

PCT Notification of Transmittal of the International Search Report and the Written Opinion, and PCT International Search Report, corresponding to PCT Application No. PCT/EP2020/073704, mailed Nov. 26, 2020 (4 pages).

(Continued)

*Primary Examiner* — Jared Fureman
*Assistant Examiner* — Christopher J Clark
(74) *Attorney, Agent, or Firm* — Finnegan, Henderson, Farabow, Garrett & Dunner, LLP

(57) ABSTRACT

Systems and methods for wafer grounding and wafer grounding location adjustment are disclosed. A first method may include receiving a first value of an electric characteristic associated with the wafer being grounded by an electric signal; determining a first control parameter using at least (Continued)

the first value; and controlling a characteristic of the electric signal using the first control parameter and the first value. A second method for adjusting a grounding location for a wafer may include terminating an electric connection between the wafer and at least one grounding pin in contact the wafer; adjusting a relative position between the wafer and the grounding pin; and restoring the electric connection between the grounding pin and the wafer. A third method may include causing a grounding pin to penetrate through a coating on the wafer by impact; and establishing an electrical connection between the grounding pin and the wafer.

10 Claims, 27 Drawing Sheets

Related U.S. Application Data filed on May 8, 2020, provisional application No. 62/893,135, filed on Aug. 28, 2019.

(56) References Cited

U.S. PATENT DOCUMENTS

| | | | |
|---|---|---|---|
| 8,094,428 B2 | 1/2012 | Wang et al. | |
| 8,908,348 B2 | 12/2014 | Wang et al. | |
| 9,991,147 B2 | 6/2018 | Wang et al. | |
| 2007/0187615 A1 | 8/2007 | Low et al. | |
| 2010/0103583 A1* | 4/2010 | Wang | H01L 21/6833 |
| | | | 361/234 |
| 2010/0110603 A1 | 5/2010 | La Fontaine et al. | |
| 2010/0110604 A1* | 5/2010 | Smith | H01L 21/6831 |
| | | | 361/234 |
| 2011/0051306 A1 | 3/2011 | Wang et al. | |
| 2015/0322564 A1* | 11/2015 | Lee | C23C 14/50 |
| | | | 269/296 |

FOREIGN PATENT DOCUMENTS

| | | |
|---|---|---|
| JP | H08-64664 A | 3/1996 |
| JP | 2004-146654 A | 5/2004 |
| JP | 2010-177686 A | 8/2010 |
| TW | 200532880 A | 10/2005 |
| TW | I437652 B | 5/2014 |
| TW | 201735172 A | 10/2017 |
| TW | 201803007 A | 1/2018 |

OTHER PUBLICATIONS

Taiwan Office Action and a Search Report, corresponding to ROC (Taiwan) patent Application No. 109129281, mailed Jun. 2, 2021 (9 pages).

* cited by examiner

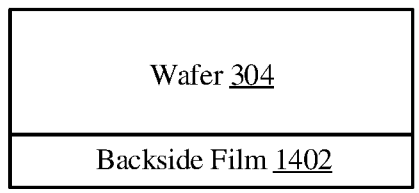
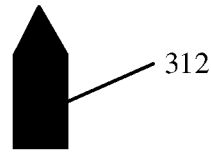
FIG. 14A
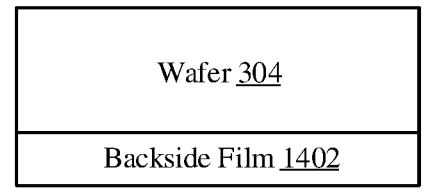
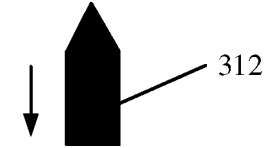
FIG. 14B
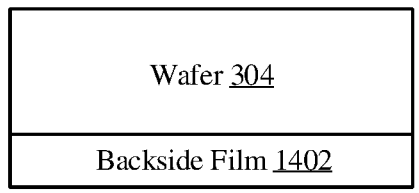
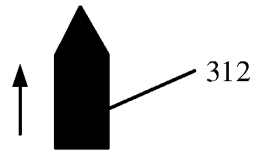
FIG. 14C
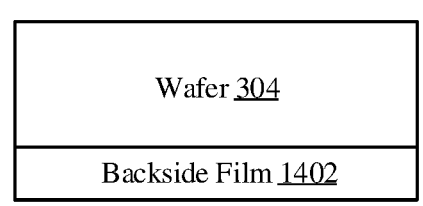
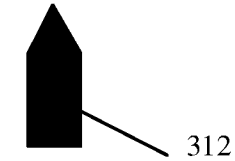
FIG. 14D

METHOD, APPARATUS, AND SYSTEM FOR WAFER GROUNDING

CROSS-REFERENCE TO RELATED APPLICATIONS

This application claims priority to International Application No. PCT/EP2020/073704, filed Aug. 25, 2020, and published as WO 2021/037827 A1, which claims priority of U.S. application 62/893,135, which was filed on Aug. 28, 2019, and of U.S. application 63/022,374, which was filed on May 8, 2020, and of U.S. application 63/068,839, which was filed on Aug. 21, 2020. The contents of these applications are incorporated herein by reference in their entireties.

FIELD

The description herein relates to the field of charged particle beam apparatus, and more particularly to wafer grounding and biasing for semiconductor wafer manufacture.

BACKGROUND

A charged particle beam apparatus is able to produce a 2-dimensional image of a wafer substrate by detecting secondary electrons, backscattered electrons, mirror electrons, or other kinds of electrons from the surface of the wafer substrate upon impingement by a charged particle beam generated by the charged particle beam apparatus. Various charged particle beam apparatuses are used on semiconductor wafers in semiconductor industry for various purposes such as wafer processing (e.g., e-beam direct write lithography system), process monitoring (e.g., critical dimension scanning electron microscope (CD-SEM)), wafer inspection (e.g., e-beam inspection system), defect analysis (e.g., defect review SEM, or say DR-SEM and Focused Ion Beam system, or say FIB), etc. When such apparatus performs its function, for better imaging, the electrical potential of the wafer substrate may be held at a predetermined value or be biased. This can be achieved by electrically, or more specifically, resistively connecting the target wafer substrate to a programmable DC voltage source (e.g., a wafer bias supply) when the wafer substrate interacts with the charged particle beam during which process excess charges are brought to the wafer substrate. This process can be referred to as wafer biasing.

For wafer biasing, the electrical contact from the wafer bias supply to the wafer substrate is conventionally made at the backside of the wafer substrate by using one or more electrical contacts that press against the backside surface of the wafer substrate as the front surface of the wafer is inappropriate to place the electrical contact.

SUMMARY

Embodiments of the present disclosure provide systems and methods for wafer grounding. In some embodiments, a method for grounding a wafer may include receiving a first value of an electric characteristic associated with the wafer being grounded by an electric signal. The method may also include determining a first control parameter using at least the first value. The method may further include controlling a characteristic of the electric signal using the first control parameter and the first value.

In some embodiments, a system for grounding a wafer is disclosed. The system may include a sensor configured to generate a first value of an electric characteristic associated with the wafer being grounded by an electric signal, an electric signal generator configured to generate the electric signal, and a controller including circuitry for receiving the first value of the electric characteristic, determining a first control parameter using at least the first value, and controlling a characteristic of the electric signal using the first control parameter and the first value.

In some embodiments, a method for adjusting a grounding location for a wafer is disclosed. The method may include terminating an electric connection between the wafer and a grounding pin in contact the wafer. The method may also include adjusting a relative position between the wafer and the grounding pin. The method may further include restoring the electric connection between the grounding pin and the wafer.

In some embodiments, a system for adjusting a grounding location for a wafer is disclosed. The inspection system may include a grounding pin configured to be in contact with the wafer and an actuator configured to terminate an electric connection between the wafer and the grounding pin, to adjust a relative position between the wafer and the grounding pin, and to restore the electric connection between the grounding pin and the wafer.

In some embodiments, a method for grounding a wafer is disclosed. The method may include establishing a set of contact points between multiple probes and the wafer. The method may also include applying a first set of electric signals to the set of contact points via the multiple probes to facilitate breakdown of a coating of the wafer. The method may further include, based on a determination that a resistance of an electric path between the multiple probes via the wafer is greater than or equal to a predetermined threshold value, applying a second set of electric signals to the set of contact points via the multiple probes, wherein the second set of electric signals are determined based on a value of an electric characteristic associated with the wafer when applying a first set of electric signals.

In some embodiments, a method for grounding a wafer is disclosed. The method may include establishing a first set of contact points between multiple probes and the wafer. The method may also include applying a first set of electric signals to the first set of contact points via the multiple probes to facilitate breakdown of a coating of the wafer. The method may further include, when a resistance of an electric path between the multiple probes via the wafer is greater than or equal to a predetermined threshold value, establishing a second set of contact points between the multiple probes and the wafer. The method may further include applying a second set of electric signals to the second set of contact points via the multiple probes, wherein the second set of electric signals are determined based on a value of an electric characteristic associated with the wafer when applying a first set of electric signals.

In some embodiments, a method for grounding a wafer is disclosed. The method may include causing a grounding pin to contact the wafer. The method may also include vibrating at least one of the grounding pin or the wafer. The method may further include establishing an electrical connection between the grounding pin and the wafer.

In some embodiments, a system is disclosed. The system may include a grounding pin, configured to be in contact with the wafer. The system may also include a controller having a circuit for vibrating at least one of the grounding pin or the wafer, and establishing an electric connection between the grounding pin and the wafer.

In some embodiments, a method for grounding a wafer is disclosed. The method may include causing a grounding pin to penetrate through the coating on the wafer by impact. The method may also include establishing an electrical connection between the grounding pin and the wafer.

In some embodiments, a system is disclosed. The system may include a grounding pin and a controller having a circuit for controlling the grounding pin to penetrate through a coating on the wafer by impact, and establishing an electric connection between the grounding pin and the wafer.

In some embodiments, a non-transitory computer-readable medium may store a set of instructions that is executable by at least one processor of an apparatus to cause the apparatus to perform a method. The method may include causing a grounding pin to penetrate through a coating on the wafer by impact. The method may also include establishing an electrical connection between the grounding pin and the wafer.

In some embodiments, a system for wafer grounding is disclosed. The system may include a first grounding pin. The system may also include an electrostatic holder including a first electrode inside the electrostatic holder. The system may further include a first overvoltage protection device electrically coupled between the first grounding pin and the first electrode, wherein the first overvoltage protection device is configured to conduct electricity when a first voltage applied on the first overvoltage protection device exceeds a threshold voltage, and stop conducting electricity when the first voltage does not exceed the threshold voltage.

In some embodiments, an apparatus for fast ramping of high voltage is disclosed. The apparatus may include an isolator arranged between a high-voltage part of the apparatus and a grounded part of the apparatus. The apparatus may also include a first electrode electrically coupled to the high-voltage part. The apparatus may further include a second electrode electrically coupled to the grounded part and non-conductive to the first electrode. The apparatus may further include a dielectric layer covering the first electrode and the second electrode over the isolator.

BRIEF DESCRIPTION OF THE DRAWINGS

FIGS. 14A-14D illustrate operation stages of an example system for wafer grounding, consistent with some embodiments of the present disclosure.

DETAILED DESCRIPTION

Figure 1:
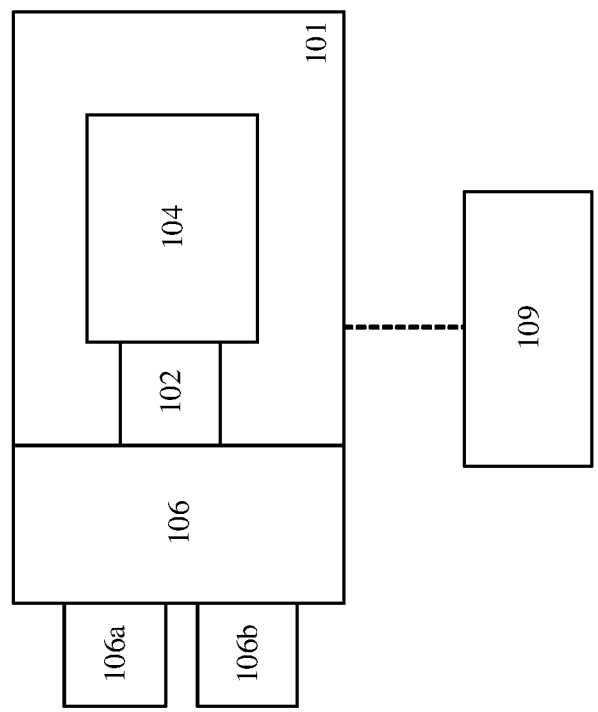
FIG. 1 is a schematic diagram illustrating an example electron beam inspection (EBI) system, consistent with some embodiments of the present disclosure.

Reference will now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the disclosure. Instead, they are merely examples of apparatuses and methods consistent with aspects related to the subject matter recited in the appended claims. Without limiting the scope of the present disclosure, some embodiments may be described in the context of providing detection systems and detection methods in systems utilizing electron beams ("e-beams"). However, the disclosure is not so limited. Other types of charged-particle beams (e.g., including protons, ions, muons, or any other particle carrying electric charges) may be similarly applied. Furthermore, systems and methods for detection may be used in other imaging systems, such as optical imaging, photon detection, x-ray detection, ion detection, or the like.

Electronic devices are constructed of circuits formed on a piece of semiconductor material called a substrate. The semiconductor material may include, for example, silicon, gallium arsenide, indium phosphide, or silicon germanium, or the like. Many circuits may be formed together on the same piece of silicon and are called integrated circuits or ICs. The size of these circuits has decreased dramatically so that many more of them can be fit on the substrate. For example, an IC chip in a smartphone can be as small as a thumbnail and yet may include over 2 billion transistors, the size of each transistor being less than 1/1000th the size of a human hair.

Making these ICs with extremely small structures or components is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process; that is, to improve the overall yield of the process.

One component of improving yield is monitoring the chip-making process to ensure that it is producing a sufficient number of functional integrated circuits. One way to monitor the process is to inspect the chip circuit structures at various stages of their formation. Inspection can be carried out using a scanning charged-particle microscope ("SCPM"). For example, an SCPM may be a scanning electron microscope (SEM). A SCPM can be used to image these extremely small structures, in effect, taking a "picture" of the structures of the wafer. The image can be used to determine if the structure was formed properly in the proper location. If the structure is defective, then the process can be adjusted, so the defect is less likely to recur.

The working principle of a SEM is similar to a camera. A camera takes a picture by receiving and recording intensity of light reflected or emitted from people or objects. A SEM takes a "picture" by receiving and recording energies or quantities of electrons reflected or emitted from the structures of the wafer. Before taking such a "picture," an electron beam may be projected onto the structures, and when the electrons are reflected or emitted ("exiting") from the structures (e.g., from the wafer surface, from the structures underneath the wafer surface, or both), a detector of the SEM may receive and record the energies or quantities of those electrons to generate an inspection image. To take such a "picture," the electron beam may scan through the wafer (e.g., in a line-by-line or zig-zag manner), and the detector may receive exiting electrons coming from a region under electron-beam projection (referred to as a "beam spot"). The detector may receive and record exiting electrons from each beam spot one at a time and join the information recorded for all the beam spots to generate the inspection image. Some SEMs use a single electron beam (referred to as a "single-beam SEM") to take a single "picture" to generate the inspection image, while some SEMs use multiple electron beams (referred to as a "multi-beam SEM") to take multiple "sub-pictures" of the wafer in parallel and stitch them together to generate the inspection image. By using multiple electron beams, the SEM may provide more electron beams onto the structures for obtaining these multiple "sub-pictures," resulting in more electrons exiting from the structures. Accordingly, the detector may receive more exiting electrons simultaneously and generate inspection images of the structures of the wafer with higher efficiency and faster speed.

Typically, the structures are made on a substrate (e.g., a silicon substrate) that is placed on a platform, referred to as a stage, for imaging. When the electron beams hit the structures, they may charge the substrate and make the substrate no longer electrically neutral. The charged substrate may obtain a voltage and affect the exiting electrons, which may affect the imaging quality. Accordingly, to improve imaging, it may be advantageous to ground the substrate.

For grounding, the substrate may be electrically connected to an electric power source. The electrical connection between the power source and the substrate may be implemented by pressing one or more conductive grounding pins or probes against the backside surface of the substrate (i.e., the surface without the structures). The backside surface of the substrate is usually covered by a thin layer ("backside film") of material, which is created as a protective covering in the manufacturing process of the substrate.

However, the backside film is not conductive. Generally, two types of methods may be used to overcome such a non-conductive backside film: a penetration method and an electric zapping method. In the penetration method, the grounding pins may press to penetrate the backside film and contact the substrate directly. But the penetration method may result in damage to the backside film, which can lead to damaging the substrate during manufacturing and can also lead to excessive particles being generated, leading to contamination of the vacuum chamber of the SEM.

In the electric zapping method, the grounding pins may press and partially penetrate, but not completely penetrate, the backside film. The power source may generate a high-voltage (e.g., tens of kilovolts) electric signal ("grounding signal") between the grounding pins for the purpose of breaking down the backside film to establish an electrical connection between the grounding pins and the wafer. The grounding signal may cause electric zapping between tips of the grounding pins and the backside film.

But the electric zapping method also has its challenges. A first challenge is that different types of substrates require different optimized voltages of the grounding signal in order to break down the backside film, and to do so without creating excessive damage. That is, the voltage of the grounding signal optimized for one type of substrate may fail to breakdown the backside film of another type of substrate, leading to a failure to create an electrical connection between the grounding pins and the wafer. A second challenge is that excessive voltage of the grounding signal may cause excessive damage to the wafer (e.g., miniature explosions of the backside film) around the tips of the grounding pins, resulting in the generation of particles that may contaminate the imaging environment (e.g., the vacuum chamber of the SEM system). A third challenge is that electrical zapping may fail at some grounding locations, but repeating the zapping at the same locations may not be desirable because it may lead to reduced lifetime of the grounding pins or an excessive number of contaminating particles. Therefore, improvements to both methods are desirable.

Embodiments of the present disclosure may provide an improved wafer grounding system. The wafer grounding may be implemented by using the penetration method or the electrical zapping method. According to embodiments of the electrical zapping method in this disclosure, the contact locations of the grounding pins may be dynamically adjusted. If grounding is not successful at initial contact locations, by dynamically adjusting the contact locations and applying a different grounding signal, the probability of successful wafer grounding may be increased while the contamination in the vacuum chamber may be reduced and the lifetime of the grounding pins may be extended (as compared to a current method). In addition, according to embodiments of the electrical zapping method in this disclosure, electric characteristics of an electric signal for wafer grounding may also be dynamically adjusted based on measurement feedback of the grounding electric path. By dynamically adjusting the electric characteristics, the lifetime of the grounding pins may be extended, contamination in the inspection vacuum chamber may be reduced, and the electric signal may be conveniently adapted to ground different types of wafers. Also, according to embodiments of the penetration method and the electrical zapping method in this disclosure, a vibrator may be provided for vibrating the grounding pins relative to the wafer to improve contact between the grounding pins and the wafer. The vibrator may be used in a system using the penetration method, in which explosion of backside film and deposit of contaminating particles may be avoided, and the lifetime of the grounding pins may be prolonged. The vibrator may also be used in a system only using the electric zapping method or a system combining both methods, in which the grounding locations of the grounding pins may be provided with an extra dimension for adjustment, and the success rate of wafer grounding may be further increased.

Embodiments of the present disclosure include methods and systems for wafer grounding and adjusting a grounding location for a wafer. For example, a wafer grounding system may receive a first value of an electric characteristic associated with the wafer being grounded by an electric signal. The wafer grounding system may also determine a first control parameter using at least the first value. The wafer grounding system may further control a characteristic of the electric signal using the first control parameter and the first value. For another example, the wafer grounding system may detach the wafer and the grounding pin. The wafer grounding system may also adjust a relative position between the wafer and the grounding pin. The wafer grounding system may further reattach the grounding pin and the wafer. Details of the embodiments are set forth as follows.

Further, in some special cases, highly complex structures may be manufactured on a wafer, which may cause more challenges for wafer grounding. For example, some ICs may be manufactured to include a high number of layers. Such multi-layer structure may cause higher tension on the surface of the wafer than in the normal cases. The high tension may warp or bow the wafer, which may cause errors in the inspection image (e.g., fuzziness). To avoid warping or bowing the wafer due to such complex structures, some wafers for manufacturing such complex ICs may be coated with a thickened backside film to enhance its mechanical strength. However, the thickened backside film that is sufficiently thick to prevent wafer warping may be too thick to the extent that neither the electrical zapping method nor the penetration method can work for the wafer grounding.

Embodiments of the present disclosure further include methods and systems for wafer grounding using a "pin-impact" method. The wafer grounding system may actuate a grounding pin to impact the thickened backside film to penetrate it in either a full penetration of a partial penetration. After penetrating the thickened backside film by impact, an electric connection between the grounding pin and a conductive surface of the wafer may be established for wafer grounding.

Typically, the substrate is placed and secured on the stage by an electrostatic holder (or "electrostatic chuck"). The electrostatic holder may include at least one electrode, and a non-conductive dielectric material may be provided between the electrode and the substrate. For example, the electrode may be provided underneath the top surface of the stage. When being applied with a clamping voltage, the electrode may attract and secure the substrate to the top surface of the stage via an electrostatic field. When the clamping voltage is off, the electrode may lose the electrostatic field, and the substrate may be released from the stage.

However, in some cases, residual charges may occur on the electrostatic holder after the clamping voltage is off, which may cause a residual clamping force. The residual clamping force may cause difficulty in releasing the substrate, and in some cases, the substrate may not be released at all. Such a "wafer sticking" problem may influence performance and utilization rate of the equipment. The residual charges may be accumulated over a period of time or instantaneously formed when the clamping voltage is applied. For example, during normal operation of the electrostatic holder, a grounding pin may touch the substrate for providing a grounding signal. The substrate may be biased with a voltage potential (e.g., 30 kilovolts). An electrode of the electrostatic holder may be provided with a clamping voltage (e.g., +300 or −300 volts) floating on the voltage potential. When the clamping voltage is periodically turned on and off (e.g., for securing and releasing multiple substrates), the residual charges may be accumulated over a period of time on the surface of the electrostatic holder because of charges not fully neutralized due to the voltage difference between the voltage potential and the clamping voltage. The residual charges may be formed instantaneously when the clamping voltage is applied in a case where an arcing occurs in the circuit of the electrode, in which an instantaneous voltage difference (e.g., 10 kilovolts) between the substrate and the electrodes may significantly disturb the clamping voltage while the voltage potential is unaffected. Such an instantaneous voltage difference may cause to form a strong electric field between the substrate and the electrode instantaneously, which may attract or repel electric charges in the substrate with respect to the top surface of the electrostatic holder.

Several designs may be used for reducing the residual clamping force. In some cases, a first design may be used to handle residual charges accumulated over a period of time. For example, a lift pin may be provided with the electrostatic holder, which may be used to lift the substrate when a residual clamping force is monitored to exist. As another example, an ionizer may be provided with the electrostatic holder, which may be used to neutralize (e.g., by shooting ions) the residual charges on the surface of the electrostatic holder if the residual clamping force is measured to be above a predetermined threshold.

However, in the cases where residual charges are instantaneously formed, the first design may not be effective because the initial residual force cannot be measured. In those cases, a second design may be used. For example, a discharging controller may be provided with the electrostatic holder, which may control a discharging voltage of the electrostatic holder to temporarily neutralize the residual charges on the surface of the electrostatic holder until the residual clamping force is measured to be below the predetermined threshold such that the lift pin may be used to lift the substrate, and to fully neutralize the residual charges after the substrate is released. Nevertheless, the second design of the electrostatic holder relies on the discharging capability of the electrostatic holder instead of the ionizer, which may be inefficient to neutralize all the residual charges.

Embodiments of the present disclosure further include apparatuses and systems for preventing formation of the residual charges resulted from instantaneously formed voltage difference between a substrate and an electrostatic holder, which may include an overvoltage protection device communicatively coupled between an electrode of the electrostatic holder and the substrate. The overvoltage protection device may become conductive under overvoltage and resets to be non-conductive when the overvoltage is removed. For example, the overvoltage protection device may be conductive when a voltage difference between the electrode and the substrate is below a threshold voltage. When the voltage difference is above the threshold voltage (e.g., caused by an arcing occurring in the circuit of the electrode), the overvoltage protection device may become conductive to conduct electricity between the electrode and the substrate such that the voltage difference between them can be reduced or eliminated. When the voltage difference drops below the threshold voltage again, the overvoltage protection device may become non-conductive again. By doing so, no residual charge may be instantaneously formed on the substrate or the electrostatic holder.

In some cases, one cause for the instantaneously formed voltage difference between a substrate and an electrostatic holder may be a discharge occurring near the electrostatic holder. Typically, the electrostatic holder may be placed on a top surface of a housing of the stage. To bias the substrate secured on top of the electrostatic holder, the top surface of the housing may be conductive and applied with a biasing high-voltage potential (e.g., −30 kilovolts). The housing is grounded, such as by connecting a bottom surface of the housing to the ground. The top surface and the bottom surface of the housing may be isolated by one or more isolators. For example, the isolators may be one or more walls of the housing.

One challenge of the existing wafer grounding system is that the isolators between a high-voltage part (e.g., the top surface of the housing) of the system and a grounded part (e.g., the bottom surface of the housing) may be prone to undesired discharging. When an electric field between the high-voltage part and the isolator is overly strong, field emission of charges may start between them, which may cause electrons to break away from the surface of the high-voltage part. If those field-emission electrons have sufficient landing energy to release gas molecules adhered to the surface of the isolator, an avalanche effect may be triggered, which may eventually lead to a dielectric breakdown between the high-voltage part and the isolator. For example, an arcing may occur, which may discharge a large amount of charges near the high-voltage part. Such discharging may disturb the clamping voltages of the electrostatic holder (e.g., by causing to instantaneously form a voltage difference between the substrate and the electrostatic holder) and cause residual charges to form on the electrostatic holder, which may cause the wafer sticking problem as described herein. Further, such discharging may attract undesired particles (e.g., dusts) from the environment, which may pose potential harm to the wafer grounding system.

During normal operation of the wafer grounding system, no field emission may occur because the voltage of the high-voltage part of the system is stable. However, when the high voltage is switched on and off (e.g., for replacing the substrate or a maintenance service), the surface voltage of the isolator may respond to the ramp-up or ramp-down of the high voltage in a capacitive way (e.g., the isolator and the high-voltage part being two terminals of an effective capacitor). In such a case, the electric field between the high-voltage part and the isolator may become sufficiently strong to cause the field emission, and eventually cause the undesired discharging.

To prevent the undesired discharging, existing wafer grounding systems may have to ramp up or ramp down the high voltage in a slow speed. Nevertheless, such a slow ramping speed may throttle the throughput of wafer inspection, especially in a multi-beam inspection system.

Embodiments of the present disclosure further include apparatuses and systems for fast ramping of high voltage without causing discharging. For example, such an apparatus may include an isolator arranged between a high-voltage part of the apparatus and a grounded part of the apparatus. The apparatus may also include a first electrode electrically coupled to the high-voltage part and a second electrode electrically coupled to the grounded part and non-conductive to the first electrode. The apparatus may further include a dielectric layer covering the first electrode and the second electrode over the isolator. By doing so, the strong electric field may be confined to form near the end of the first and second electrodes and near the surface of the isolator. Also, the first and second electrodes may form a smoothly subsiding electric field between them, which may avoid abrupt change of electric field gradient that corresponds to a high electric field strength. Further, by covering the first and second electrodes, the surrounding environment may have weaker impact on the electric field between them. Moreover, even if the electric field becomes very strong between the first and second electrodes, field emission cannot occur because the first and second electrodes are covered by the dielectric layer and the isolator. Overall, the provided apparatuses and systems may provide for fast ramping of the high-voltage without causing any undesired discharging, lower possibility of wafer sticking problem, greatly increased throughput of wafer inspection, and reduced environmental harm resulted from the undesired discharging.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with some embodiments of the present disclosure. EBI system 100 may be used for imaging. As shown in FIG. 1, EBI system 100 includes a main chamber 101, a load/lock chamber 102, a beam tool 104, and an equipment front end module (EFEM) 106. Beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by beam tool 104. Beam tool 104 may be a single-beam system or a multi-beam system.

A controller 109 is electronically connected to beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
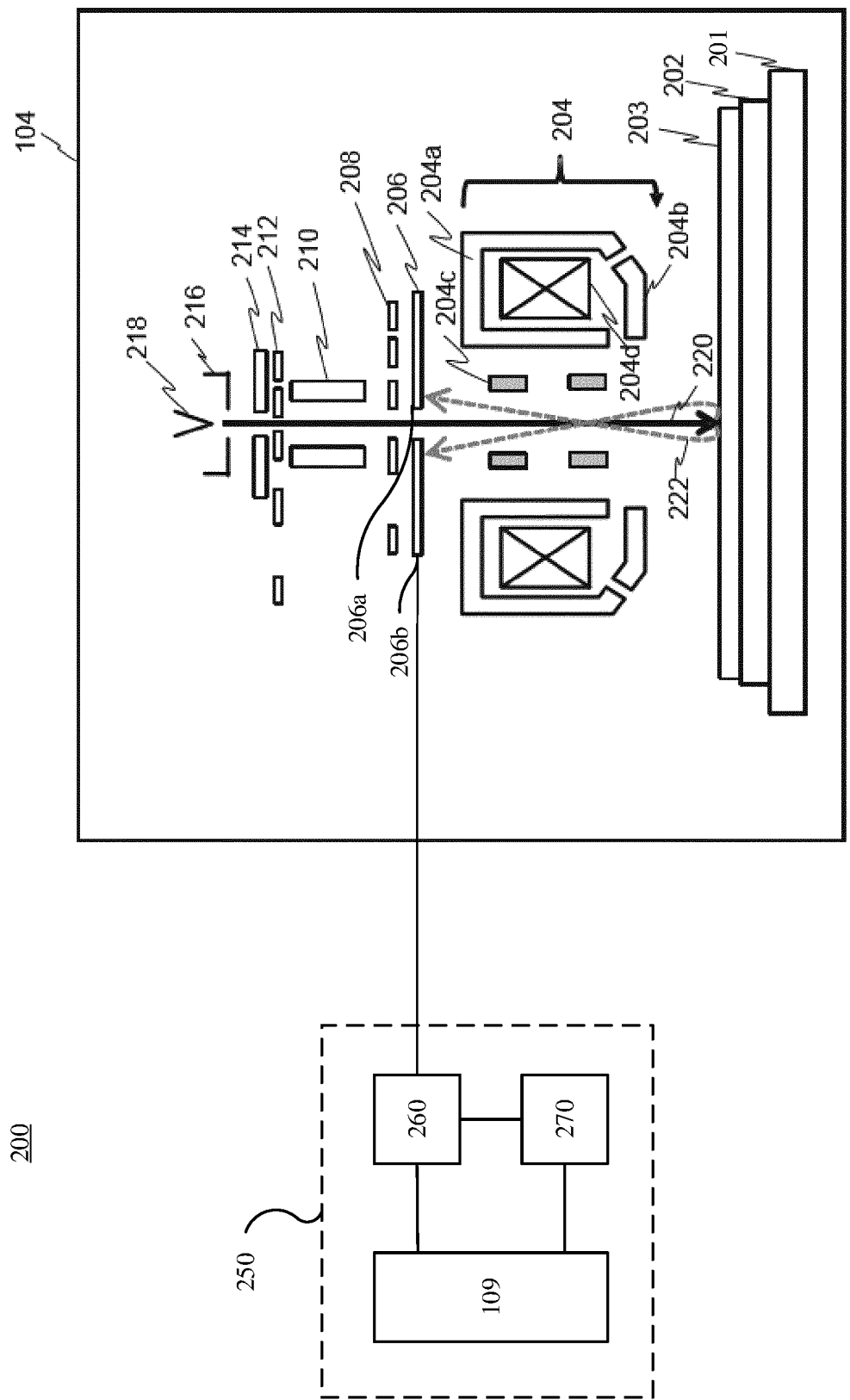
FIG. 2 is a schematic diagram illustrating an example electron beam tool, consistent with some embodiments of the present disclosure that may be a part of the example electron beam inspection system of FIG. 1.

FIG. 2 illustrates an example imaging system 200 according to embodiments of the present disclosure. Electron beam tool 104 of FIG. 2 may be configured for use in EBI system 100. Electron beam tool 104 may be a single beam apparatus or a multi-beam apparatus. As shown in FIG. 2, electron beam tool 104 includes a motorized sample stage 201, and a wafer holder 202 supported by motorized sample stage 201 to hold a wafer 203 to be inspected. Electron beam tool 104 further includes an objective lens assembly 204, an electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in some embodiments, may include a modified swing objective retarding immersion lens (SORIL), which includes a pole piece 204a, a control electrode 204b, a deflector 204c, and an exciting coil 204d. Electron beam tool 104 may additionally include an Energy Dispersive X-ray Spectrometer (EDS) detector (not shown) to characterize the materials on wafer 203.

A primary electron beam 220 is emitted from cathode 218 by applying an acceleration voltage between anode 216 and cathode 218. Primary electron beam 220 passes through gun aperture 214 and beam limit aperture 212, both of which may determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c may be controlled to deflect primary electron beam 220 sequentially onto different locations of top surface of wafer 203 at different time points, to provide data for image reconstruction for different parts of wafer 203. Moreover, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may generate multiple primary electron beams 220, and electron beam tool 104 may include a plurality of deflectors 204c to project the multiple primary electron beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary electron beam 220 may be immersed in the magnetic field and may be electrically charged, which, in turn, creates an electric field. The electric field reduces the energy of impinging primary electron beam 220 near the surface of wafer 203 before it collides with wafer 203. Control electrode 204b, being electrically isolated from pole piece 204a, controls an electric field on wafer 203 to prevent micro-arching of wafer 203 and to ensure proper beam focus.

A secondary electron beam 222 may be emitted from the part of wafer 203 upon receiving primary electron beam 220. Secondary electron beam 222 may form a beam spot on sensor surfaces 206a and 206b of electron detector 206. Electron detector 206 may generate a signal (e.g., a voltage, a current, or the like.) that represents an intensity of the beam spot and provide the signal to an image processing system 250. The intensity of secondary electron beam 222, and the resultant beam spot, may vary according to the external or internal structure of wafer 203. Moreover, as discussed above, primary electron beam 220 may be projected onto different locations of the top surface of the wafer or different sides of the wafer at a particular location, to generate secondary electron beams 222 (and the resultant beam spot) of different intensities. Therefore, by mapping the intensities of the beam spots with the locations of wafer 203, the processing system may reconstruct an image that reflects the internal or surface structures of wafer 203.

Imaging system 200 may be used for inspecting a wafer 203 on motorized sample stage 201 and includes an electron beam tool 104, as discussed above Imaging system 200 may also include an image processing system 250 that includes an image acquirer 260, storage 270, and controller 109. Image acquirer 260 may include one or more processors. For example, image acquirer 260 may include a computer, server, mainframe host, terminals, personal computer, any kind of mobile computing devices, and the like, or a combination thereof. Image acquirer 260 may connect with a detector 206 of electron beam tool 104 through a medium such as an electrical conductor, optical fiber cable, portable storage media, IR, Bluetooth, internet, wireless network, wireless radio, or a combination thereof. Image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may perform adjustments of brightness and contrast, or the like. of acquired images. Storage 270 may be a storage medium such as a hard disk, cloud storage, random access memory (RAM), other types of computer readable memory, and the like. Storage 270 may be coupled with image acquirer 260 and may be used for saving scanned raw image data as original images, and post-processed images. Image acquirer 260 and storage 270 may be connected to controller 109. In some embodiments, image acquirer 260, storage 270, and controller 109 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image including a plurality of imaging areas. The single image may be stored in storage 270. The single image may be an original image that may be divided into a plurality of regions. Each of the regions may include one imaging area containing a feature of wafer 203.

Wafer grounding may be implemented by conducting charges from wafer 203 to wafer holder 202 to cause wafer 203 to be electrically neutral. A penetration method or an electrical s method may be used to perform wafer grounding. In those methods, a wafer may be placed on a wafer stage, with its backside supported by the wafer stage. A backside film (e.g., functioning as a protective coating) may be present on the surface of the backside of the wafer substrate. The backside film may be non-conductive. Two or more grounding pins, made of conductive materials (e.g., metals), may press against the backside film without completelyc piercing it.

In an electrical zapping method, the electric signal may enter the wafer from a first grounding pin through the backside film via a first dielectric breakdown and exit the wafer through the backside film to a second grounding pin via a second dielectric breakdown. The dielectric breakdowns may cause to form a stable electric path (e.g., a direct current (DC) path) through the backside film, which may be referred to as a "bias path." The bias path may have an effective resistance. For example, the resistance of the backside film may contribute to effective resistance.

During the electrical zapping, a sensor may be used to measure the effective resistance between the first and second grounding pins. A controller coupled to the wafer grounding system may determine whether a threshold condition is met (e.g., the effective resistance being below or equal to a predetermined resistance). If the threshold condition is met, the controller may cause the electric signal generator to stop generating the grounding signal. Otherwise, the controller may cause the electric signal generator to continue generating the grounding signal for a predetermined duration (e.g., several to tens of milliseconds). Each of such comparison of the effective resistance with the predetermined resistance may be referred to as a "cycle" of the wafer grounding. Generally, it may take several cycles before the threshold condition is met.

When the effective resistance of the bias path is below or equal to the predetermined resistance, the wafer grounding may be completed. The controller may then electrically disconnect the grounding pins from the electric signal generator and electrically connect them to a wafer bias supply. The wafer bias supply may provide a low-voltage electric signal to the wafer substrate through the bias paths for wafer biasing.

A challenge of the electrical zapping method is that, before completing the wafer grounding, the controller may cause the electric signal generator to continue generating the same grounding signal, such as the same amplitude, the same frequency, or for the same predetermined duration. Such an electric signal may not be optimized for wafer grounding. For example, to cause the dielectric breakdowns, the amplitude may be higher than necessary, the frequency may be higher than necessary, or the duration may be longer than necessary. Non-optimized electric signals may energize particles of the backside film and free them from the surface of the backside. The particles may enter a vacuum chamber enclosing the wafer and the wafer stage, which may cause contamination and drive up the maintenance costs. Also, non-optimized electric signals may decrease the lifetime of the grounding pins, which may also drive up the maintenance costs.

Another challenge of the electrical zapping method is that the grounding signal may be non-adjustable for different types of wafers. The grounding signal may have a predetermined signal profile (e.g., a square wave). The predetermined signal profile may have a predetermined amplitude, a predetermined frequency, or a predetermined duration to be applied. Such characteristics of the predetermined signal profile may be non-adjustable. However, different manufacturers may manufacture different types of wafers, and different types of wafers may have different types of the backside film. For example, the different types of backside film may be of different materials, such as oxide, silicon nitride, or other materials. For another example, the different types of backside film may have different thickness, hardness, or conductivity (e.g., being insulating or highly resistive. Optimized electric signals may vary in characteristics for different types of wafers. With non-adjustable signal profiles, it is unlikely to set the signal profile of the electric signal for grounding as optimized for different types of wafers, thus causing the aforementioned problems.

Yet another challenge of the electrical zapping method is that the signal profile of the grounding signal is typically pulses, such as square waves. Tests have shown that pulse signals may cause a higher number of particles of the backside film to be freed into the vacuum chamber.

Still another challenge of the electrical zapping method is that contact locations ("grounding locations") of the grounding pins at the backside film are typically fixed. When grounding pins are pressed against the wafer, there is a possibility that the wafer may not be grounded due to a bad contact or other reasons. However, it may be difficult to adjust the grounding locations because the wafer stage may lack mechanisms to adjust locations of the wafer. To increase the probability of successfully grounding the wafer, existing systems may use multiple (e.g., more than two) grounding pins to press the backside film. If any two of the multiple grounding pins form an electric path, the wafer grounding may be completed using those two grounding pins. Nevertheless, if none of the grounding pins can form the electric path, the wafer may not be grounded, and may be discarded as waste. This may decrease the productivity and efficiency of manufacturing. Also, the complexity of the system may be increased by using multiple grounding pins.

Figure 3:
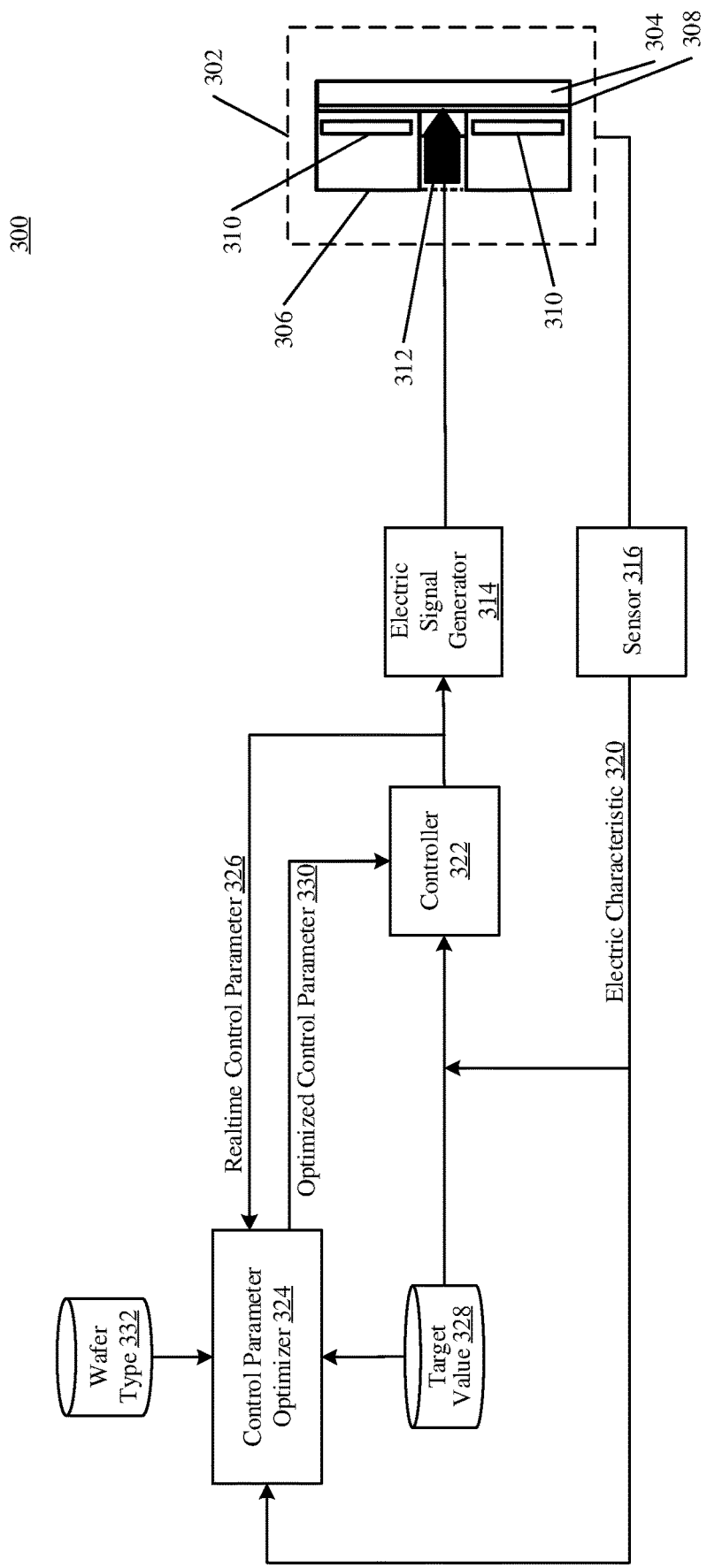
FIG. 3 is an illustration of an example system of wafer grounding, consistent with some embodiments of the present disclosure.

FIG. 3 is an illustration of an example system 300 of wafer grounding, consistent with some embodiments of the present disclosure. System 300 may be used to ground a wafer with various advantages, such as improving the lifetime of grounding pins or reducing sputtered particles. In FIG. 3, system 300 includes at least a subsystem 302 for holding a wafer, an electric signal generator 314, a sensor 316, a controller 322, and a control parameter optimizer 324.

Subsystem 302 includes an electrostatic holder 306 and wafer 304. In some embodiments, wafer 304 may be wafer 203 in FIG. 2, and electrostatic holder 306 may be wafer holder 202 in FIG. 2. Wafer 304 includes a backside film 308. Backside film 308 may be non-conductive. Electrostatic holder 306 may include at least one electrode 310. When electrified, electrode 310 may attract and secure wafer 304 to electrostatic holder 306 via an electrostatic field. Subsystem 302 further includes at least one grounding pin (or "probe") 312. Grounding pin 312 may be electrically connected between the electric signal generator 314 and the wafer 304. In some embodiments, grounding pin 312 may be pressed against backside film 308 without completely penetrating backside film 308. Grounding pin 312 may be electrically connected to electric signal generator 314 and sensor 316.

Electric signal generator 314 may generate a grounding signal for grounding wafer 304. In some embodiments, electric signal generator 314 is a driver. The grounding signal may have a high voltage for causing dielectric breakdown between grounding pin 312 and wafer 304 through backside film 308. Sensor 316 may be used to detect or measure an electric characteristic 320 associated with the electric breakdowns. For example, electric characteristic 320 may include at least one of an impedance, a resistance, a capacitive reactance, an admittance, a conductance, or a capacitive susceptance. In some embodiments, electric characteristic 320 may be associated with an electric path including the grounding pin and the wafer. For example, subsystem 302 may be a single-pin system, which includes a single grounding pin 312. In the single-pin system, sensor 316 may be electrically connected to wafer 304, and may measure electric characteristic 320 of an electric breakdown between grounding pin 312 and wafer 304 through backside film 308.

Figure 4:
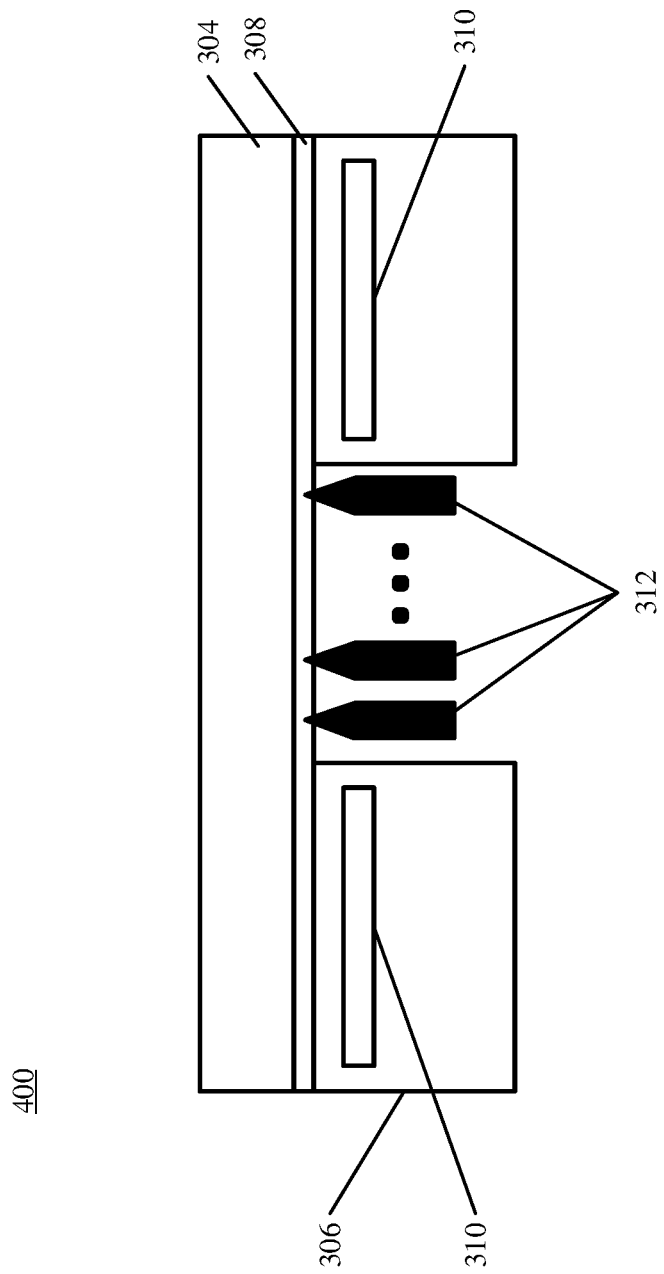
FIG. 4 is an illustration of an example multi-pin wafer grounding system, consistent with some embodiments of the present disclosure.

For another example, subsystem 302 may be a multi-pin system, which includes multiple grounding pins 312. FIG. 4 is an illustration of an example multi-pin wafer grounding system 400, consistent with some embodiments of the present disclosure. System 400 includes wafer 304, electrostatic holder 306, backside film 308, electrodes 310, and multiple grounding pins 312. In some embodiments, subsystem 302 may be replaced by system 400. In the multi-pin system, for example, electric signal generator 314 may be electrically connected to a first grounding pin, and sensor 316 may be electrically connected to a second grounding pin. The grounding signal may enter wafer 304 through a first grounding pin and exit through a second grounding pin. Sensor 316 of FIG. 3 may measure electric characteristic 320 of a first electric breakdown and a second electric breakdown, the first electric breakdown being between the first grounding pin and wafer 304 through backside film 308, and the second electric breakdown being between wafer 304 and the second grounding pin through backside film 308. In some embodiments, a capacitive coupling may be formed between wafer 304 and a conductor (electrostatic holder 306 or electrodes 310 in FIG. 3) on a wafer stage. For example, the wafer and the conductor on the wafer stage may form a capacitor. The capacitive coupling may be used as an electric path ("return path") for a grounding signal. The electric connectivity of the capacitive coupling may be checked using an alternate current (AC) signal that enters through at least one of grounding pins 312. When the AC signal flows through and forms an electric current loop, controller 322 may determine that the capacitive coupling has been established. In some embodiments, the quality of the electric connection between grounding pins 312 and wafer 304 may be verified by measuring the AC signal.

Referring back to FIG. 3, Controller 322 may be electrically connected to electric signal generator 314 and may control it to generate the grounding signal and the AC signal. In some embodiments, controller 322 may be implemented as part of controller 109 in FIGS. 1-2. In some embodiments, controller 322 may be implemented as a controller independent from controller 109, such as a software module or a hardware module. Characteristics of the grounding signal and the AC signal may be controlled by control parameters outputted by controller 322. The characteristics of the grounding signal and the AC signal may include at least one of a voltage, a current, a profile of the voltage or the current, a frequency of the profile, a period of the profile, a phase of the profile, an amplitude of the profile, or a duration of the voltage or the current. In some embodiments, the profile of the grounding signal may be a sinusoidal shape. Compared with a square-wave signal, a sinusoidal signal (e.g., a sinusoidal high-voltage signal) may significantly reduce the number of the sputtered particles energized and freed from the surface of backside film 308. Controlling characteristics of the grounding signal and the AC signal may optimize the performance of the grounding process, such as by generating the grounding signal with a voltage or a duration minimally-required to cause the dielectric breakdown. Depending on different types of wafer 304, the control parameters outputted by controller 322 may be different. Therefore, the grounding signal and the AC signal may be adjustable, and the lifetime of grounding pin 312 may be improved.

A control parameter optimizer 324 may optimize the control parameter for controller 322. In some embodiments, controller 322 may generate real-time control parameter 326 using at least electric characteristic 320. For example, controller 322 may receive a value of electric characteristic 320 and a target value 328 of electric characteristic 320 and generate real-time control parameter 326. In some embodiments, the target value 328 may be stored in a database (e.g., in a memory accessible by controller 322), and controller 322 may retrieve it from the database on demand. The target value 328 may be a value of the same type of electric characteristic 320 and may be predetermined to indicate a grounding status. In some embodiments, the value of the electric characteristic 320 may be compared with the target value 328 before controller 322 determines real-time control parameter 326. For example, when electric characteristic 320 is an effective resistance, target value 328 may be a target effective resistance value. If the value of electric characteristic 320 is lower than or equal to the target effective resistance value, controller 322 may determine that the dielectric breakdowns have occurred and wafer 304 is grounded and may control electric signal generator 314 to stop generating the grounding signal. If the value of electric characteristic 320 is higher than or equal to the target effective resistance value, controller 322 may determine that the dielectric breakdowns have not occurred and generate real-time control parameter 326 to be optimized by control parameter optimizer 324. Control parameter optimizer 324 may optimize real-time control parameter 326 and output an optimized control parameter 330 to controller 322. Controller 322 may use optimized control parameter 330 to control electric signal generator 314 to generate the grounding signal with intended characteristics.

Control parameter optimizer 324 may optimize real-time control parameter 326 based on various inputs. The inputs may include at least initial parameter 326, the value of electric characteristic 320, target value 328, and a wafer type 332. In some embodiments, wafer type 332 may be stored in a database, such as the same database storing target value 328. In some embodiments, control parameter optimizer 324 may include other input data to optimize real-time control parameter 326. Wafer type 332 may indicate a type of wafer 304. For example, wafer type 332 may indicate a type of materials, thickness, hardness, or conductivity of backside film 308, electrical characteristics of wafer 304, or the like. In some embodiments, control parameter optimizer 324 may use a machine learning technique to determine optimized parameter 330 using the value of electric characteristic 320, real-time control parameter 326, target value 328, and wafer type 332 as inputs. The machine learning technique may include a neural network, for example. The machine learning technique may be an unsupervised learning model or a supervised learning model.

In some embodiments, the machine learning technique may be a supervised learning model, and it may be trained to optimize real-time control parameters under conditions of various wafer types 332, measured values of electric characteristic 320, and target values 328 of electric characteristic 320. In some embodiments, for training the supervised learning model, information of known parameters (e.g., tuned parameters without using the machine learning technique) corresponding to various wafer types 332, measured values of electric characteristic 320, and target values 328 of electric characteristic 320 may be used as labels indicating true or accurate classifications ("ground truth labels"). For example, such information may be stored as log files in a database. During training, initial control parameters may be generated and fed to the supervised learning model. The outputs of the supervised learning model may be compared with the ground truth label. If they are different, parameters of the supervised learning model may be updated. If a ratio of correctness of such comparisons exceeds a predetermined level (e.g., 95%), it may be determined that the supervised learning model has been trained.

The trained supervised learning model may be used to determine optimized control parameter 330 based on various wafer types 332, measured values of electric characteristic 320, and target values 328 of electric characteristic 320. For example, in a first cycle of wafer grounding, controller 322 may receive optimized control parameter 330 to control electric signal generator 314 to generate a sinusoidal grounding signal with intended characteristics, such as an intended frequency of a voltage or an intended amplitude of the voltage. Sensor 316 may measure a first value of electric characteristic 320. Controller 322 may receive the first value of electric characteristic 320 and retrieve target value 328 from the database. Based on a comparison that the first value of electric characteristic 320 is higher than target value 328, controller 322 may generate real-time control parameter 326. Control parameter optimizer 324 may receive real-time control parameter 326 and the first value of electric characteristic 320, and further retrieve target value 328 and wafer type 332 from the database. By inputting those into the trained supervised learning model, control parameter optimizer 324 may output optimized control parameter 330. Controller 322 may receive optimized control parameter 330 to control electric signal generator 314 to change characteristics of the grounding signal in a second cycle of wafer grounding.

In some embodiments, optimized control parameter 330 in different cycles of wafer grounding may be different. For example, optimized control parameter 330 may depend on values of electric characteristic 320 measured by sensor 316. For example, in the second cycle of wafer grounding in the aforementioned example, sensor 316 may receive a second value of electric characteristic 320 after controller 322 has controlled electric signal generator 314 to change characteristics of the grounding signal. The second value may be lower than the first value measured by sensor 316 in the first cycle of wafer grounding but still higher than target value 328, which may indicate that the dielectric breakdowns have not fully occurred, but the controlled voltage of the grounding signal has increased the likelihood of its occurrence. In this situation, the voltage of the grounding signal may be lowered, purporting to ensure the occurrence of the dielectric breakdown while to protect the lifetime of the grounding pin from overly high voltages. Control parameter optimizer 324 may input the second value to determine optimized control parameter 330 for a third cycle of wafer grounding, which may indicate to controller 322 to control electric signal generator 314 to decrease the amplitude of the voltage of the grounding signal compared with the amplitude in the second cycle of wafer grounding.

For each cycle of the grounding process, the optimized parameters may be different. With the optimized grounding voltage profile, the lifetime of grounding pins is expected to be significantly improved.

In some embodiments, optimized control parameter 330 may be different depending on wafer types 332. For example, after wafer 304 is inspected, a new wafer with a new type of backside film may be placed on electrostatic holder 306. The new type of backside film may have different electric characteristic from backside film 308. In this situation, control parameter optimizer 324 may retrieve a corresponding wafer type from the database and optimize real-time control parameters corresponding to the new wafer.

In some embodiments, control parameter optimizer 324 may be implemented as a software module accessible and executable by controller 322, such as application programs or codes stored in a memory accessible by controller 322. In some embodiments, control parameter optimizer 324 may be implemented as a hardware module storing executable program codes, and the hardware module may communicate with controller 322 for data input/output. For example, the hardware module may be an FPGA or an ASIC.

Figure 5:
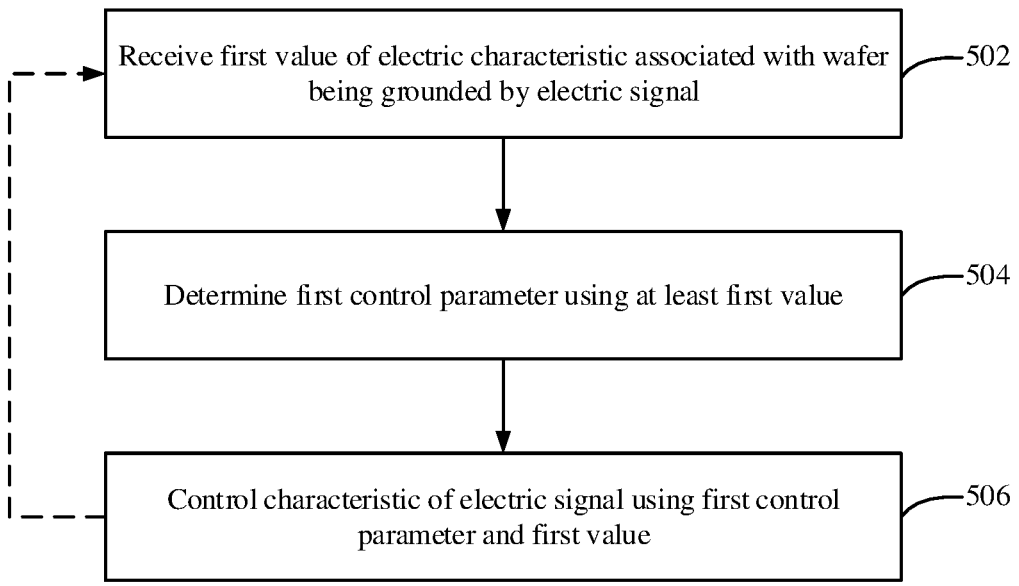
FIG. 5 is a flowchart illustrating an example method for wafer grounding, consistent with some embodiments of the present disclosure.

FIG. 5 is a flowchart illustrating an example method 500 for wafer grounding, consistent with some embodiments of the present disclosure. Method 500 may be performed by a controller that may be coupled with a charged particle beam apparatus (e.g., EBI system 100). For example, the controller may be controller 109 in FIG. 2 or controller 322 in FIG. 3. The controller may be programmed to implement method 500.

At step 502, the controller receives a first value of an electric characteristic associated with a wafer being grounded by an electric signal. In some embodiments, the electric characteristic may be electric characteristic 320 in FIG. 3. For example, the electric characteristic may include at least one of an impedance, a resistance, a capacitive reactance, an admittance, a conductance, or a capacitive susceptance.

The first value of the electric characteristic may be a first value of electric characteristic 320 in a first cycle of wafer grounding. The wafer may be wafer 304 in FIG. 3. The electric signal may be the grounding signal generated by electric signal generator 314 in FIG. 3. In some embodiments, a sensor (e.g., sensor 316 in FIG. 3) may generate the first value after measuring the electric characteristic. The controller may receive the first value from the sensor.

In some embodiments, the sensor may be placed in a portion of an electric path ("feedback portion") conducting electric signals exiting the wafer. In some embodiments, the electric characteristic may be associated with an electric path including the wafer and a wafer mount supporting the wafer. In some embodiments, the electric characteristic is associated with an electric path comprising the wafer, a wafer mount supporting the wafer, and the grounding pin. For example, the wafer mount may be electrostatic holder 306 in FIG. 3.

In some embodiments, the electric characteristic may include one of a resistance between the wafer and the wafer mount or a capacitive reactance between the wafer and the wafer mount. For example, in a single-pin system, the grounding signal may enter wafer 304 through grounding pin 312, and exit wafer 304 through a capacitive coupling between wafer 304 and electrostatic holder 306. In this example, the electric path may include the electric characteristic between, for example, grounding pin 312, backside film 308, and wafer 304. The electric characteristic may include the capacitive reactance of the capacitive coupling between wafer 304 and electrostatic holder 306. For another example, in a multi-pin system, the grounding signal may enter wafer 304 through a first grounding pin and exit through a second grounding pin. The electric path may include the electric characteristic, for example, between a first grounding pin 312, backside film 308, and wafer 304, and a second grounding pin. In this example, the electric characteristic may include a resistance between the wafer and the wafer mount, such as an effective resistance of a first electric breakdown and a second electric breakdown, the first electric breakdown being between the first grounding pin and wafer 304 through backside film 308, and the second electric breakdown being between wafer 304 and the second grounding pin through backside film 308.

It should be noted that the types of the electric characteristic are not limited in this disclosure, and an electric characteristic of a direct current circuit or an alternate current circuit may be used in this disclosure without falling outside the scope of this disclosure.

Referring back to FIG. 5, at step 504, the controller determines a first control parameter using at least the first value. For example, the first control parameter may be optimized control parameter 330 in a first cycle of wafer grounding, as shown in FIG. 3. In some embodiments, the controller may determine the first control parameter based on a comparison of the first value and a target value of the electric characteristic. For example, the target value of the electric characteristic may be target value 328 in FIG. 3. In some embodiments, for determining the first control parameter based on the comparison, the controller may determine whether a difference between the first value and the target value satisfies a threshold condition. The controller may further determine the first control parameter based on a determination that the difference satisfies the threshold condition. In some embodiments, for example, when the electric characteristic is the resistance, the threshold condition may be that the first value is smaller than or equal to the target value. It should be noted that, depending on the types of the electric characteristics, the threshold conditions between the first value and the target value may be changed accordingly and not limited to the examples set forth herein.

In some embodiments, for determining the first control parameter, the controller may determine an initial parameter using at least the first value. For example, the initial parameter may be real-time control parameter 326 in FIG. 3. The controller may then determine the first control parameter based on at least the initial parameter, the first value, the target value, and a type of the wafer. For example, the type of the wafer may be wafer type 332 in FIG. 3. In some embodiments, the controller may determine the first control parameter using a control parameter optimizer, such as control parameter optimizer 324 in FIG. 3.

In some embodiments, the control parameter optimizer may use a machine learning technique to determine the first control parameter. For example, an input to the machine learning technique may include at least the initial parameter, the first value, the target value, and the type of the wafer. For example, as shown in FIG. 3, control parameter optimizer 324 may take real-time control parameter 326, the first value of electric characteristic 320, target value 328, and wafer type 332 as input. The output of control parameter optimizer 324 may be optimized control parameter 330.

Referring back to FIG. 5, at step 506, the controller controls a characteristic of the electric signal using the first control parameter and the first value. For example, as shown in FIG. 3, controller 322 may control the characteristic of the grounding signal generated by electric signal generator 314 using optimized control parameter 330 and the first value of electric characteristic 320. In some embodiments, the characteristic of the electric signal includes at least one of a voltage, a current, a profile of the voltage or the current, a frequency of the profile, a period of the profile, a phase of the profile, an amplitude of the profile, or a duration of the voltage or the current.

In some embodiments, the profile of the electric signal may be a sinusoidal shape. Compared with a square-wave profile, the electric signal with the sinusoidal profile may reduce particles of the backside film (e.g., backside film 308) of the wafer from sputtered into the vacuum chamber enclosing the wafer and the wafer mount (e.g., a vacuum chamber enclosing subsystem 302 in FIG. 3).

In some embodiments, for controlling the characteristic of the electric signal, the controller may change a value of the characteristic of the electric signal using the first control parameter and the first value. For example, the controller may change the amplitudes, frequencies, phases, or duration of the voltage of the grounding signal.

In some embodiments, during a grounding process for the same type of wafer, the voltage of the grounding signal may decrease as the number of cycle of wafer grounding increases. For example, at step 506, the controller may lower the voltage of the grounding signal using the first control parameter and the first value.

In some embodiments, steps 502-506 may be repeated until the wafer grounding is completed. For example, after performing step 506 in the first cycle of wafer grounding, the controller may receive a second value of the electric characteristic. The controller may further determine a second control parameter using at least the second value. The controller may further control the characteristic of the electric signal using the second control parameter and the second value. The controller may stop performing method 500 until the threshold condition is satisfied, which is described in step 504. In some embodiments, the second control parameter and the first control parameter may have different values. Correspondingly, the values of the second control parameter and the first control parameter may have different values.

In some embodiments, an impedance (e.g., a resistance) of the electric path including the wafer and the wafer mount as described in step 502 may be greater than or equal to a predetermined threshold value. When the impedance is greater than or equal to the predetermined threshold value, the controller may determine that the electric path is open. For example, the predetermined threshold value may include a resistance value of 100,000 ohms, 200,000 ohms, 300,000 ohms, or 350,000 ohms, among others. The predetermined threshold may be determined based on a projected amount of current that may be needed to meet grounding requirements for the wafer. When the impedance is greater than or equal to the predetermined threshold value, the electric path may be determined to be open (e.g., little to no electric signal may flow between the wafer and the wafer mount) after the controller performs step 506. When the impedance is greater than or equal to the predetermined threshold value, the controller may determine a third control parameter using at least the first value. For example, the first value may be data related to the electric path after the controller applies the electric signal while the electric path is still open. The third control parameter and the first control parameter may have different values. The controller may then control the characteristic of the electric signal using at least the third control parameter and the first value. In some embodiments, the controller may repeat such operations until the electric path is close.

In some embodiments, the controller may generate and optimize different types of control parameters in different cycles of wafer grounding. For example, the aforementioned second control parameter and the first control parameter may be of different types. For example, the first control parameter may be one or more parameters for the controller to control an amplitude of the grounding signal, while the second control parameter may be one or more parameters for the controller to control a duration of the grounding signal.

Figure 6:
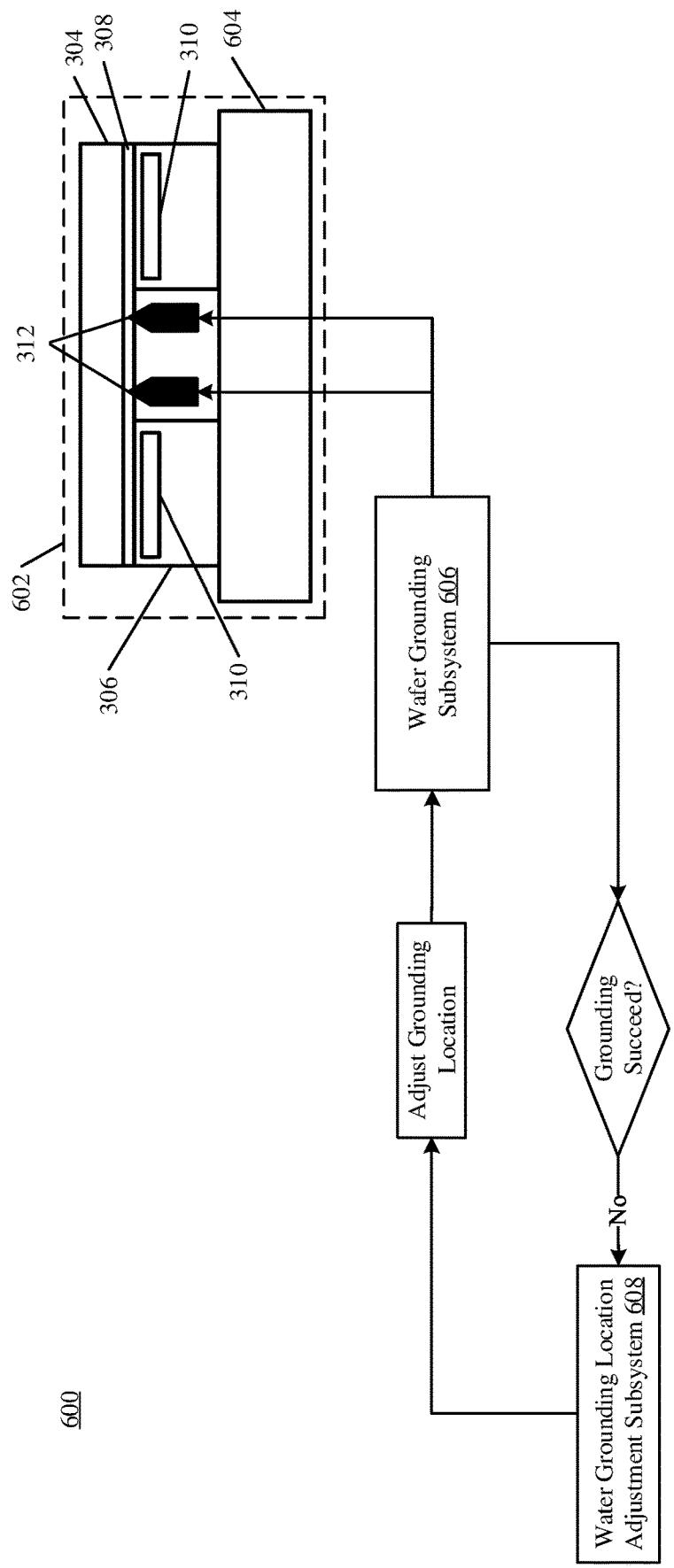
FIG. 6 is an illustration of an example system of wafer grounding location adjustment, consistent with some embodiments of the present disclosure.

FIG. 6 is an illustration of an example system 600 of wafer grounding location adjustment, consistent with some embodiments of the present disclosure. System 600 includes at least a subsystem 602 for holding a wafer, a wafer grounding subsystem 606, and a wafer grounding location adjustment subsystem 608. Subsystem 602 may be similar to subsystem 302 in FIG. 3, and includes wafer 304, electrostatic holder 306, backside film 308, electrodes 310, grounding pins 312, and a wafer stage 604. In some embodiments, wafer stage 604 may be motorized sample stage 201 in FIG. 2. In some embodiments, subsystem 606 may be used to ground wafer 304 and may be similar to system 300 in FIG. 3, the details of which will not be described hereinafter. In some embodiments, subsystem 608 may adjust locations ("grounding locations") where grounding pins 312 contact backside film 308.

In some embodiments, when wafer 304 is mounted atop electrostatic holder 306 and grounding pins 312 contact backside film 308, subsystem 606 may test whether wafer 304 may be grounded, such as by use of processes described in FIGS. 3-5. If the grounding does not succeed, subsystem 608 may receive a signal indicated such and generate a signal for adjusting the grounding locations. The signal may drive one or more actuators of subsystem 602 to change the grounding locations. When the grounding locations are adjusted, subsystem 606 may continue to test whether wafer 304 may be grounded. The aforementioned process may be repeated until wafer 304 is successfully grounded. It should be noted that, although subsystem 602 is shown as a multi-pin system in FIG. 6, it may also be a single-pin system (e.g., similar to subsystem 302 in FIG. 3), and the wafer grounding location adjustment may still work.

Figure 7:
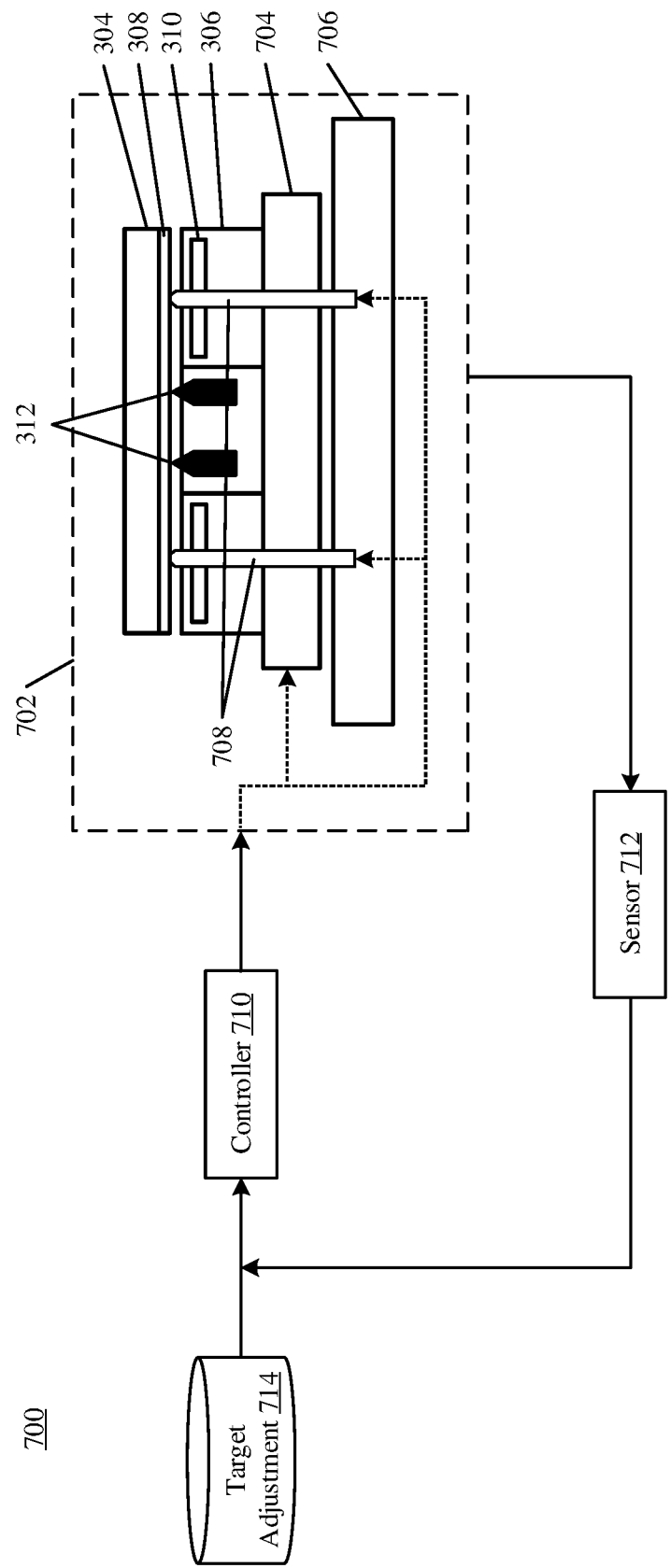
FIG. 7 is an illustration of an example system of wafer grounding location adjustment, consistent with some embodiments of the present disclosure.

FIG. 7 is an illustration of an example system 700 of wafer grounding location adjustment, consistent with some embodiments of the present disclosure. In some embodiments, system 700 may be an embodiment of subsystem 608. System 700 includes at least a subsystem 702 for holding a wafer, a controller 710, a sensor 712, and a target adjustment 714. Sensor 712 may measure relative position (e.g., rotational or translational position) between wafer 304 and grounding pins 312. In some embodiments, target adjustment 714 may include values of parameters to be used by controller 710 for controlling the actuators of subsystem 702 to adjust the grounding locations to target locations. For example, the target locations may include a rotational location or a translational location. In some embodiments, target adjustment 714 may be stored in a database (e.g., in the one or more memories of system 100 in FIG. 1). Subsystem 702 may be similar to subsystem 302 in FIG. 3 or subsystem 602 in FIG. 6, and includes wafer 304, electrostatic holder 306, backside film 308, electrodes 310, grounding pins 312, a top portion 704 of a wafer stage, a bottom portion 706 of the wafer stage, and actuators including lifters 708. Subsystem 702 is shown as a multipin system in FIG. 7. However, it may also be a single-pin system, such as subsystem 302 in FIG. 3. The actuators may include electric actuators, magnetic actuators, electromagnetic actuators, hydraulic actuators, mechanical actuators, or any suitable type of actuators. In some embodiments, the wafer stage (including top portion 704 and bottom portion 706) may be motorized sample stage 201 in FIG. 2.

Controller 710 may be electrically connected to sensor 712 and the actuators, including lifters 708 and actuators (not shown) mechanically connected to top portion 704. Controller 710 may control the actuators to move various parts of subsystem 702, such as lifters 708, top portion 704, grounding pins 312, or other mechanical components (e.g., a robot arm) for moving wafer 304. For example, the dashed arrow between controller 710 and top portion 704 may indicate that controller 710 may control actuators (not shown) to move top portion 704 horizontally, vertically, or both. The dashed arrow between controller 710 and lifters 708 may indicate that controller 710 may control lifters 708 to move wafer 304 vertically. In some embodiments, controller 710 may further connect to a database to retrieve parameters for controlling the actuators or store data received from sensor 712. For example, controller 710 may access the database storing target adjustment 714. In some embodiments, controller 710 may be implemented as part of controller 109 in FIGS. 1-2. In some embodiments, controller 710 may be implemented as a controller independent from controller 109, such as a software module or a hardware module.

In some embodiments, bottom portion 706 may be stationary, and top portion 704 may be movable. For example, top portion 704 may be movable (e.g., along the vertical direction, the horizontal direction, or both) or rotatable in the horizontal direction, or both. In some embodiments, electrostatic holder 306 may be fixed to top portion 704 and may also be movable therewith. In some embodiments, top portion 704 may support wafer 304 via electrostatic holder 306 and fix grounding pins 312. For example, an end of a grounding pin may be fixed to top portion 704 and may also be movable with top portion 704. When wafer 304 rests on top portion 704 (e.g., on top of electrostatic holder 306), grounding pins 312 may contact a bottom surface (e.g., backside film 308) of wafer 304.

In some embodiments, the actuators may move the top portion. For example, the actuators may include a rotational mechanism (not shown) to rotate top portion 704 in the horizontal direction, such as by an azimuthal angle. In some embodiments, the actuators may include lifters 708. A first end of a lifter may be fixed to bottom portion 706, and a second end of a lifter may be vertically movable. For example, the first end of the lifter may be horizontally fixed to the bottom portion 706 (e.g., by penetrating a hole in the bottom portion 706) and vertically movable. The second end of the lifter may be raised or lowered by a moving mechanism, such as an electromagnetic actuator or a hydraulic actuator. The second end of the lifter may penetrate through top portion 704, electrostatic holder 306, and electrodes 310, such as by penetrating holes or grooves therein. The second end of the lifter may move beyond a top surface of the electrostatic holder 306 and contact the bottom surface of wafer 304. In subsystem 702, by raising the lifters to a certain height (e.g., several millimeters), wafer 304 may be raised to leave the top surface of the electrostatic holder 306 and be detached with grounding pins 312.

In some embodiments, lifters 708 may be vertically and horizontally fixed, and top portion 704 may be vertically movable. When top portion 704 is lowered, grounding pins 312 and electrostatic holder 306 may be lowered as well. However, lifters 708 may support wafer 304, and wafer 304 may be vertically stationary. By lowering top portion 704, electrostatic holder 306 may be lowered to leave the bottom surface of wafer 304, and grounding pins 312 may be detached with the bottom surface.

In some embodiments, for adjusting grounding locations, the following procedures may be performed by system 700. Subsystem 606 in FIG. 6 may determine that wafer 304 is not grounded and send a signal indicative of such to controller 710. Controller 710 may control sensor 712 to measure a current rotational angle (e.g., an azimuthal angle) of grounding pins 312 relative to wafer 304. Controller 710 may further retrieve target adjustment 714 (e.g., a value of a target rotational angle). Controller 710 may compare the target angle with the current rotational angle, such as by determining an angle difference therebetween. Controller 710 may then send the angle difference to the actuators for adjusting the grounding locations. In some embodiments, controller 710 may store computer-readable instructions in an accessible memory, such as a software module, and execute such instructions to perform the aforementioned operations.

In some embodiments, adjusting the grounding locations may include changing relative rotational angles (e.g., azimuthal angles) between grounding pins 312 and wafer 304. Changing the relative rotational angles may include at least one of changing a rotational angle of wafer 304 while keeping grounding pins 312 rotationally stationary, changing a rotational angle of grounding pins 312 while keeping wafer 304 rotationally stationary, or changing rotational angles of grounding pins 312 and wafer 304.

For example, in some embodiments, when lifters 708 are horizontally fixed to bottom portion 706 and vertically movable, controller 710 may control lifters 708 to lift up wafer 304, such as by keeping top portion 704 vertically stationary. Because grounding pins 312 and electrostatic holder 306 are fixed on top portion 704, when wafer 304 is lifted up by lifters 708, backside film 308 may detach from grounding pins 312 and the top surface of electrostatic holder 306. Controller 710 may further control top portion 704 to rotate horizontally (e.g., in the azimuthal direction) for an angle equal to the angle difference. The direction of the rotation may be either clockwise or counterclockwise. In some embodiments, the rotation may be with respect to a center of top portion 704. Because grounding pins 312 are fixed on top portion 704, they may also be rotated for the angle difference with top portion 704. Controller 710 may control bottom portion 706 to be rotationally stationary, and thus wafer 304 is also rotationally stationary. After performing such a rotation, controller 710 may control lifters 708 to lower wafer 304 until wafer 304 sits on top of electrostatic holder 306, when grounding pins 312 reattach to backside film 308 at different locations.

For another example, in some embodiments, when lifters 708 are horizontally and vertically fixed to bottom portion 706, controller 710 may control actuators (not shown) to lower top portion 704 to detach grounding pins 312 and backside film 308. Lifters 708 that are horizontally and vertically fixed to bottom portion 706 may also be referred to as "supporters." Because grounding pins 312 and electrostatic holder 306 are fixed on top portion 704, when top portion 704 is lowered by the actuators, backside film 308 may detach from grounding pins 312 and the top surface of electrostatic holder 306. Controller 710 may further control top portion 704 to rotate horizontally (e.g., in the azimuthal direction) for an angle equal to the angle difference. The direction of the rotation may be either clockwise or counterclockwise. In some embodiments, the rotation may be with respect to a center of top portion 704. Because grounding pins 312 are fixed on top portion 704, they may also be rotated for the angle difference with top portion 704. Controller 710 may control bottom portion 706 to be rotationally stationary, and thus wafer 304 is also rotationally stationary. After performing such a rotation, controller 710 may control the actuators to lift top portion 704 until wafer 304 sits on top of electrostatic holder 306, when grounding pins 312 reattach to backside film 308 at different locations.

For another example, in some embodiments, grounding pins 312 may not be fixed on top portion 704 and be fixed on an independent actuator (not shown). In this example, controller 710 may control the actuators to lower grounding pins 312 while keeping top portion 704 and wafer 304 vertically stationary, such as by keeping lifters 708 vertically stationary. Grounding pins 312 may then detach from backside film 308, while wafer 304 keeps sitting on top of electrostatic holder 306. Controller 710 may further control the independent actuators to rotate grounding pins 312 horizontally (e.g., in the azimuthal direction) for an angle equal to the angle difference. The direction of the rotation may be either clockwise or counterclockwise. In some embodiments, the rotation may be with respect to a center of top portion 704. After performing such a rotation, controller 710 may control the actuators to lift grounding pins 312 until they reattach to backside film 308 at different locations.

In some embodiments, controller 710 may adjust translational locations between grounding pins 312 and wafer 304. For example, controller 710 may control to detach grounding pins 312 and backside film 308, and control translational actuators (not shown) to adjust horizontal positions for a predetermined distance along a predetermined direction of at least one of top portion 704, grounding pins 312, or wafer 304, then reattach grounding pins 312 and backside film 308 at different locations. In some embodiments, controller 710 may adjust both translational locations and rotational locations between grounding pins 312 and backside film 308.

When controller 710 completes adjustment of grounding locations, subsystem 606 may test again whether wafer 304 may be grounded. If wafer 304 may be successfully grounded, the adjustment process may be ended. Otherwise, system 700 may function again to perform another round of adjustment. This process may be repeated until wafer 304 is successfully grounded. In some embodiments, the angle difference may be predetermined as a small value (e.g., thousandths, hundredths, or tenths of 1 degree), and system 700 may perform a substantially arbitrary number of adjustments before successfully grounding wafer 304, which may ensure wafer 304 would not be wasted.

Figure 8:
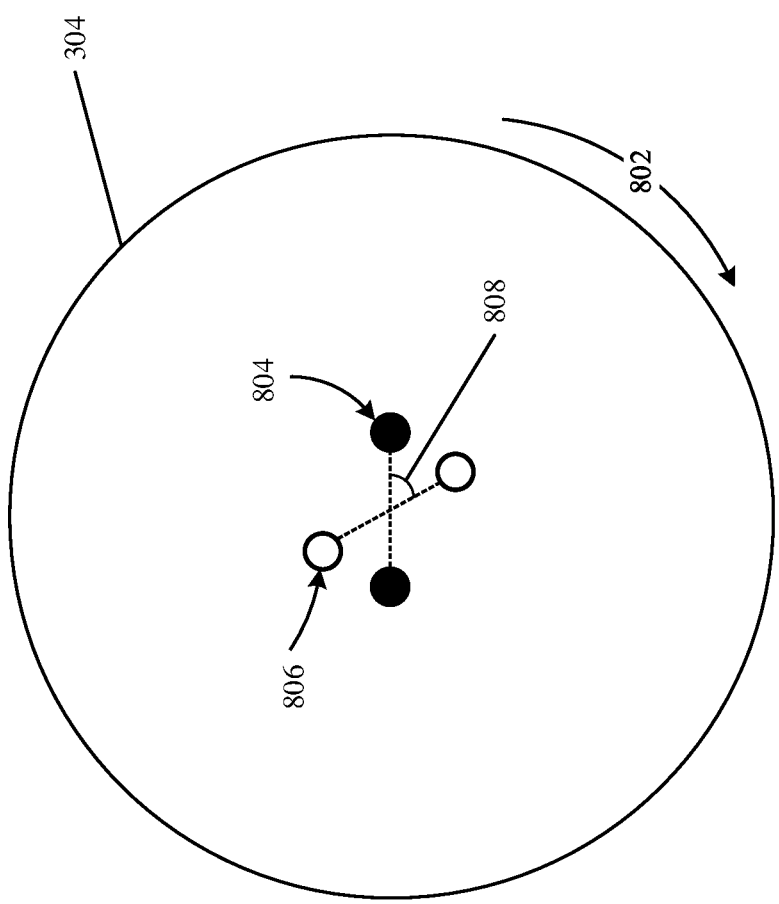
FIG. 8 is an illustration of example grounding locations before and after adjustment, consistent with some embodiments of the present disclosure.

FIG. 8 is an illustration of example grounding locations before and after adjustment. FIG. 8 is a top view of wafer 304 provided in subsystem 702 of FIG. 7. In FIG. 8, subsystem 702 may include two grounding pins 312. Consistent with the examples as described in connection with FIG. 7, wafer 304 may be rotationally stationary. For adjusting grounding rotations, grounding pins 312 may be detached from backside film 308, such as by lifting wafer 304 or lowering top portion 704. As shown in FIG. 8, when wafer 304 is stationary and top portion 704 is rotated, top portion 704 can be rotated along a clockwise direction 802 for an angle difference 808. Before such adjustment, grounding pins 312 may contact backside film 308 at first grounding locations 804, shown as black dots. After the adjustment, grounding pins 312 may contact backside film 308 at grounding locations 806, shown as circles.

By performing such adjustment, the grounding locations may be easily and efficiently performed without discarding wafer 304, and the likelihood of grounding wafer 304 may be increased conveniently, thus improving productivity and efficiency of manufacturing. Also, by using such design of grounding location adjustment, the number of grounding pins may be reduced, and thus the complexity of the wafer grounding system may be lowered. Further, by setting arbitrary values of the angle difference and the predetermined distance, the grounding locations may be adjusted in arbitrary precision and for arbitrary times as needed.

In FIGS. 7-8, in some embodiments, when grounding pins 312 reattach to backside film 308, they may be pressed against backside film 308 with pressure different from that before adjustment. For example, after the adjustment, grounding pins 312 may be pressed with a higher pressure against backside film 308. With a higher pressure, even if the angle difference is 0°, it is likely to let a wafer grounding subsystem (e.g., wafer grounding subsystem 606) to ground wafer 304 in some situations, because grounding pins 312 may penetrate deeper into backside film 308. Changing the pressure may provide another independent aspect to adjust the grounding locations. The location adjustment and pressure adjustment may be used by system 702 independently or in combination.

Figure 9:
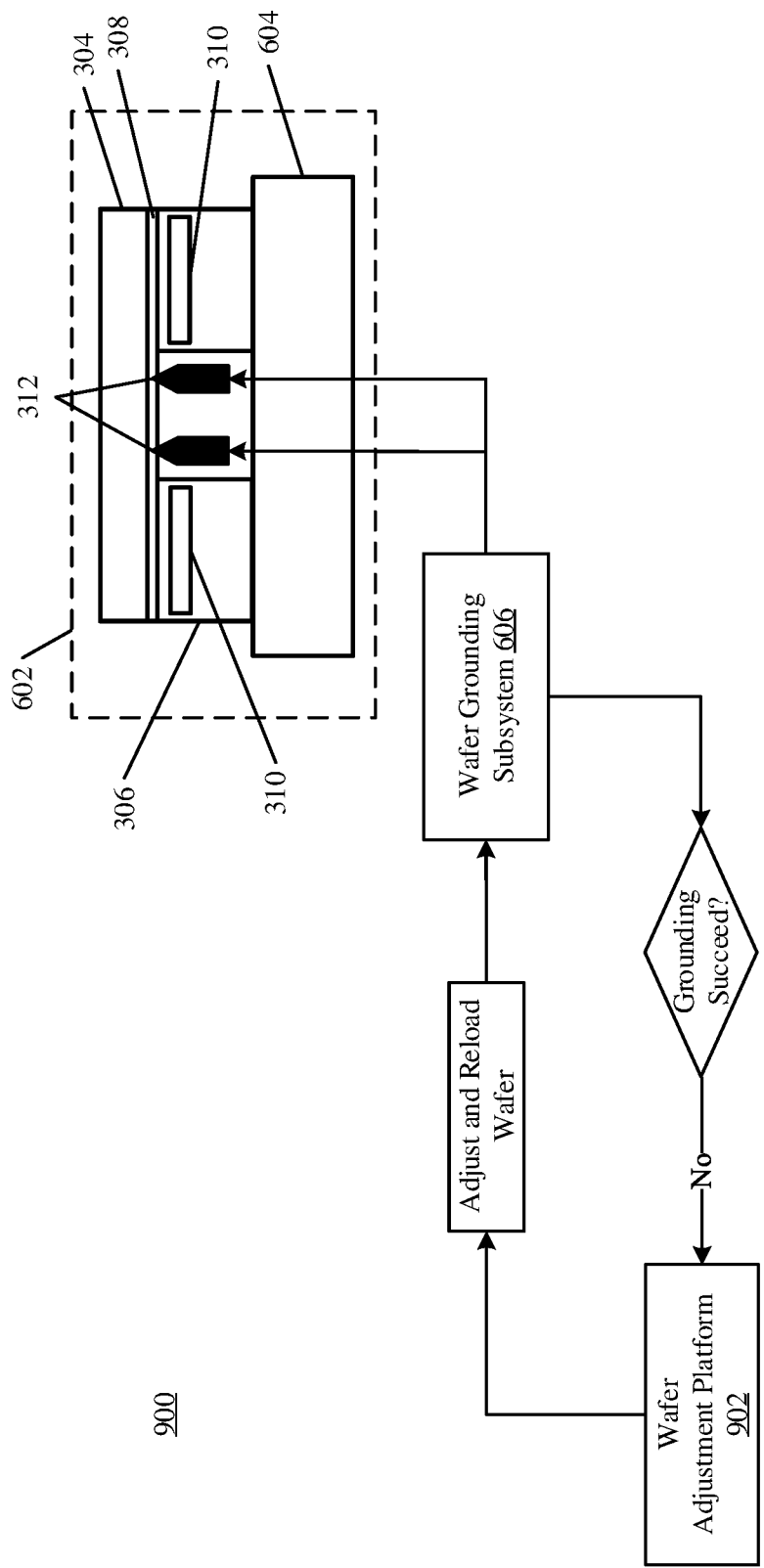
FIG. 9 is an illustration of an example system of wafer grounding location adjustment, consistent with some embodiments of the present disclosure.

FIG. 9 is an illustration of an example system 900 of wafer grounding location adjustment, consistent with some embodiments of the present disclosure. System 900 includes at least subsystem 602 for holding a wafer, wafer grounding subsystem 606, and a wafer adjustment platform 902. Subsystems 602 and 606 have been described in FIG. 6 and will not be further described hereinafter. Wafer adjustment platform 902 may be different from subsystems 608 and 702 and will be detailed as follows.

In some embodiments, wafer adjustment platform 902 may be a platform for rotating or translating wafer 304. For example, wafer adjustment platform 902 may include a controller, a sensor, and at least one actuator to rotate or translate wafer 304. In some embodiments, wafer adjustment platform 902 may be implemented as a component independent of subsystem 602. For example, wafer adjustment platform 902 may be positioned in the same vacuum chamber with subsystem 602 at different locations. In some embodiments, for adjusting the grounding locations, an unloading actuator (e.g., a robot arm) may unload (e.g., by sucking and lifting) wafer 304 from electrostatic holder 306 onto wafer adjustment platform 902. Wafer adjustment platform 902 may rotate wafer 304 for an angle (e.g., by the angle difference) or translate wafer 304 for a distance. After rotating or translating wafer 304, a loading actuator (e.g., the robot arm) may load wafer 304 (e.g., by sucking and lifting) from wafer adjustment platform 902 back to electrostatic holder 306, by which grounding pins 312 may reattach to backside film 308 at different locations. One benefit of using the design of system 900 may be that it may maximize compatibility of the grounding location adjustment system with existing designs of wafer stages by adding a component (wafer adjustment platform 902) without replacing the existing wafer stage (e.g., wafer stage 604) or substantially modifying the existing wafer stage (e.g., by adding lifters 708).

Figure 10:
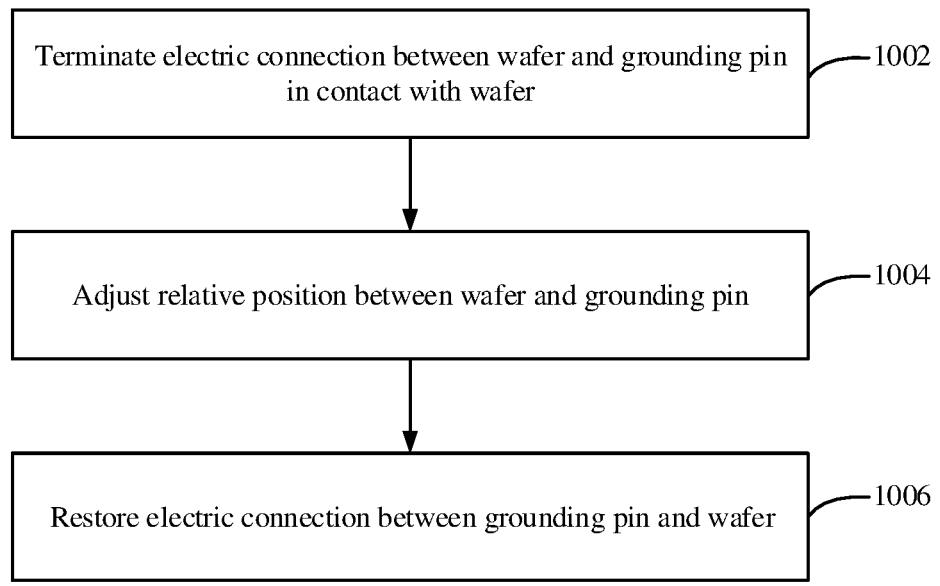
FIG. 10 is a flowchart illustrating an example method of adjusting a grounding location for a wafer, consistent with some embodiments of the present disclosure.
Figure 11:
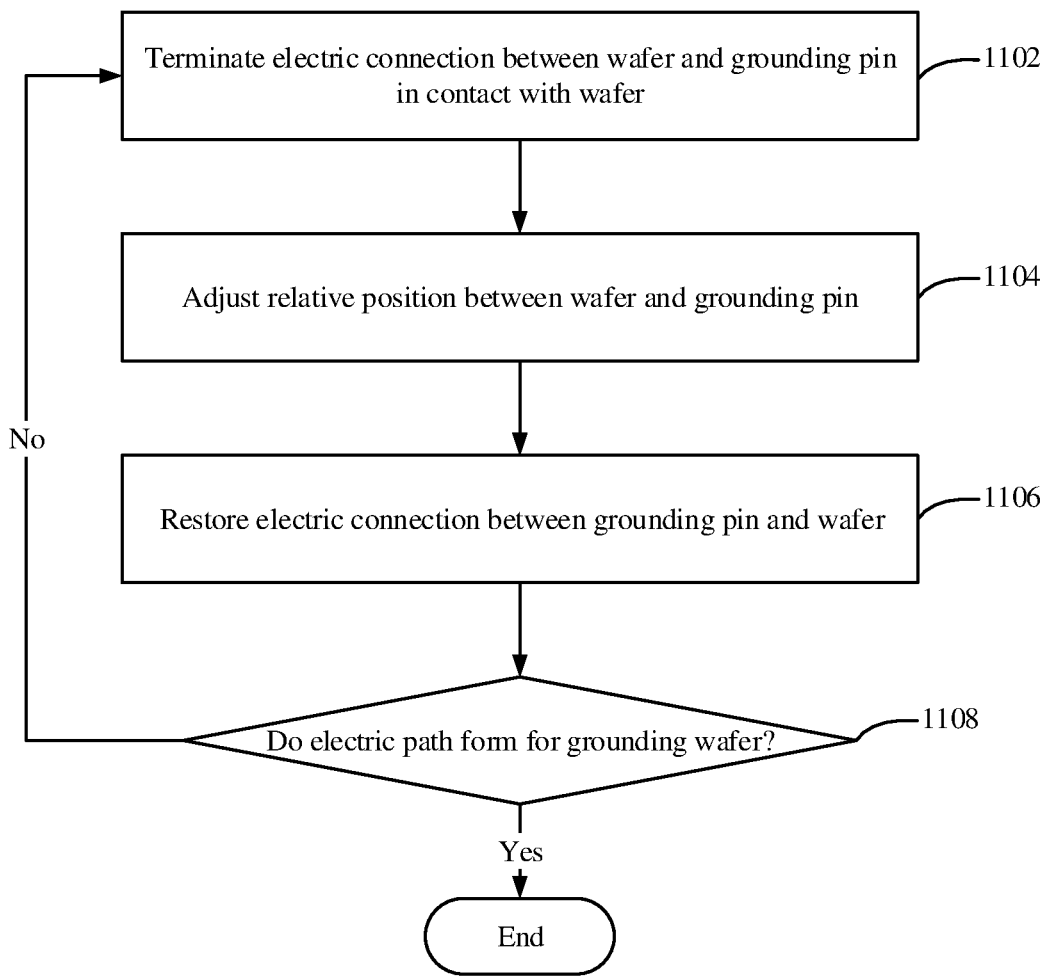
FIG. 11 is a flowchart illustrating another example method for adjusting a grounding location for a wafer, consistent with some embodiments of the present disclosure.

FIGS. 10-11 show example flowcharts of methods 1000-1100 that are consistent with some embodiments of this disclosure. Methods 1000-1100 may be performed by a controller that may be coupled with a charged particle beam apparatus (e.g., EBI system 100). For example, the controller may be controller 109 in FIG. 2 or controller 710 in FIG. 7. The controller may be programmed to implement methods 1000-1100.

FIG. 10 is a flowchart illustrating an example method of adjusting a grounding location for a wafer, consistent with some embodiments of the present disclosure.

At step 1002, the controller terminates an electric connection between the wafer and a grounding pin in contact with the wafer. For example, the wafer may be wafer 304 in FIGS. 6-9. The grounding pin may be at least one of grounding pins 312 in FIGS. 6-9. In some embodiments, the controller may control an actuator to lift the wafer away from a wafer mount (e.g., electrostatic holder 306 in FIGS. 6-9) supporting the wafer using lifters (e.g., lifters 708 in FIG. 7). The lifters may be in contact with a bottom surface (e.g., backside film 308 FIGS. 6-9) of the wafer and fixed to a bottom portion (e.g., bottom portion 706 in FIG. 7) of the wafer mount. In some embodiments, the grounding pin may be fixed to a top portion (e.g., top portion 704 in FIG. 7) of the wafer mount, and the grounding pin may contact the bottom surface of the wafer when the wafer rests on the top portion.

In some embodiments, the controller may control an actuator to lower the grounding pin from the bottom surface of the wafer that rests on the wafer mount to detach the wafer and the grounding pin. The grounding pin may be vertically movable in the wafer mount, such as shown and described in FIG. 7. The controller may control to keep the wafer vertically stationary. For example, the grounding pin may be connected to an independent actuator that may lower and lift the grounding pin vertically without lowering or lifting the wafer mount, such as shown and described in FIG. 7.

In some embodiments, the controller may control an actuator to lower the top portion of the wafer mount to detach the grounding pin and the wafer. In some embodiments, the grounding pin may be fixed to the top portion of the wafer mount, such as shown and described in FIG. 7. The bottom surface of the wafer may contact non-movable supporters (e.g., when lifters 708 are kept vertically stationary) fixed to the bottom portion of the wafer mount, such as shown and described in FIG. 7. The grounding pin may contact the bottom surface of the wafer when the top portion is not lowered, such as shown and described in FIG. 7.

In some embodiments, the controller may control an actuator to remove the wafer from the wafer mount to a platform, such as shown and described in FIG. 9. In some embodiments, the grounding pin may be fixed to the wafer mount and contact the wafer when the wafer rests on the wafer mount, such as shown and described in FIG. 9.

At step 1004, the controller adjusts a relative position between the wafer and the grounding pin. In some embodiments, the relative position may include a relative rotational position, a relative translational position, or a combination thereof. In some embodiments, the controller may control an actuator to adjust a relative azimuthal angle between the wafer and the grounding pin by a predetermined angle, such as shown and described in FIGS. 6-9. In some embodiments, the predetermined angle may be a difference between a current relative azimuthal angle and a target relative angle. The current relative azimuthal angle may be between the wafer and the grounding pin. The target relative azimuthal angle may be between the wafer and the grounding pin. For example, the predetermined angle may be angle difference 808 in FIG. 8.

In some embodiments, if the wafer is detached with the grounding pin by lifting the wafer away from the wafer amount using lifters or by lowering the top portion of the wafer mount, the controller may adjust the relative position by rotating the top portion of the wafer mount with respect to the bottom portion of the wafer mount by the predetermined angle. In some embodiments, if the wafer is detached with the grounding pin by lowering the grounding pin from the bottom surface of the wafer, the controller may adjust the relative position by rotating the grounding pin with respect to the wafer mount for the predetermined angle, when the grounding pin is rotationally movable with respect to the wafer mount. In some embodiments, if the wafer is detached with the grounding pin by removing the wafer from the wafer mount to the platform, the controller may adjust the relative position by causing the platform to rotate the wafer by the predetermined angle.

In some embodiments, if the wafer is detached with the grounding pin by translation, the controller may control an actuator to adjust a relative translational distance between the wafer and the grounding pin by a predetermined distance, such as described in FIG. 7.

At step 1006, the controller restores the electric connection between the grounding pin and the wafer. In some embodiments, if the wafer is detached with the grounding pin by lifting the wafer away from the wafer amount using lifters, the controller may reattach the grounding pin and the wafer by lowering the wafer onto the top portion of the wafer mount using the lifters, such as shown and described in FIG. 7. In some embodiments, if the wafer is detached with the grounding pin by lowering the grounding pin from the bottom surface of the wafer, the controller may reattach the grounding pin and the wafer by elevating the grounding pin to contact the bottom surface of the wafer, such as shown and described in FIG. 7. In some embodiments, if the wafer is detached with the grounding pin by lowering the top portion of the wafer mount, the controller may reattach the grounding pin and the wafer by lifting the top portion of the wafer mount, such as shown and described in FIG. 7.

In some embodiments, if the wafer is detached with the grounding pin by removing the wafer from the wafer mount to the platform, the controller may reattach the grounding pin and the wafer by moving the wafer onto the wafer mount from the platform, such as shown and described in FIG. 9.

In some embodiments, when the controller signals to reattach the grounding pin and the wafer, the grounding pin may contact the bottom surface of the wafer with pressure different from pressure between the grounding pin and the bottom surface before detaching the wafer and the grounding pin. In some embodiments, the grounding pin may contact the bottom surface of the wafer at a location different from a location where the grounding pin contacts the bottom surface before detaching the wafer and the grounding pin, such as shown in FIG. 8. In some embodiments, the grounding pin may contact the bottom surface of the wafer at the same relative position.

In some embodiments, steps 1002-1006 may be repeated until the wafer is successfully grounded.

FIG. 11 is a flowchart illustrating another example method 1100 for adjusting a grounding location for a wafer, consistent with some embodiments of the present disclosure. Method 1100 includes steps 1102-1108. The controller may perform steps 1102-1106 in a similar way to steps 1002-1006, respectively.

At step 1108, another controller (e.g., controller 322 in FIG. 3, or the controller in subsystem 606 in FIGS. 6 and 9) may determine whether an electric path forms (or being substantially open) for grounding the wafer. If the electric path does not form (or being substantially open), the controller may go back to perform steps 1102-1106. If the electric path forms (or being close), the controller may stop performing method 1100, in which the wafer may be determined to be successfully grounded. In this disclosure, an electric path is deemed as "substantially open" if an impedance (e.g., a resistance) of the electric path is greater than or equal to a predetermined threshold value. When the impedance is greater than or equal to the predetermined threshold value, the controller may determine that the electric path is open. In some embodiments, the predetermined threshold value may include a resistance value of 100,000 ohms.

Figure 12:
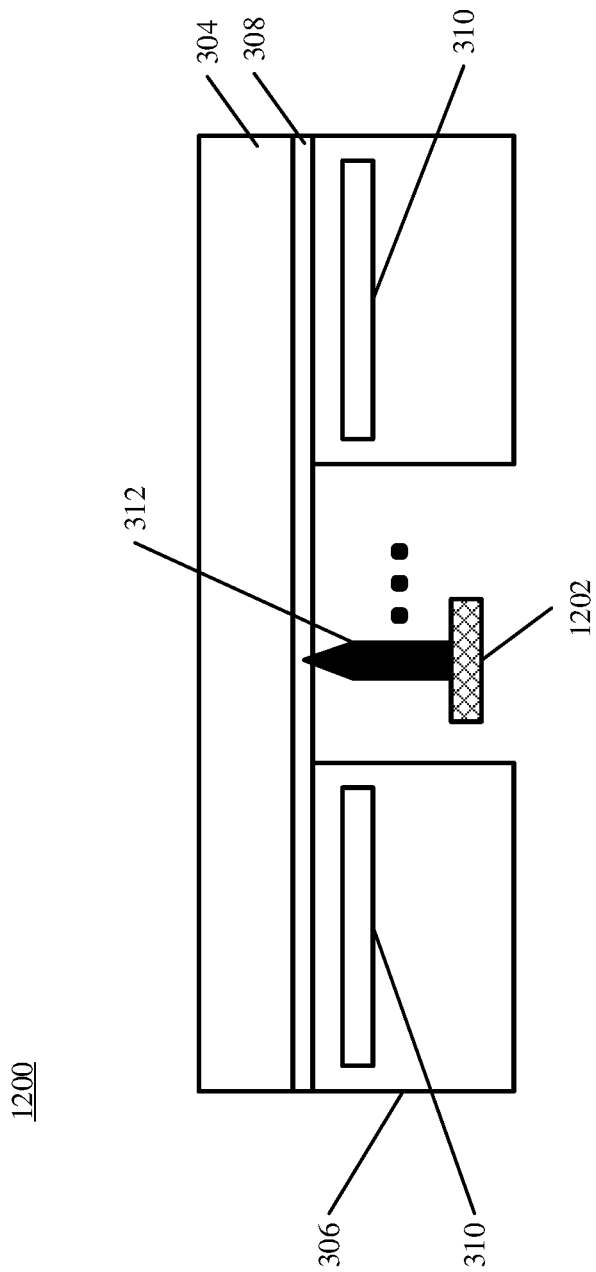
FIG. 12 is an illustration of an example multi-pin wafer grounding system, consistent with some embodiments of the present disclosure.

This disclosure also provides methods and systems for grounding a wafer using a vibrator to adjust the grounding pins. In some embodiments, the vibrator may be used in a system to support the electric zapping method, the penetration method, or both, for wafer grounding. FIG. 12 is an illustration of an example multi-pin wafer grounding system 1200, consistent with some embodiments of the present disclosure. System 1200 is similar to system 400, and includes wafer 304, electrostatic holder 306, backside film 308, electrodes 310, multiple grounding pins 312, and multiple vibrators 1202 coupled (e.g., fixed) to the grounding pins 312. In some embodiments, each of grounding pins 312 may be coupled with a single vibrator. In some embodiments, each of vibrators 1202 may be coupled to two or more grounding pins, or each grounding pin may be coupled to two or more vibrators 1202. The vibrator may vibrate grounding pins 312 along any direction (e.g., horizontally, vertically, circularly, elliptically, or any direction) of any number of dimensions (e.g., 1D, 2D, or 3D). In some embodiments, vibrators 1202 may be integrated with actuators (e.g., lifters 708) of grounding pins 312. In some embodiments, vibrators 1202 may include piezoelectric actuators.

In some embodiments, vibrators 1202 may be powered by a power supply. For example, the power supply may be the same or different from electric signal generator 314. Controller 322 may control the output of the power supply. For example, controller 322 may control the output to be any shape of electric signals or pulses to drive vibrators 1202 to vibrate.

In some embodiments, controller 322 may control vibration of vibrators 1202 for wafer grounding. For example, in a system using penetration method, grounding pins 312 may penetrate backside film 308 and directly contact with wafer 304 at initial grounding locations. If an electric path is not formed to allow a grounding signal to flow between wafer 304 and grounding pins 312 (e.g., one or more grounding pins 312 fail to fully penetrate backside film 308, or grounding pins 312 have deposited contaminating particles), controller 322 may control vibrators 1202 or wafer 304 to vibrate, such as making grounding pins 312 to have better contact with wafer 304 or shake off deposited particles on grounding pins 312. For another example, in a system using the electric zapping method, besides using the actuators (e.g., lifters 708 or top portion 708) to adjust grounding locations of grounding pins 312, vibrators 1202 may provide another dimension of control to achieve better grounding at the same or adjusted grounding locations. It should be noted that, by providing vibrators 1202, a wafer grounding system may be enabled to use both the penetration method and the electric zapping method for wafer grounding. In other words, a wafer grounding system with vibrators 1202 may have two "modes" of wafer grounding: a mechanical mode (using the penetration method) and an electric mode (using the electric zapping method).

In some embodiments, when wafer 304 is stationary, controller 322 may control vibrators 1202 to vibrate. For example, when vibrators 1202 are fixed to top portion 708 in FIG. 7 or top portion 708 functions as a vibrator for grounding pins 312, controller 322 may control top portion 708 to vibrate. For another example, when vibrators 1202 are independent of top portion 704, controller 322 may control vibrators 1202 to vibrate independently from movement of top portion 708. In some embodiments, when wafer 304 is not stationary, controller 322 may control wafer 304 to vibrate. For example, controller 322 may control electrodes 310 to vibrate, thereby causing wafer 304 to vibrate. It is noted that vibrators 1202 are not limited to the examples as disclosed herein and may be implemented in any suitable method to make grounding pins 312 vibrate relative to wafer 304.

In some embodiments, controller 322 may control vibrators 1202 to vibrate periodically. In some embodiments, controller 322 may control vibrators 1202 to vibrate "on demand," such as when detecting failed electric connection between wafer 304 and grounding pins 312.

Figure 13:
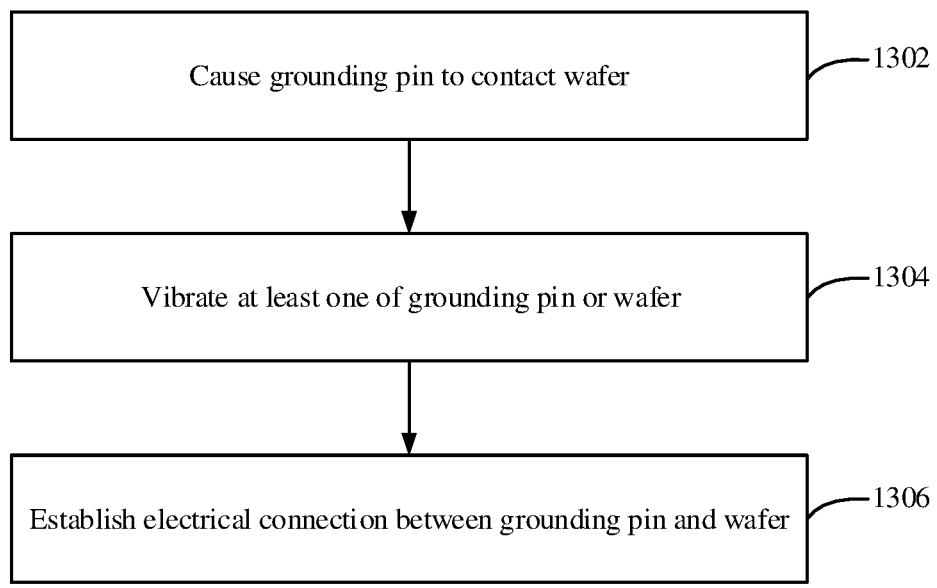
FIG. 13 is a flowchart illustrating an example method for wafer grounding, consistent with some embodiments of the present disclosure.

FIG. 13 is a flowchart illustrating an example method 1300 for wafer grounding, consistent with some embodiments of the present disclosure. Method 1300 may be performed by a controller that may be coupled with a charged particle beam apparatus (e.g., EBI system 100). For example, the controller may be controller 322 in FIG. 3 or controller 710 in FIG. 7. The controller may be programmed to implement method 1300.

At step 1302, the controller causes a grounding pin to contact the wafer. The controller may perform step 1302 in a way similar to step 1002 or 1102. In some embodiments, before performing step 1302, the controller may determine whether an electric path forms for grounding the wafer. If the electric path does not form, the controller may then perform step 1302.

At step 1304, the controller vibrates at least one of the grounding pin or the wafer. In some embodiments, the controller may vibrate a vibrator coupled to the grounding pin (e.g. grounding pins 312 in FIG. 12) and a top portion (e.g., top portion 704) of a wafer mount supporting the wafer. In some embodiments, the vibrator may be the top portion. In some embodiments, the controller may vibrate a wafer holder (e.g., electrostatic holder 306 or electrodes 310), in which the wafer holder secures the wafer on the wafer mount. In some embodiments, the controller may vibrate the at least one of the grounding pin or the wafer along at least one of a direction perpendicular to a surface of the wafer or a direction parallel to the surface. For example, as shown in FIG. 12, the controller may vibrate at least one of the grounding pin or the wafer along a horizontal direction, a vertical direction, a circular direction, or a 3D direction.

At step 1306, the controller establishes an electrical connection between the grounding pin and the wafer. The controller may perform step 1306 in a way similar to step 1006 or 1106. In some embodiments, the controller may restore the electric connection using a penetration method. For example, the controller may press the grounding pin against a surface of the wafer through a coating (e.g., backside film 308) of the surface to have a direct contact with the wafer. In some embodiments, the controller may restore the electric connection using an electric zapping method. For example, the controller may press the grounding pin against the surface of the wafer through the coating (e.g., backside film 308), in which the grounding pin does not fully penetrate the coating.

In some embodiments, after step 1306, another controller (e.g., controller 322 in FIG. 3, or the controller in subsystem 606 in FIGS. 6 and 9) may determine whether an electric path forms (or being substantially open) for grounding the wafer. If the electric path does not form (or being substantially open), the controller may go back to performing steps 1302-1306. If the electric path forms, the controller may stop performing method 1300, in which the wafer may be determined to be successfully grounded.

This disclosure also provides methods and systems for grounding a wafer with a thickened backside film. In some embodiments, highly complex structures are to be manufactured on a wafer. Such complex structures may include a high number of layers. For example, the complex structures may include a three-dimensional circuit that include one or more NOT-AND ("NAND") gates, such as a NAND flash memory circuit. Compared with other structures, the multi-layer complex structure may cause higher tension on the surface of the wafer, which may warp or bow the wafer. The bowed wafer may cause problems in the inspection process, such that parts of the wafer may deviate from a focal plane of a primary electron beam (e.g., primary electron beam 220 in FIG. 2). Those problems may cause quality deterioration (e.g., out of focus, blurring, distortion, or the like) of the inspection image.

To avoid warping or bowing the wafer due to such complex structures, in some embodiments, the wafer may be coated with a thickened backside film to enhance its mechanical strength. For example, in normal cases, thickness of the backside film may be 0.1-0.3 µm. To avoid warping or bowing the wafer, the thickness of the backside film may be increased (e.g., to 1.4-2.2 µm). However, the thickened backside film may be too thick to the extent that neither the electrical zapping method nor the penetration method can work for the wafer grounding. For example, the thickened backside film may be so thick that no dielectric breakdown can break through it in the electrical zapping method. In another example, the thickened backside film may be so thick that no grounding pin may be pressed to penetrate it in the penetration method.

To ground a wafer with a thickened backside film, a "pin-impact method" may be used. FIGS. 14A-14D illustrate operation stages of an example system 1400 for wafer grounding, consistent with some embodiments of the present disclosure. System 1400 may implement the pin-impact method. System 1400 may be a subsystem of any system for wafer grounding (e.g., systems 300, 600, 700, or 900 in FIG. 3, 6, 7, or 9). Although FIGS. 14A-14D show only one grounding pin, it should be noted that any single-pin system (e.g., subsystem 302 in FIG. 3) or multi-pin system (e.g., system 400 in FIG. 4, subsystems 602 or 702 in FIGS. 6-7 and 9, or system 1200 in FIG. 12) may be configured to compatibly implement the pin-impact method. For example, in a multi-pin system, the pin-impact method may be compatibly implemented on one or more of its multiple grounding pins.

In FIGS. 14A-14D, system 1400 includes wafer 304, backside film 1402, grounding pin 312, and an actuator (not shown). Backside film 1402 may be similar to backside film 308 in FIGS. 3-4, 6-7, 9, and 12. In some embodiments, backside film 1402 may be thickened. For example, thickness of backside film 1402 may exceed 0.3 µm (e.g., 1.4-2.2 µm). In some embodiments, the actuator may be coupled to a wafer stage (e.g., wafer stage 604 in FIG. 6 or 9) supporting the wafer. For example, the actuator may be coupled to a portion (e.g., top portion 704 in FIG. 7) of the wafer stage. In some embodiments, the actuator may include one of an electric actuator (e.g., an electromechanical actuator such as an electric motor, or an electrohydraulic actuator that includes a hydraulic accumulator), a magnetic actuator (e.g., an electric motor), a spring (e.g., a coiled spring or a coiled polymer), a pneumatic actuator, or a hydraulic actuator.

FIG. 14A shows an initial stage of system 1400, in which grounding pin 312 may be controlled (e.g., by controller 322 in FIG. 3 or controller 710 in FIG. 7) to contact backside film 1402. For example, the actuator in the initial stage may be disabled. In other words, grounding pin 312 may be in a default position in the initial stage, in which the default position causes grounding pin 312 to contact backside film 1402. Such a configuration of the initial stage may ensure compatibility of system 1400 for grounding wafers having no thickened backside film. For example, when a wafer having no thickened backside film is placed in system 1400, by setting the initial stage as shown in FIG. 14A, system 1400 may perform other methods (e.g., methods 500, 1000, 1100, or 1300 in FIG. 5, 10, 11, or 13) for wafer grounding without invoking the pin-impact method.

FIG. 14B shows a first stage of system 1400 implementing the pin-impact method, in which grounding pin 312 is moved away from (as indicated by the arrow) backside film 1402 for a distance. In some embodiments, the actuator may move the grounding pin 312 away from the backside film 1402. In some embodiments, grounding pin 312 may be moved away from backside film 1402 so that the distance between grounding pin 312 (e.g., measured from a tip of grounding pin 312) and backside film 1402 may exceed 100 microns. For example, the distance may exceed 1 millimeter. In some embodiments, by moving grounding pin 312 away from backside film 1402, grounding pin 312 may have sufficient space for acceleration, as described below.

FIG. 14C shows a second stage of system 1400 implementing the pin-impact method, in which the actuator (not shown) may actuate (e.g., accelerate) grounding pin 312 toward backside film 1402 (as indicated by the arrow). In some embodiments, the acceleration may end before grounding pin 312 impact backside film 1402. In some embodiments, the actuator may actuate grounding pin 312 such that kinetic energy of grounding pin 312 may exceed, for example, 0.0002 joules (e.g., under a maximum travel distance of 3 millimeters for ground pin 312) before impacting backside film 1402. It should be noted that the kinetic energy of grounding pin before impacting backside film 1402 may depend on its travel distance under the actuation by the actuator, and is not limited to the above examples.

FIG. 14D shows a final stage of system 1400 implementing the pin-impact method, in which grounding pin 312 penetrates through backside film 1402 by impact due to the kinetic energy gained in the second stage as described in FIG. 14C. In some embodiments, grounding pin 312 may fully penetrate backside film 1402 and have a direct contact with wafer 304 without drilling into it. In such cases, an electrical connection between grounding pin 312 and wafer 304 may be established for grounding wafer 304 using a penetration method of wafer grounding. In some embodiments, grounding pin 312 may not fully penetrate backside film 1402 such that a distance between a tip of grounding pin 312 and a surface (e.g., a conductive surface) of wafer 304 may be smaller than or equal to 0.3 microns. In such cases, the electrical connection between grounding pin 312 and wafer 304 may be established for grounding wafer 304 using an electric zapping method of wafer grounding.

In some embodiments of the pin-impact method as described above, the kinetic energy of grounding pin 312 may depend on the distance between grounding pin 312 and backside film 1402 as described in FIG. 14B. For example, if the actuator is a spring-based actuator, grounding pin 312 may be pulled away from backside film 1402 to compress a spring of the actuator. The larger the distance is between grounding pin 312 and backside film 1402, the more elastic energy grounding pin 312 may gain by compressing the spring. The elastic energy gained by grounding pin 312 may determine its kinetic energy gained in the second stage as described in FIG. 14C. In another example, if the actuator is an electric actuator, the distance between grounding pin 312 and backside film 1402 may determine the space allowing the electric actuator to do work on grounding pin 312 in the second stage as described in FIG. 14C. For a specific type of actuator, different types of wafer, different types of backside films, and different thickness of backside film 1402 may determine the distance in the first stage as described in FIG. 14B.

In some embodiments, the distance may be determined (e.g., by controller 322 in FIG. 3 or controller 710 in FIG. 7) based on at least one of a type of wafer, a type of backside film, or thickness of the backside film. For example, for a specific type of wafer with a specific type of backside film having a specific thickness, experiments may be conducted outside the grounding process in which a corresponding distance may be obtained, such as a distance ensuring direct contact between grounding pin 312 and wafer 304 without drilling, or a distance ensuring dielectric breakdown between grounding pin 312 and wafer 304. The wafer type information may be stored in the wafer grounding system (e.g., in a database storing wafer type 332 as shown in FIG. 3) that includes system 1400, and the corresponding distance may also be stored in the wafer grounding system (e.g., in a database that also stores target value 328 as shown in FIG. 3). When performing the second stage, system 1400 may determine the wafer type information and retrieve the corresponding distance before moving grounding pin 312 away from backside film 1402.

In some embodiments, system 1400 may optimize the distance based on an electric characteristic (e.g., electric characteristic 320 in FIG. 3) determined (e.g., by sensor 316 in FIG. 3) from the electric connection. For example, if grounding pin 312 impacts backside film 1402 but the electric connection cannot be established or the quality of the electric connection cannot satisfy needs for wafer grounding, system 1400 may determine a new distance for moving grounding pin 312 away from backside film 1402 based on the electric characteristic determined from the electric connection, and repeat the pin-impact method as described in FIGS. 14B-14C. In some embodiments, when repeating the pin-impact method, system 1400 may also optimize other parameters besides the distance, such as a target kinetic energy to be applied to grounding pin 312 by the actuator.

In some embodiments, if the electric connection cannot be established in the final stage as described in FIG. 14D, the wafer grounding system that includes system 1400 may adjust a location on wafer at which the pin-impact method is implemented. For example, the location may be adjusted in a way as described in FIGS. 6-11.

FIGS. 15A-15D illustrate operation stages of an example system 1500 for wafer grounding, consistent with some embodiments of the present disclosure. System 1500 may implement a pin-impact method. System 1500 may be a subsystem of any system for wafer grounding (e.g., systems 300, 600, 700, or 900 in FIG. 3, 6, 7, or 9). Although FIGS. 15A-15D show only one grounding pin, it should be noted that any single-pin system (e.g., subsystem 302 in FIG. 3) or multi-pin system (e.g., system 400 in FIG. 4, subsystems 602 or 702 in FIGS. 6-7 and 9, or system 1200 in FIG. 12) may be configured to compatibly implement the pin-impact method. For example, in a multi-pin system, the pin-impact method may be compatibly implemented on one or more of its multiple grounding pins.

In FIGS. 15A-15D, system 1500 includes wafer 304, backside film 1402, grounding pin 312, a mass block 1502, and an actuator (not shown). The actuator in system 1500 may be similar to the actuator in system 1400 as described in FIGS. 14A-14D. Mass block 1502 may be a solid object having a mass. In some embodiments, mass block 1502 may be a hammer or a ram.

Figure 15A:
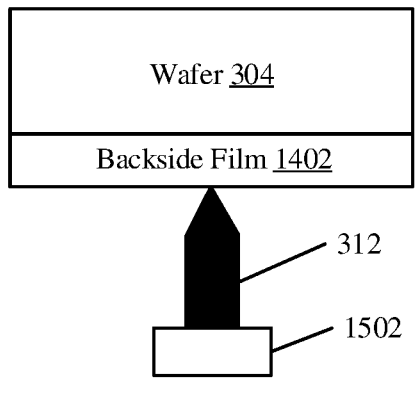
FIGS. 15A-15D illustrate operation stages of another example system for wafer grounding, consistent with some embodiments of the present disclosure.

FIG. 15A shows an initial stage of system 1500, in which grounding pin 312 may be controlled (e.g., by controller 322 in FIG. 3 or controller 710 in FIG. 7) to contact backside film 1402, and mass block 1502 may be controlled to contact grounding pin 312. Similar to the initial stage of system 1400, such a configuration may ensure compatibility of system 1500 for grounding wafers having no thickened backside film.

Figure 15B:
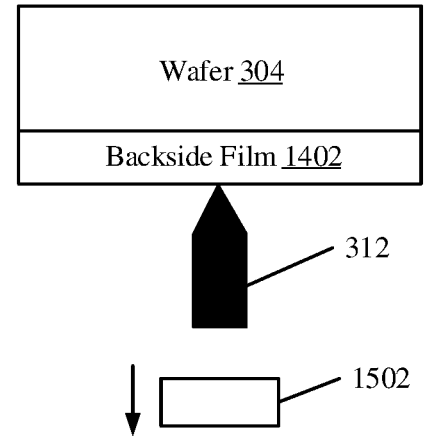

FIG. 15B shows a first stage of system 1500 implementing the pin-impact method, in which mass block 1502 is moved away from (as indicated by the arrow) grounding pin 312 for a distance. In some embodiments, the actuator may move the mass block 1502 away from the backside film 1402. In some embodiments, mass block 1502 may be moved away from grounding pin 312 so that the distance between mass block 1502 (e.g., measured from a top surface of mass block 1502) and grounding pin 312 may exceed 100 microns. For example, the distance may exceed 1 millimeter. In some embodiments, by moving mass block 1502 away from grounding pin 312, mass block 1502 may have sufficient space for acceleration, as described below.

Figure 15C:
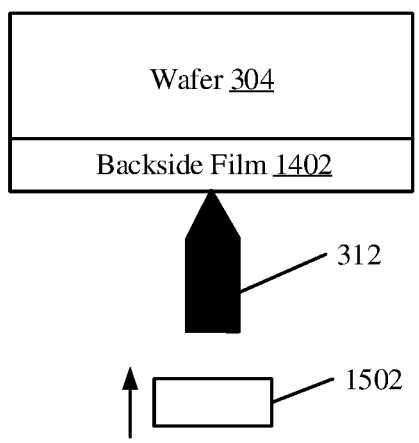

FIG. 15C shows a second stage of system 1500 implementing the pin-impact method, in which the actuator (not shown) may actuate (e.g., accelerate) mass block 1502 toward grounding pin 312 (as indicated by the arrow). In some embodiments, the acceleration may end before mass block 1502 impacts grounding pin 312. In some embodiments, the actuator may actuate mass block 1502 such that kinetic energy of mass block 1502 may exceed, for example, 0.0002 joules before impacting or striking grounding pin 312.

Figure 15D:
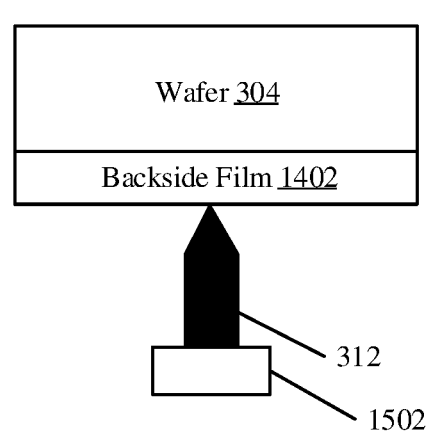

FIG. 15D shows a final stage of system 1500 implementing the pin-impact method, in which grounding pin 312 penetrates through backside film 1402 by impact due to a force applied by mass block 1502 to grounding pin 312. Similar to the final stage of system 1400, in the final stage of system 1500, grounding pin 312 may fully or not fully penetrate backside film 1402, and an electrical connection between grounding pin 312 and wafer 304 may be established for grounding wafer 304 using the penetration method or the electric zapping method, respectively.

In some embodiments of the pin-impact method as described in FIGS. 15A-15D, the kinetic energy of mass block 1502 as it strikes grounding pin 312 may depend on the distance between mass block 1502 and grounding pin 312 as described in FIG. 15B. The relationship between the kinetic energy of mass block 1502 to be obtained in FIG. 15C and the distance between mass block 1502 and grounding pin 312 in FIG. 15B may be similar to the relationship between the kinetic energy of grounding pin 312 to be obtained in FIG. 14C and the distance between grounding pin 312 and backside film 1402 in FIG. 14B, which will not be repeated hereinafter. Also, in some embodiments, the distance in FIG. 15B may be determined based on at least one of a type of the wafer, a type of a coating of the wafer, or thickness of the coating in a similar way as described in FIGS. 14A-14C, which will not be repeated hereinafter. Further, in some embodiments, system 1500 may optimize the distance based on an electric characteristic (e.g., electric characteristic 320 in FIG. 3) determined (e.g., by sensor 316 in FIG. 3) from the electric connection or adjust a location on wafer at which the pin-impact method is implemented in a similar way as described in FIGS. 14A-14C, which will not be repeated hereinafter.

Compared with the pin-impact method as described in FIGS. 14A-14B, the pin-impact method as described in FIGS. 15A-15B may have more degrees of freedom for designing system 1500. For example, the materials and mass of mass block 1502 may be selected with more degrees of freedom. Compared with the pin-impact method as described in FIGS. 15A-15B, the pin-impact method as described in FIGS. 14A-14B may be more straight forward and need less components to implement.

Figure 16:
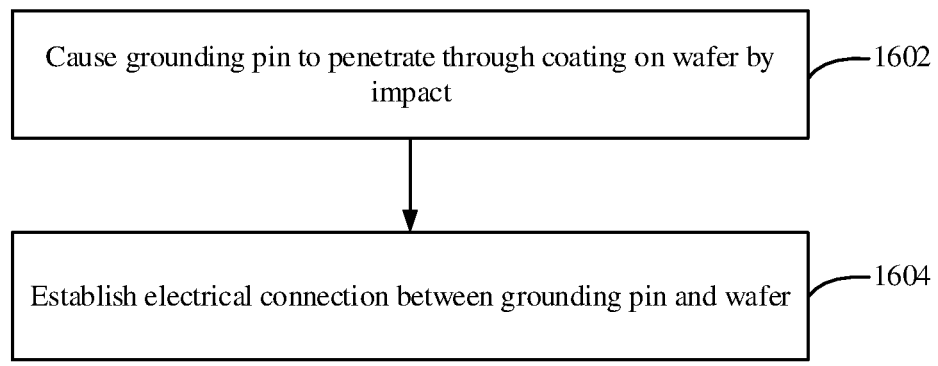
FIG. 16 is a flowchart illustrating an example method for wafer grounding, consistent with some embodiments of the present disclosure.

FIG. 16 is a flowchart illustrating an example method 1600 for wafer grounding, consistent with some embodiments of the present disclosure. Method 1600 may be performed by a controller that may be coupled with a charged particle beam apparatus (e.g., EBI system 100). For example, the controller may be controller 322 in FIG. 3 or controller 710 in FIG. 7. The controller may be programmed to implement method 1600.

At step 1602, the controller causes a grounding pin (e.g., grounding pin 312 in FIGS. 14A-14D or FIGS. 15A-15D) to impact a wafer (e.g., wafer 304 in FIGS. 14A-14D or FIGS. 15A-15D). At step 1604, the controller establishes an electrical connection between the grounding pin and the wafer.

In some embodiments of step 1602, the controller may cause the grounding pin to penetrate through a coating (e.g., backside film 1402 in FIGS. 14A-14D or FIGS. 15A-15D) on the wafer by impact. For example, the coating may have a thickness exceeding 0.3 microns. In some embodiments, the controller may cause the grounding pin to penetrate, via the impact, the coating to have a direct contact with the wafer. In some embodiments, the controller may cause the grounding pin to penetrate the coating via the impact, in which the grounding pin does not fully penetrate the coating. For example, when the grounding pin does not fully penetrate the coating, a distance between a tip of the grounding pin and a surface of the wafer after the grounding pin penetrates through the coating by impact may be smaller than or equal to 0.3 microns. In some embodiments, such as when the aforementioned distance is smaller than or equal to 0.3 microns, the wafer can still be grounded by an electric zapping method.

In some embodiments of step 1602, the controller may actuate (e.g., using the actuator as described in FIGS. 14A-14D) the grounding pin toward the wafer to cause kinetic energy of the grounding pin to exceed, for example, 0.0002 joules. In some embodiments, when actuating the grounding pin toward the wafer, the controller may control moving the grounding pin away from the wafer for a distance (e.g., as shown and described in FIG. 14B) and accelerating the grounding pin toward the wafer (e.g., as shown and described in FIG. 14C). In some embodiments, the distance may exceed 100 microns. For example, the distance may exceed 1 millimeter. In some embodiments, the controller may determine the distance based on at least one of a type of the wafer, a type of a coating of the wafer, or thickness of the coating (e.g., as described in FIGS. 14A-14D). In some embodiments, the controller may cause the grounding pin to contact the wafer before moving the grounding pin away from the wafer, such as in a way shown in FIG. 14A.

In some embodiments of step 1602, the controller may cause a mass block (e.g., mass block 1502 in FIGS. 15A-15D) to impact the grounding pin toward the wafer. In some embodiments, the controller may actuate (e.g., using the actuator as described in FIGS. 15A-15D) the mass block toward the grounding pin to cause kinetic energy of the mass block to exceed, for example, 0.0002 joules. In some embodiments, the controller may control moving the mass block away from the grounding pin for a distance (e.g., as shown and described in FIG. 15B) and accelerating the mass block toward the grounding pin (e.g., as shown and described in FIG. 15C). In some embodiments, the distance may exceed 100 microns. For example, the distance may exceed 1 millimeter. In some embodiments, the controller may determine the distance based on at least one of a type of the wafer, a type of a coating of the wafer, or thickness of the coating (e.g., as described in FIGS. 15A-15D). In some embodiments, the controller may cause the mass block to contact the grounding pin before moving the mass block away from the grounding pin, such as in a way shown in FIG. 15A. In some embodiments, besides causing the mass block to contact the grounding pin before moving the mass block away from the grounding pin, the controller my further cause the grounding pin to contact the wafer, such as in a way shown in FIG. 15A.

Figure 17:
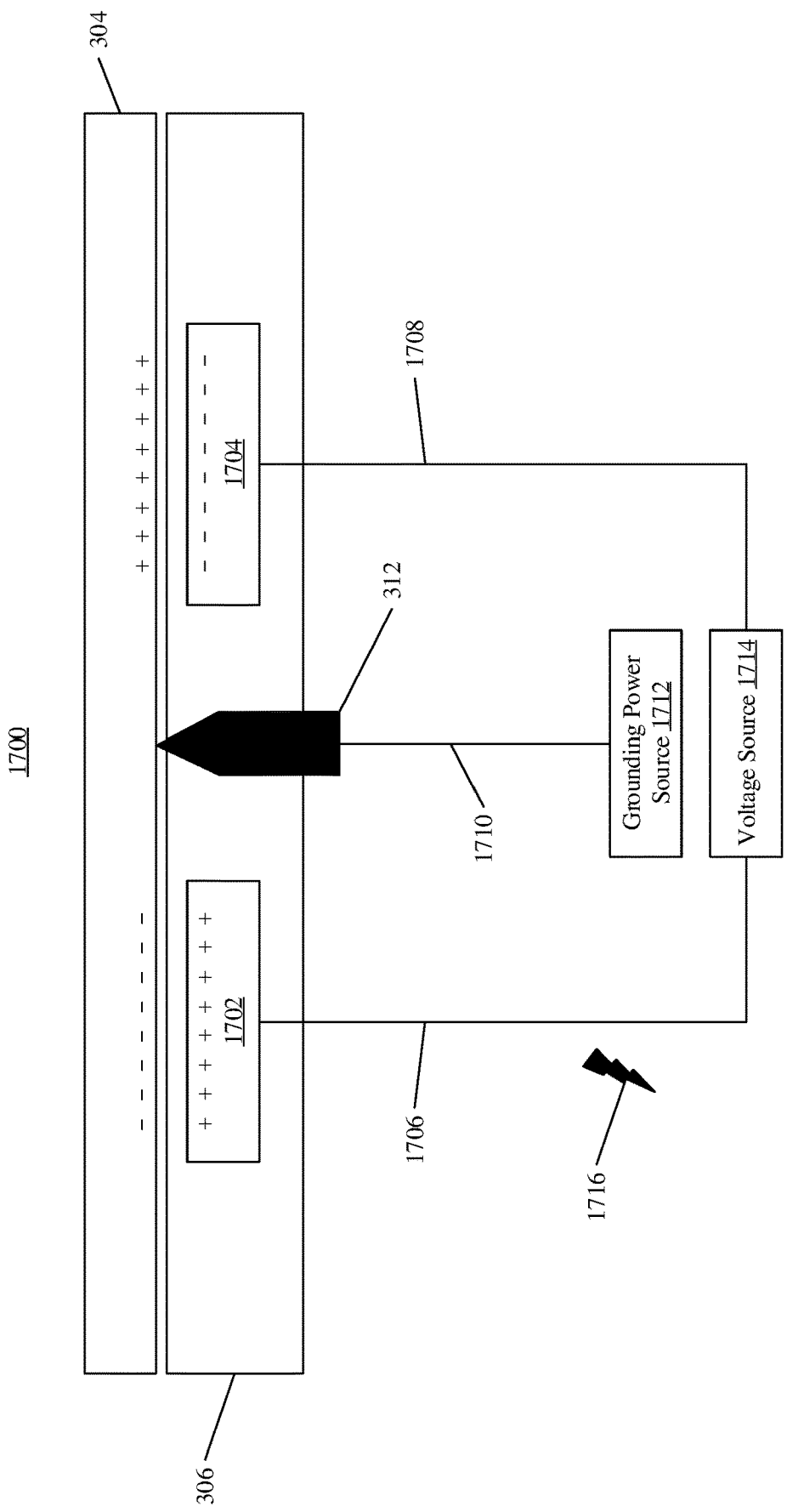
FIG. 17 is an illustration of an example wafer grounding system where a voltage difference occurs instantaneously between an electrode of an electrostatic holder and a grounding pin, consistent with some embodiments of the present disclosure.

By way of example, FIG. 17 is an illustration of an example wafer grounding system 1700 where a voltage difference occurs instantaneously between an electrode of an electrostatic holder and a grounding pin, consistent with some embodiments of the present disclosure. In some embodiments, system 1700 may include the same components as, more components than, or fewer components than system 300 of FIG. 3, system 400 of FIG. 4, system 600 of FIG. 6, system 700 of FIG. 7, system 900 of FIG. 9, system 1200 of FIG. 12, system 1400 of FIGS. 14A-14D, or system 1500 of FIGS. 15A-15D. In FIG. 17, system 1700 includes wafer 304, electrostatic holder 306, one or more grounding pins (including grounding pin 312), a plurality of electrodes (including a first electrode 1702 and a second electrode 1704), first wiring 1706 connected to first electrode 1702, second wiring 1708 connected to second electrode 1704, grounding wiring 1710 connected to grounding pin 312, grounding power source 1712 connected to grounding wiring 1710, and voltage source 1714 connected to first wiring 1706 and second wiring 1708.

For example, first electrode 1702 may bear a positive clamping voltage (represented by positive signs "+" inside first electrode 1702) provided by voltage source 1714 via first wiring 1706, and second electrode 1704 can bear a negative clamping voltage (represented by negative signs "−" inside second electrode 1704) provided by voltage source 1714 via second wiring 1708. The "wiring" or "cabling" described herein may include any number of wires, cables, cords, interfaces, connectors, conductors, insulators, semiconductors, or any component for electric distribution. As illustrated in FIG. 17, first electrode 1702 and second electrode 1704 may be included underneath a top surface of electrostatic holder 306. Electrostatic holder 306 may include a non-conductive dielectric material between wafer 304 and first electrode 1702 and second electrode 1704. It should be noted that, although FIG. 17 shows only one grounding pin and two electrodes, system 1700 may include any number of grounding pins and electrodes.

During operation of system 1700, grounding pin 312 may electrically connect to wafer 304 for providing a grounding signal, as illustrated in FIG. 17. For example, grounding pin 312 may physically touch wafer 304 after penetrating a backside film (not shown in FIG. 17) of wafer 304, such as through the penetration method described herein. As another example, grounding pin 312 may conductively connect to wafer 304 via dielectric breakdown, such as through the electrical zapping method described herein. Grounding power source 1712 may provide the grounding signal and a wafer biasing potential (e.g., a negative voltage potential) to wafer 304 via grounding wiring 1710 and grounding pin 312. For example, grounding power source 1712 may include the function of electric signal generator 314 in system 300 of FIG. 3. Grounding power source 1712 may be a device different from voltage source 1714.

During operation of system 1700, the electrodes of electrostatic holder 306 may be provided with clamping voltages for securing wafer 304 on a top surface of electrostatic holder 306. The clamping voltages may float on the voltage potential provided to wafer 304 by a floating voltage. For example, the floating voltage may be 300 volts, in which first electrode 1702 may be provided with a positive clamping voltage of 30 kilovolts +300 volts, and second electrode 1704 may be provided with a negative clamping voltage of 30 kilovolts −300 volts. Consistent with some embodiments of this disclosure, as illustrated in FIG. 17, first electrode 1702 and second electrode 1704 may be provided with a positive clamping voltage and a negative clamping voltage, respectively. In response to the clamping voltages, opposite charges may form at a bottom surface of wafer 304 (represented by positive signs "+" and negative signs "−" inside wafer 304. If absolute values of the clamping voltages of first electrode 1702 and second electrode 1704 are equal, the incurred opposite charges at the bottom surface of wafer 304 may not affect the total charge carried by wafer 304. For example, wafer 304 may be biased (e.g., with a voltage potential of 30 kilovolts) and maintain electric neutrality (e.g., carrying a total charge of zero), while electric charge distribution inside wafer 304 may be polarized as illustrated in FIG. 17. The opposite charges formed at the bottom surface of wafer 304 may be attracted by the corresponding electrodes, in which wafer 304 may be secured to the top surface of electrostatic holder 306.

In some cases, electric arcing may occur in the circuit of the electrode. For example, as illustrated in FIG. 17, arcing 1716 may occur in first wiring 1706, which may instantaneously cause a voltage difference (e.g., 10 kilovolts) to form between wafer 304 and the electrodes (e.g., first electrode 1702) of electrostatic holder 306. The voltage difference may significantly disturb the clamping voltages, while the biasing voltage potential (e.g., 30 kilovolts) provided to wafer 304 may be unaffected. For example, the clamping voltage of first electrode 1702 may drop from 30 kilovolts +300 volts to 20 kilovolts +300 volts. As another example, if arcing occurs in second wiring 1708 (not shown in FIG. 17), the clamping voltage of second electrode 1704 may also change by the voltage difference. Such an instantaneously formed voltage difference may generate a strong electric field between wafer 304 and the electrodes of electrostatic holder 306 (e.g., first electrode 1702 and second electrode 1704). The strong electric field may attract or repel electric charges in wafer 304 with respect to the top surface of electrostatic holder 306. The attracted or repelled charges may further form residual charges on wafer 304 or electrostatic holder 306.

This disclosure provides apparatuses and systems for preventing formation of the residual charges resulted from instantaneously formed voltage difference between a substrate and an electrostatic holder. Consistent with some embodiments of this disclosure, the apparatuses or systems may include a grounding pin, an electrostatic holder including an electrode inside the electrostatic holder, and an overvoltage protection device electrically coupled (e.g., conductively connected) between the grounding pin and the electrode. The overvoltage protection device may be configured to conduct electricity when a voltage applied on the overvoltage protection device exceeds a threshold voltage and stop conducting electricity when the voltage does not exceed the threshold voltage. In some embodiments, the overvoltage protection device may allow conducting the electricity in a plurality of directions. In some embodiments, the threshold voltage may be an electric characteristic (e.g., a parameter) of the overvoltage protection device. In some embodiments, the threshold voltage may be adjustable (e.g., configurable to have any value in response to different applications of the apparatuses and systems).

In some embodiments, the overvoltage protection device may include at least one of a transient-voltage-suppression (TVS) diode, a Zener diode, a varistor (or referred to as a "voltage dependent resistor"), or a silicon diode for alternating current (SIDAC), or any active crowbar device that becomes conductive under overvoltage and resets to be non-conductive when the overvoltage is removed. For example, if the overvoltage protection device includes a TVS diode, the threshold voltage may be a reverse breakdown voltage of the TVS diode. When a voltage applied on the TVS diode exceeds the reverse breakdown voltage, the TVS diode may operate in an avalanche mode that provides a low-impedance path to ground for the overvoltage. The TVS diode may return to a high-impedance state after the overvoltage subsides below its reverse breakdown voltage.

In some embodiments, the overvoltage protection device may include at least one of a thyristor surge protection device (Trisil), diode for alternating current (DIAC), bidirectional triode thyristor (TRIAC).

Consistent with some embodiments of this disclosure, the apparatuses and systems may include multiple grounding pins, and the electrostatic holder may include multiple electrodes. The apparatuses and systems may include multiple overvoltage protection devices, each of which may be electrically coupled between one grounding pin and one electrode. That is, there is one overvoltage protection device electrically coupled between each grounding pin and each electrode. The multiple overvoltage protection devices may be configured to become conductive under overvoltage and resets to be non-conductive when the overvoltage is removed.

Consistent with some embodiments of this disclosure, the apparatuses and systems may further include a housing. The housing may include a concave surface that surrounds the electrostatic holder and the grounding pin. The housing may further include at least one of a first interface or a second interface. The first interface may be on the concave surface and mate with wiring of the electrode. The second interface may be on the concave surface and mate with wiring of the grounding pin. The overvoltage protection device may be arranged inside or outside the housing.

By using the overvoltage protection device, the above-described apparatuses and systems may instantaneously transfer charges between the electrode and the grounding pin through the overvoltage protection device in a low-impedance state whenever overvoltage is instantaneously formed between the electrode and the grounding pin (e.g., when arcing occurs in the wiring of the electrode). When the overvoltage subsides, the overvoltage protection device may return to a high-impedance state. Such technical solutions may reduce or eliminate the formation of residual charges.

Figure 18:
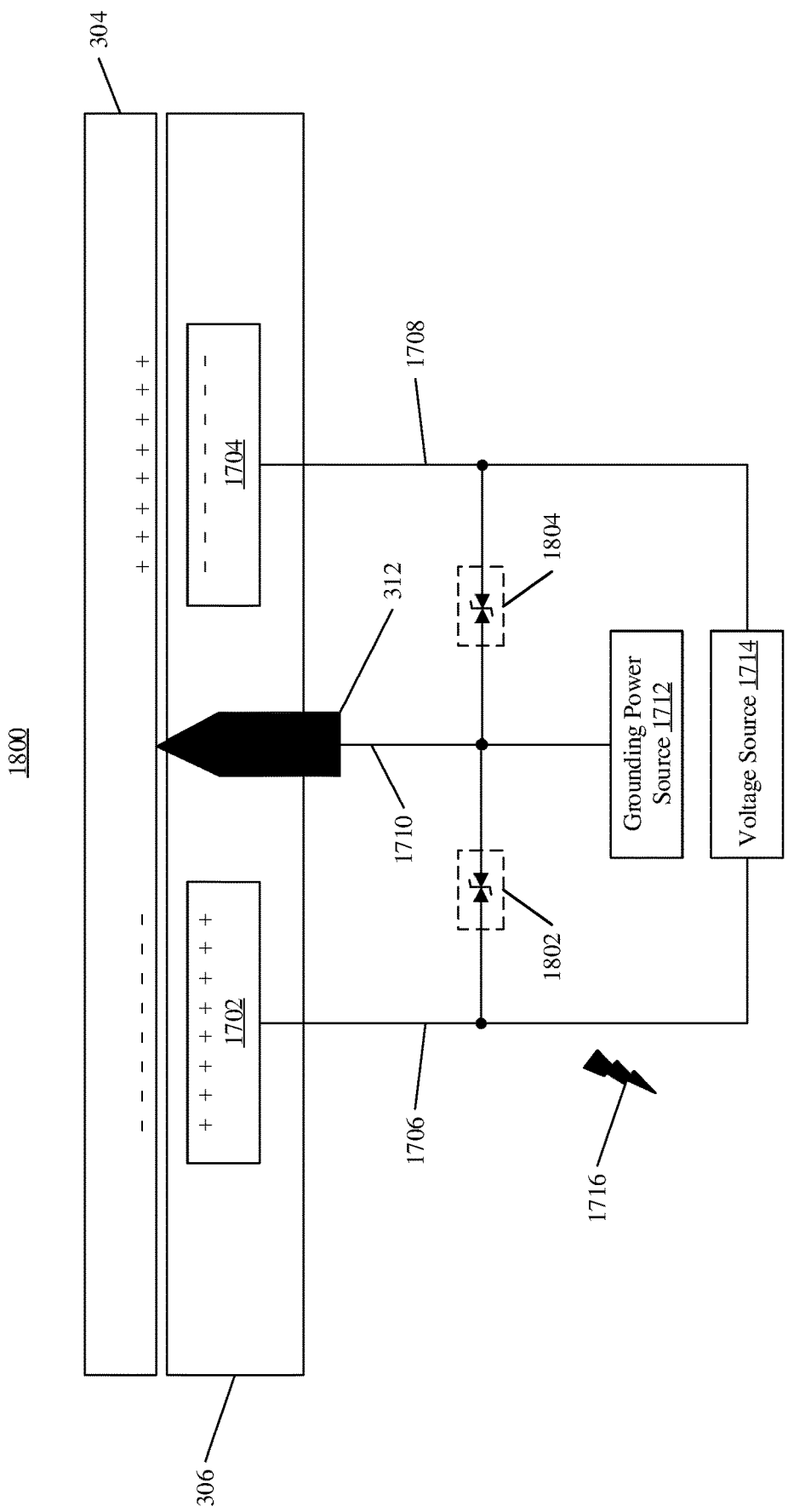
FIG. 18 is an illustration of an example wafer grounding system where voltage differences are prevented from forming between electrodes of an electrostatic holder and a grounding pin, consistent with some embodiments of the present disclosure.

By way of example, FIG. 18 is an illustration of an example wafer grounding system 1800 where voltage differences are prevented from forming between electrodes of an electrostatic holder and a grounding pin, consistent with some embodiments of the present disclosure. System 1800 may be similar to system 1700 in FIG. 17 and includes wafer 304, electrostatic holder 306, grounding pin 312, first electrode 1702, second electrode 1704, first wiring 1706, second wiring 1708, grounding wiring 1710, grounding power source 1712, voltage source 1714, a first overvoltage protection device 1802 electrically coupled between grounding wiring 1710 and first wiring 1706, and a second overvoltage protection device 1804 electrically coupled between grounding wiring 1710 and second wiring 1708.

First overvoltage protection device 1802 and second overvoltage protection device 1804 may shunt excess voltage between grounding wiring 1710 (and essentially wafer 304) and first wiring 1706 and second wiring 1708, respectively. For example, when a voltage difference between grounding wiring 1710 and first wiring 1706 (or second wiring 1708) is below a threshold voltage (e.g., a breakdown voltage), first overvoltage protection device 1802 (or second overvoltage protection device 1804) may be non-conductive (e.g., functioning as a high impedance capacitor) and block electric charges from flowing between grounding wiring 1710 and first wiring 1706 (or second wiring 1708). When the voltage difference between grounding wiring 1710 and first wiring 1706 (or second wiring 1708) is equal to or above the threshold voltage, first overvoltage protection device 1802 (or second overvoltage protection device 1804) may become conductive (e.g., by dramatically dropping its impedance) and allow electric charges to flow between grounding wiring 1710 and first wiring 1706 (or second wiring 1708), which may instantaneously reduce or eliminate the voltage difference. When the voltage difference between grounding wiring 1710 and first wiring 1706 (or second wiring 1708) decreases below the threshold voltage again, first overvoltage protection device 1802 (or second overvoltage protection device 1804) may automatically reset to become non-conductive again.

The first overvoltage protection device 1802 or second overvoltage protection device 1804 may have a direction along which electric charges are allowed to flow. In some embodiments, first overvoltage protection device 1802 or second overvoltage protection device 1804 may be "bidirectional" such that the electric charges are allowed to flow along either direction of them. For example, when an absolute value of the voltage difference between grounding wiring 1710 and first wiring 1706 (or second wiring 1708) is equal to or above the threshold voltage, first overvoltage protection device 1802 (or second overvoltage protection device 1804) may allow electric charges to flow from grounding wiring 1710 to first wiring 1706 (or second wiring 1708) if the voltage of wafer 304 is higher than first electrode 1702 (or second electrode 1704), or to flow from first wiring 1706 (or second wiring 1708) to grounding wiring 1710 if the voltage of wafer 304 is lower than first electrode 1702 (or second electrode 1704).

In some embodiments, first overvoltage protection device 1802 or second overvoltage protection device 1804 may be "unidirectional" such that the electric charges are only allowed to flow along a single direction of them. For example, if first overvoltage protection device 1802 has a conducting direction from grounding wiring 1710 to first wiring 1706, it may allow electric charges to flow from grounding wiring 1710 to first wiring 1706 only when the voltage of wafer 304 exceeds the voltage of first electrode 1702 by the threshold voltage, and may block electric charges to flow from first wiring 1706 to grounding wiring 1710 even when the voltage of first electrode 1702 exceeds the voltage of wafer 304 by the threshold voltage.

Figure 19A:
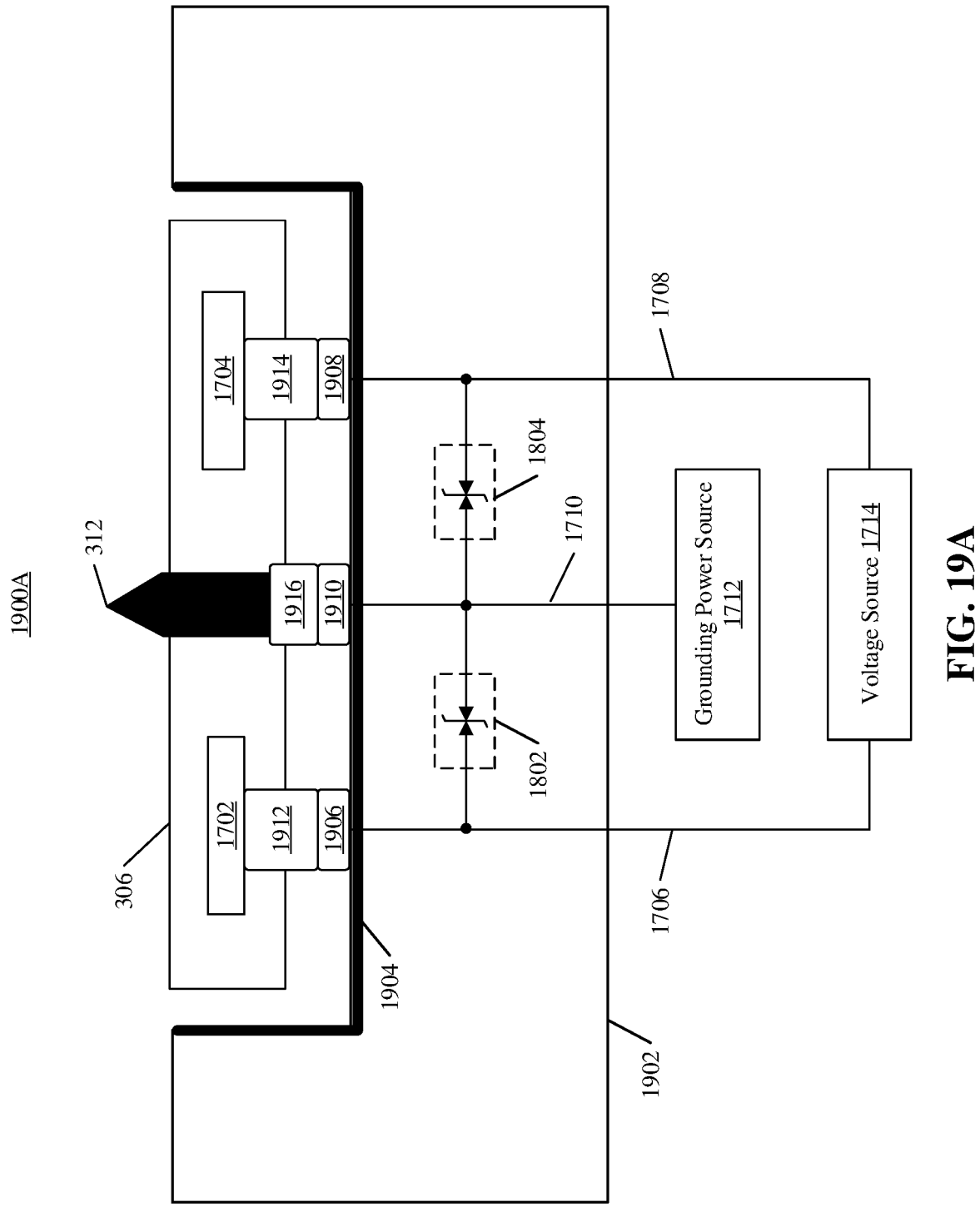
FIGS. 19A-19C are illustration of example wafer grounding systems where voltage differences are prevented from forming between electrodes of an electrostatic holder and a grounding pin, consistent with some embodiments of the present disclosure.
Figure 19B:
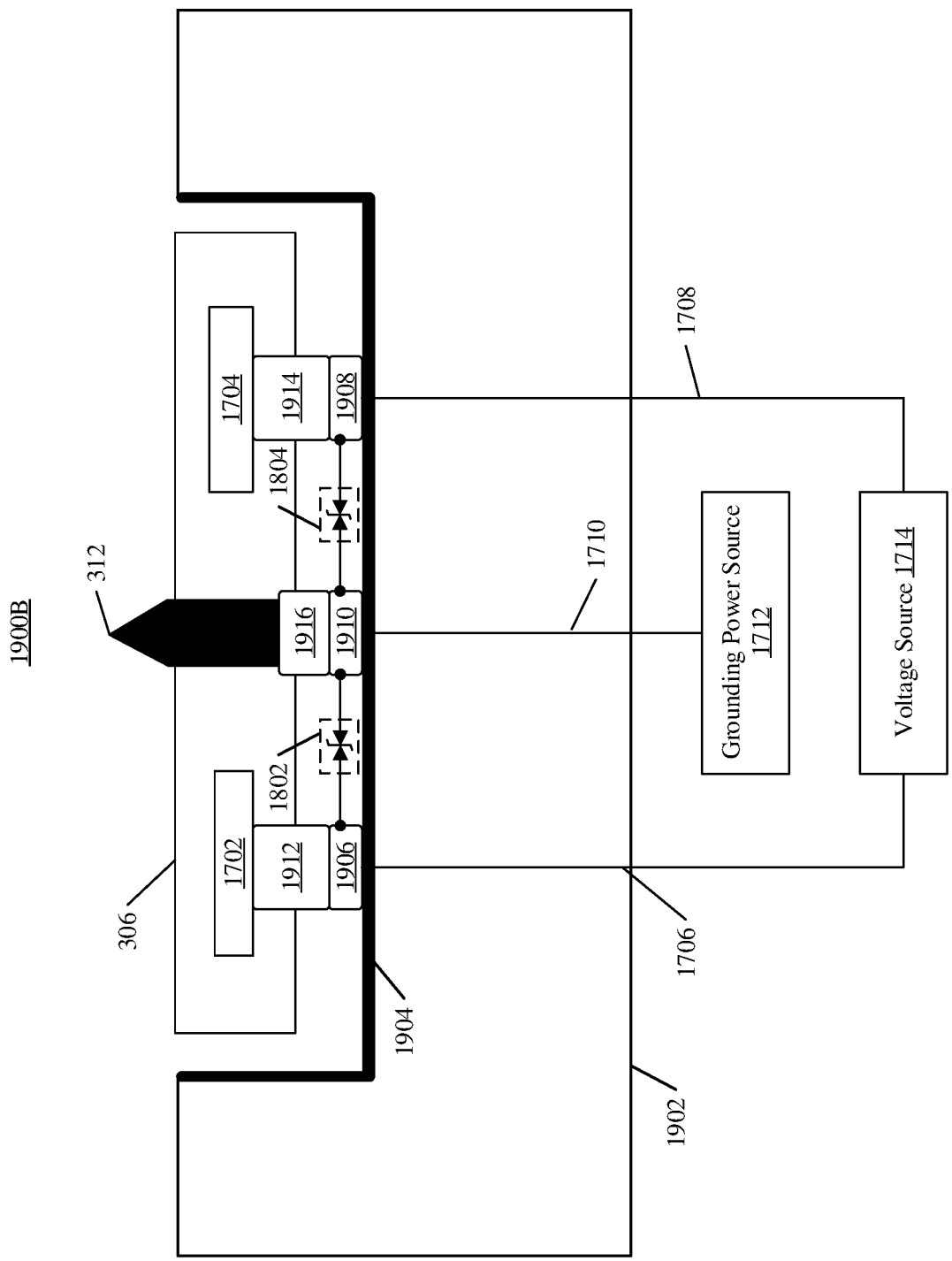
Figure 19C:
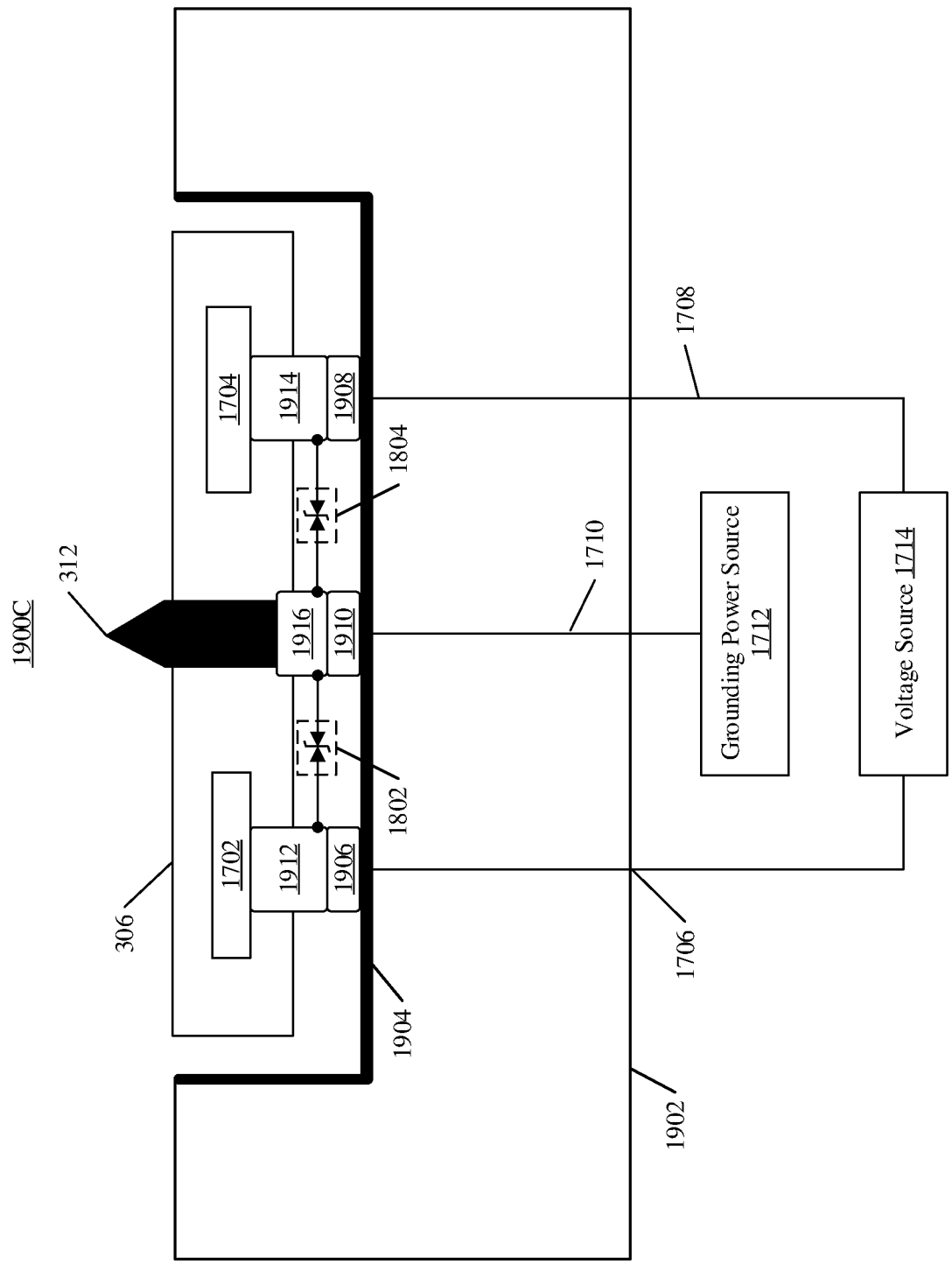

By way of example, FIGS. 19A-19C are illustration of example wafer grounding systems 1900A-1900C where voltage differences are prevented from forming between electrodes of an electrostatic holder and a grounding pin, consistent with some embodiments of the present disclosure. Systems 1900A-1900C may be similar to system 1800 in FIG. 18 and includes electrostatic holder 306, grounding pin 312, first electrode 1702, second electrode 1704, first wiring 1706, second wiring 1708, grounding wiring 1710, grounding power source 1712, voltage source 1714, first overvoltage protection device 1802, second overvoltage protection device 1804. Systems 1900A-1900C further includes a housing 1902 that includes a concave surface 1904 (represented by a bold line in FIGS. 19A-19C), a first interface 1906 on concave surface 1904, a second interface 1908 on concave surface 1904, a grounding interface 1910 on concave surface 1904, first cabling 1912 electrically coupled between first electrode 1702 and first interface 1906, second cabling 1914 electrically coupled between second electrode 1704 and second interface 1908, and grounding cabling 1916 electrically coupled between grounding pin 312 and grounding interface 1910. The "interface" described herein may include a place or a terminal where two or more electric components connect or interact with each other. In some embodiments, the interface described herein may include mating portions (e.g., male or female portions). For example, first interface 1906, second interface 1908, and grounding interface 1910 may include a connector, a plug, a screw, a clamp, a pin, a socket, or any means for electrically coupling two or more electric components.

First wiring 1706 may include first interface 1906 and first cabling 1912. For example, first interface 1906 may mate with one or more parts of first wiring 1706 (e.g., first cabling 1912). Second wiring 1708 may include second interface 1908 and second cabling 1914. For example, second interface 1908 may mate with one or more parts of second wiring 1708 (e.g., second cabling 1914). Grounding wiring 1710 may include grounding interface 1910 and grounding cabling 1916. For example, grounding interface 1910 may mate with one or more parts of grounding wiring 1710 (e.g., grounding cabling 1916).

Concave surface 1904 may surround electric holder 306 and grounding pin 312, as illustrated in FIGS. 19A-19C. It is noted that concave surface 1904 can be of any shape, not limited to the example shape as shown in FIGS. 19A-19C.

Consistent with embodiments of this closure, first overvoltage protection device 1802 can be arranged anywhere as long as it is electrically coupled between grounding pin 312 and first electrode 1702, and second overvoltage protection device 1804 can be arranged anywhere as long as it is electrically coupled between grounding pin 312 and second electrode 1704. By way of example, as illustrated in FIG. 19A, first overvoltage protection device 1802 and second overvoltage protection device 1804 are provided inside housing 1902. As illustrated in FIGS. 19B-19C, first overvoltage protection device 1802 and second overvoltage protection device 1804 are provided outside of housing 1902. For example, in FIG. 19B, first overvoltage protection device 1802 is electrically coupled between first interface 1906 and grounding interface 1910, and second overvoltage protection device 1804 is electrically coupled between second interface 1908 and grounding interface 1910. As another example, in FIG. 19C, first overvoltage protection device 1802 is electrically coupled between first cabling 1912 and grounding cabling 1916, and second overvoltage protection device 1804 is electrically coupled between second cabling 1914 and grounding cabling 1916. In some embodiments, for further lowering their impedance, first overvoltage protection device 1802 and the second overvoltage protection device 1804 may be arranged in locations near first electrode 1702 and second electrode 1704, respectively. It should be noted that this disclosure does not limit the location of first overvoltage protection device 1802 or the location of second overvoltage protection device 1804 to the examples as illustrated and described in FIGS. 19A-19C.

Figure 20:
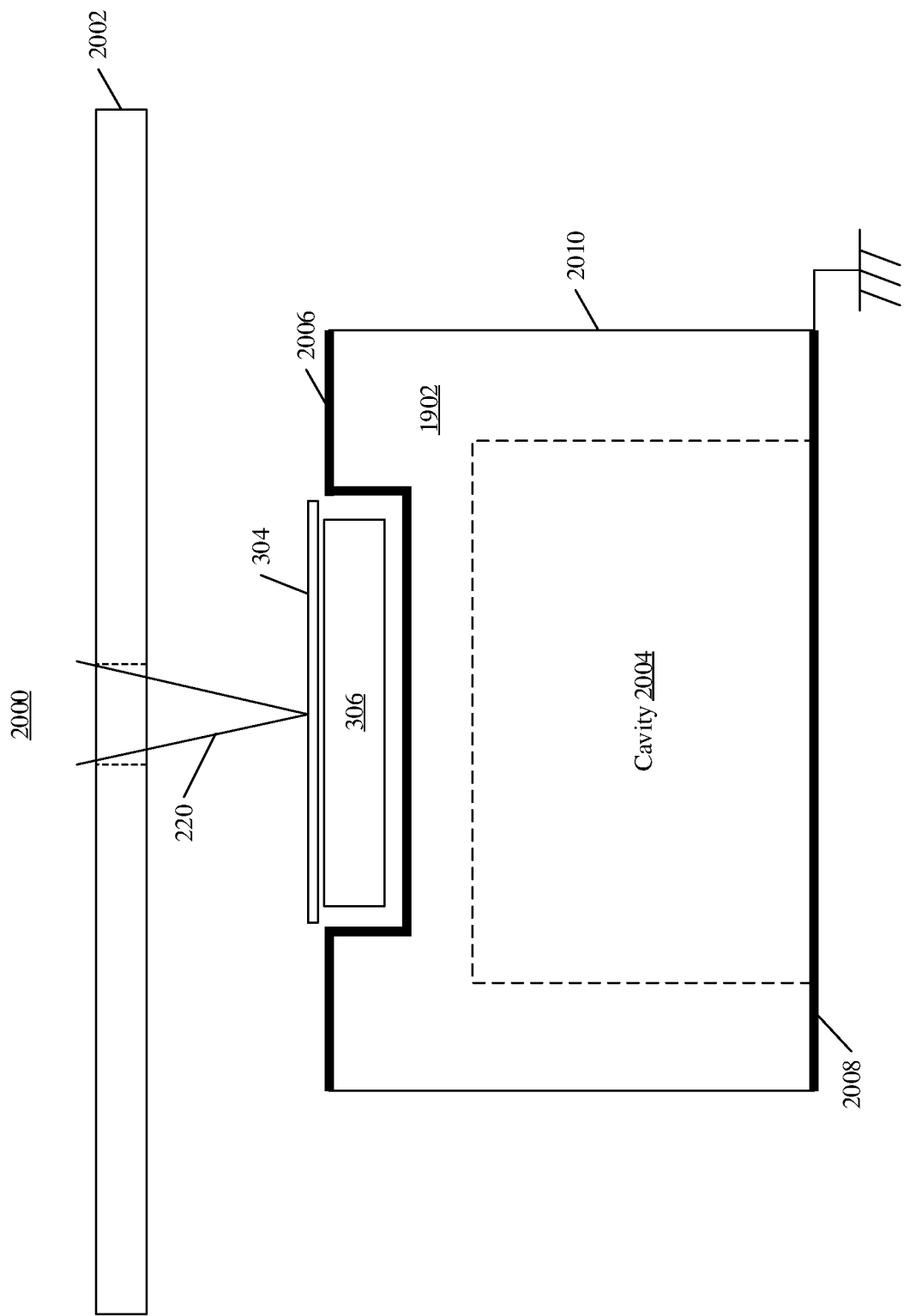
FIG. 20 illustrates a cross-sectional view of an example wafer inspection system where a discharging may occur at a high-voltage part, consistent with some embodiments of the present disclosure.

In some cases, one cause for the instantaneously formed voltage difference between a wafer and an electrostatic holder may be a discharge occurring near the electrostatic holder. By way of example, FIG. 20 illustrates a cross-sectional view of an example wafer inspection system 2000 where a discharging may occur at a high-voltage part, consistent with some embodiments of the present disclosure. In FIG. 20, system 2000 includes electrostatic holder 306, wafer 304 secured on top of electrostatic holder 306, housing 1902 that supports electrostatic holder 306, and primary electron beam 220 that projects onto wafer 304 through a hole (represented by internal dashed lines) of a shielding plate 2002. Housing 1902 includes a cavity 2004 that may be used to place a stage (e.g., motorized sample stage 201 as illustrated and described in FIG. 2). Electrostatic holder 306 may be mounted to the stage and may be controlled to move by the stage.

Housing 1902 includes a top surface 2006 (represented by a bold line), a bottom surface 2008 (represented by a bold line), and a side surface 2010. In some embodiments, side surface 210 may also be used as a mirror for positioning purposes. For inspection operations, top surface 2006 and wafer 304 may be biased by a high voltage (e.g., −30 kilovolts). To avoid deflection of primary electron beam 220, shielding plate 2002 may also be biased by the biasing voltage (e.g., −30 kilovolts). Bottom surface 2008 may be grounded. In system 2000, top surface 2006 may be referred to as a high-voltage part, and bottom surface 2008 may be referred to as a grounded part. An isolator layer may be applied on side surface 2010 for isolating top surface 2006 and bottom surface 2008. For such a reason, side surface 2010 may also be referred to as isolation surface 2010 in this disclosure.

In an ideal case, there is no electric field below bottom surface 2008 because of its grounding or above top surface 2006 because of shielding plate 2002, and an electric field would only exist between top surface 2006 and bottom surface 2008. In such an ideal case, the high voltage of top surface 2006 may drop along the isolation surface 2010 from top surface 2006 to bottom surface 2008.

However, in practical scenarios, when the electric field near top surface 2006 is overly strong, field emission may occur between top surface 2006 and isolation surface 2010. Because top surface 2006 is conductive and connected to a power supply, it may essentially function as a charge source that can supply a large amount of charges (e.g., electrons). The charges generated due to the field emission (referred to as "field-emission charges") may break away from top surface 2006 and arrive at isolation surface 2010. If the landing energies of the field-emission charges are sufficiently high, they may release gas molecules adhered to isolation surface 2010, and may further trigger an avalanche effect. The avalanche effect may cause a large electric current to arc between top surface 2006 and isolation surface 2010, discharging a large amount of charges into the environment near electrostatic holder 306. Such discharging may disturb the clamping voltages of electrostatic holder 306 and cause residual charges to form thereon, which may cause the wafer sticking problem. Further, such discharging may attract undesired particles (e.g., dusts) from the environment, which may interfere with primary electron beam 220 for wafer inspection.

The high voltage of top surface 2006 (i.e., the biasing voltage) may be switched on and off in some situations, such as for replacing wafers or shutting down system 2000 for service. In those situations, to prevent the above-described discharging, the ramp-up or ramp-down of the high voltage may be limited to a low speed, which may restrict the throughput of wafer inspection of system 2000, especially when system 2000 is a multi-beam inspection system.

Consistent with some embodiments of this disclosure, apparatuses and systems are provided for fast ramping of high voltage without causing discharging. Such an apparatus may include an isolator arranged between a high-voltage part of the apparatus and a grounded part of the apparatus. The high-voltage part may be applied with a high voltage. The grounded part may be grounded by electrically connected to the ground. The insulator may insulate the high-voltage part and the grounded part. The apparatus may also include a first electrode electrically coupled to the high-voltage part, and a second electrode electrically coupled to the grounded part and non-conductive to the first electrode. The apparatus may further include a dielectric layer covering the first electrode and the second electrode over the isolator. The "covering," as used herein, may include enclosing, enveloping, burying, wrapping, embedding, overlaying, coating, or any action of insulating or isolating an object from another object or environment. For example, the dielectric layer may be made of a material of glass, ceramic, or any material having a dielectric constant of at least $3 \times 10^{-11}$ farads per meter.

In some embodiments, the high-voltage part may include a first surface (e.g., a plate anode). The grounded part may include a second surface (e.g., a plate cathode) parallel to the first surface. The isolator may include a vertical surface (e.g., a side wall) between the first surface and the second surface.

In some embodiments, the dielectric layer may be adhered to a surface of the isolator. In such a case, the first electrode and the second electrode may be covered between the dielectric layer and the surface of the isolator. For example, a layer of glass or ceramic may be glued to the surface of the insulator, in which the first electrode and the second electrode may be glued between the layer and the surface.

In some embodiments, the isolator may include the dielectric layer. In such a case, the first electrode and the second electrode may be embedded inside the isolator. For example, the dielectric layer may be a homogeneous part of the insulator. By way of example, the first electrode and the second electrode may be embedded into clay and co-fired into a single ceramic body.

In some embodiments, the isolator may embed the first electrode and the second electrode, and an additional dielectric layer may be adhered to the surface of the isolator. It should be noted that covering the first electrode and the second electrode over the isolator may be implemented in other manners, and this disclosure does not limit those manners to the above-described example embodiments.

Consistent with some embodiments of this disclosure, the apparatus may further include a first conductive part and a second conductive part. The first conductive part may be electrically coupled to the high-voltage part of the apparatus and capacitively coupled to the first electrode. For example, the first conductive part may be a plate extending from the high-voltage part and parallel to the first electrode. The second conductive part may be electrically coupled to the grounded part of the apparatus and capacitively coupled to the second electrode. For example, the second conductive part may be a plate extending from the grounded part and parallel to the second electrode.

The dielectric layer may contribute to form a capacitor on the surface of the isolator. For example, the first conductive part, the dielectric layer, and the first electrode may form a first capacitor. As another example, the second conductive part, the dielectric layer, and the second electrode may form a second capacitor. The capacitor may mitigate capacitive couplings between the apparatus and objects (e.g., neighboring components of the apparatus or building structures) in its surrounding environment for preventing formation of concentrated electric fields that may cause field emissions. The larger capacitance the capacitor has, the better mitigation it can provide. If the capacitance of the capacitor is sufficiently high, its high capacitance may be deemed as effectively placing the apparatus into a vacuum, where the impact of the environmental capacitive couplings may be greatly mitigated or even eliminated.

The capacitance of a capacitor may be proportional to an overlap area of its terminals and be inversely proportional to a distance between the two terminals. That is, the capacitance of the capacitor may be proportional to a ratio of the overlap area over the distance (referred to as an "overlap-to-distance ratio"). For example, the first capacitor may have the first conducting part and the first electrode as its two terminals, which are distanced by a thickness of the dielectric layer and having a first overlap area. The second capacitor may have the second conducting part and the second electrode as its two terminals, which are distanced by the thickness of the dielectric layer and having a second overlap area.

In some embodiments, a thickness of the dielectric layer may be equal to or less than one tenth (i.e., $1/10$) of the smaller of a first overlap area between the first conductive part and the first electrode and a second overlap area between the second conductive part and the second electrode. In such a case, both the first capacitor and the second capacitor may have an overlap-to-distance ratio of at least 10, which may contribute to increase their capacitance.

In some embodiments, the thickness of the dielectric layer may be equal to or less than one fiftieth (e.g., $1/50$) of a distance between a surface of the dielectric layer and an object capacitively coupled to the apparatus and not belonging to the apparatus. For example, the object may be an object in the environment surrounding the apparatus. The object and the first conductive part (or the second conductive part) may form an effective capacitor, with the object and the first conductive part (or the second conductive part) being its two terminals and all the materials (e.g., air) between them being the dielectric material. In such a case, the capacitance of the first capacitor (or the second capacitor) may exceed the capacitance of the effective capacitor because the terminal-to-terminal distance of the first capacitor (or the second capacitor) is much smaller (e.g., at most $1/50$) than the terminal-to-terminal distance of the effective capacitor, which may contribute to mitigate the capacitive coupling between the object and the apparatus.

Consistent with some embodiments of this disclosure, the apparatus may further include a housing. The housing may be configured to enclose a stage of a wafer inspection system. The high-voltage part may include a top surface of the housing. The grounded part may include a bottom surface of the housing. The isolator may include a wall of the housing. For example, the housing may be used to support an electrostatic holder besides enclosing the stage.

Consistent with some embodiments of this disclosure, the apparatus may include multiple electrodes covered by the dielectric layer over the isolator. For example, the number of the covered electrodes may depend on a value of the high voltage. In some embodiments, the number of the covered electrodes may be a ratio of the value of the high voltage. By doing so, a surface voltage of the isolator may be configured during the ramp-up or ramp-down of the high voltage.

Figure 21:
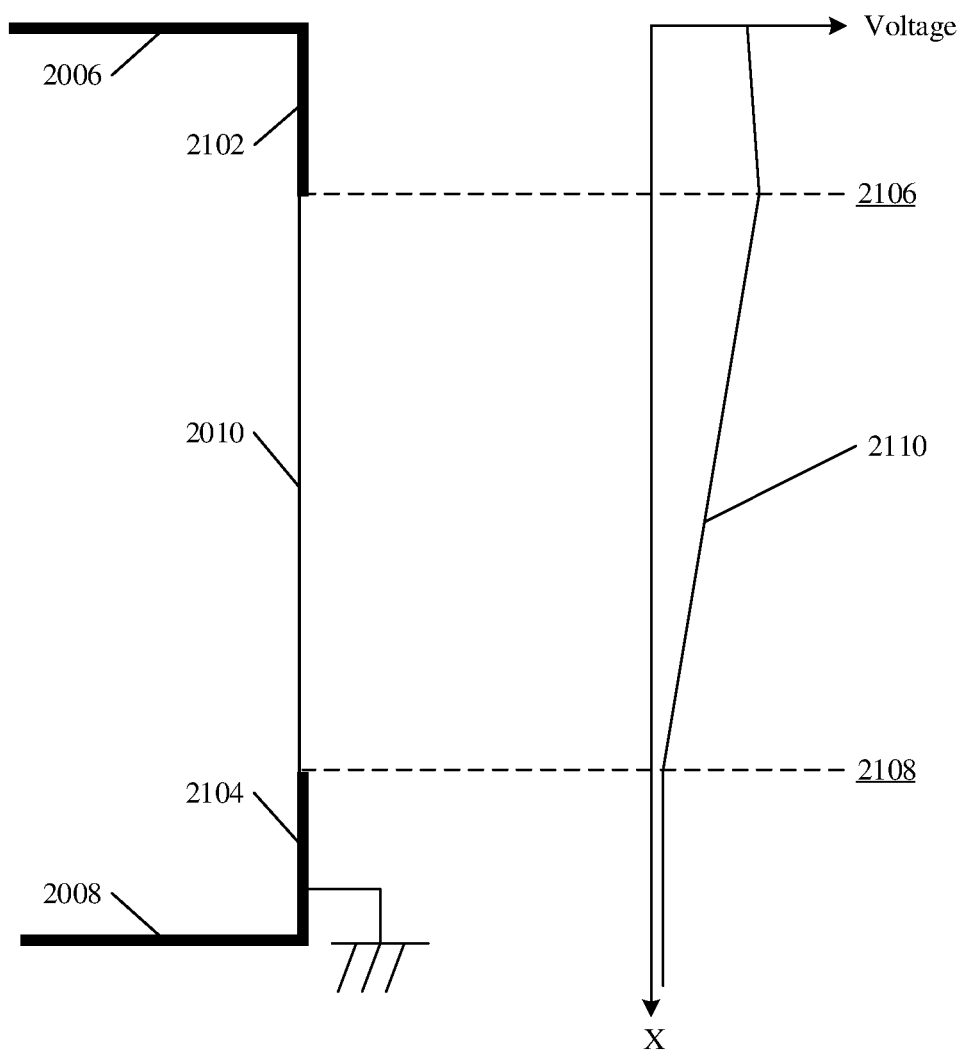
FIG. 21 is an illustration of an example apparatus for fast ramping of high voltage without causing discharging, consistent with some embodiments of the present disclosure.

By way of example, FIG. 21 is an illustration of an example apparatus 2100 for fast ramping of high voltage without causing discharging, consistent with some embodiments of the present disclosure. Apparatus 2100 may include some components of system 2000 in FIG. 20, including top surface 2006, bottom surface 2008, and isolation surface 2010. In FIG. 20, a high-voltage part of apparatus 2100 may include top surface 2006, and a grounded part of apparatus 2100 may include bottom surface 2008. Top surface 2006 may be parallel to bottom surface 2008. An isolator of apparatus 2100 may include isolation surface 2010 that is perpendicular to top surface 2006 and bottom surface 2008. As shown in FIG. 21, isolation surface 2010 may function as an isolator between top surface 2006 and bottom surface 2008 of apparatus 2100. Apparatus 2100 further includes a first electrode 2102 electrically coupled to top surface 2006 and a second electrode 2104 electrically coupled to bottom surface 2008 and non-conductive to first electrode 2102.

First electrode 2102 and second electrode 2104 may be fixed on isolation surface 2010. By introducing first electrode 2102 and second electrode 2104 on isolation surface 2010, a voltage difference between top surface 2006 and bottom surface 2008 may drop at a constant rate. For example, as shown in FIG. 21, the value of the voltage difference between point 2106 and point 2108 decreases along the x-direction and reaches substantially zero potential (because second electrode 2104 is grounded), represented by a voltage curve 2110. Point 2106 may be at an end of first electrode 2102, and point 2108 may be at an end of second electrode 2104. As shown in FIG. 21, voltage curve 2110 has a constant slope with no abrupt change. In such a case, the electric field between point 2106 and point 2108 may have a constant strength, and the gradient of the electric field may be smooth, which may prevent formation of concentrated electric fields that may cause field emissions.

FIG. 21 shows an ideal case where no impact of the environment surrounding apparatus 2100 is considered. In practical scenarios, environmental objects or even air may interact with apparatus 2100, such as via capacitive coupling. For example, if the environment includes conductive objects (e.g., neighboring components of system 2000 of FIG. 20 or building structures), capacitance may exist between those objects and isolation surface 2010, first electrode 2102, or second electrode 2104, which may be represented as one or more effective capacitors.

Figure 22:
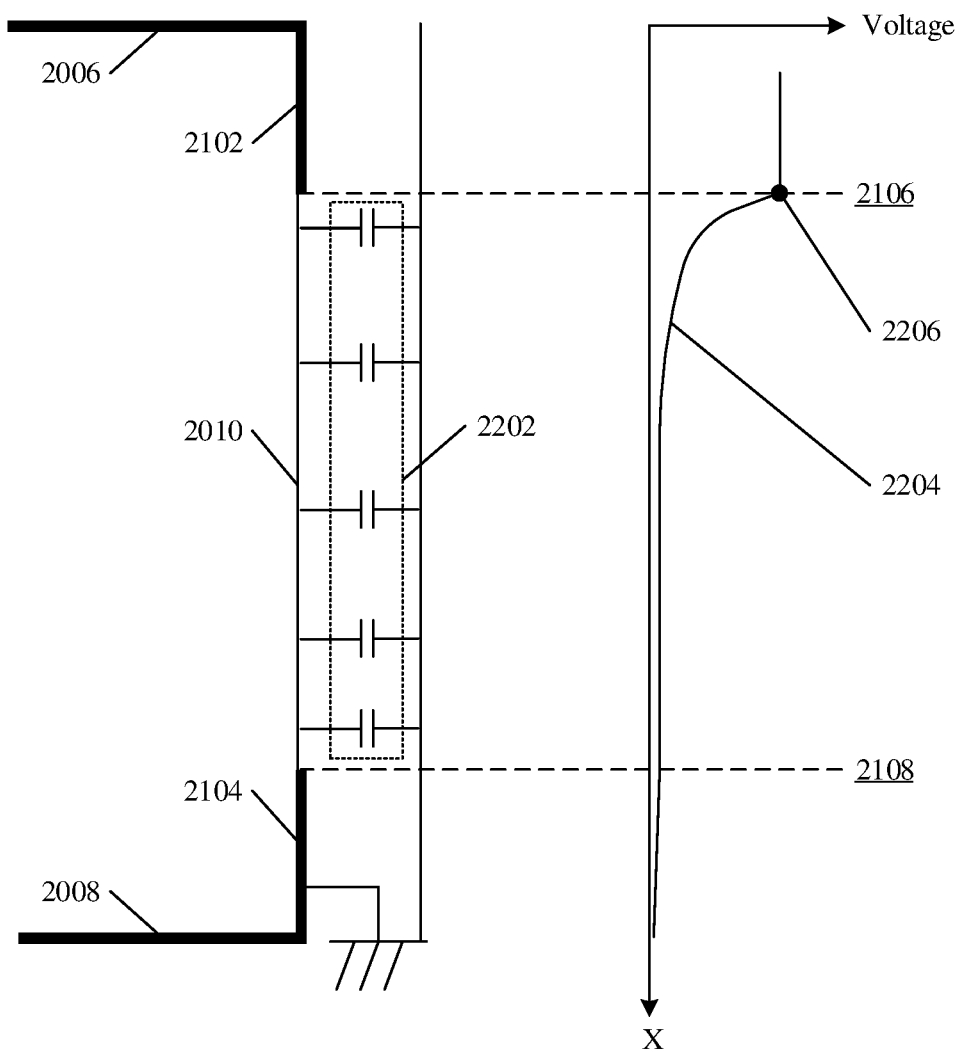
FIG. 22 is an illustration of another example apparatus for fast ramping of high voltage without causing discharging, consistent with some embodiments of the present disclosure.

By way of example, FIG. 22 is an illustration of an example apparatus 2200 for fast ramping of high voltage without causing discharging, consistent with some embodiments of the present disclosure. FIG. 22 shows a practical case where environmental impact on apparatus 2200 is considered. Apparatus 2200 may be similar to apparatus 2100 and include top surface 2006, bottom surface 2008, isolation surface 2010, first electrode 2102, and second electrode 2104. The value of the voltage difference between point 2106 and point 2108 decreases along the x-direction and reaches substantially zero potential (because second electrode 2104 is grounded), represented by a voltage curve 2204.

Apparatus 2200 further includes an effective capacitor set 2202 that includes one or more effective capacitors representing formed capacitance between apparatus 2200 and objects in its surrounding environment. The effective capacitors merely represent capacitive couplings and are not actual capacitors. Under the influence of effective capacitor set 2202, compared with voltage curve 2110 in FIG. 21, voltage curve 2204 may be changed to a different shape and includes an abrupt-change point 2206 representing that the electric field near point 2106 may be concentrated and have a high strength. In such as case, there is a risk that field emission may occur near point 2106.

Figure 23:
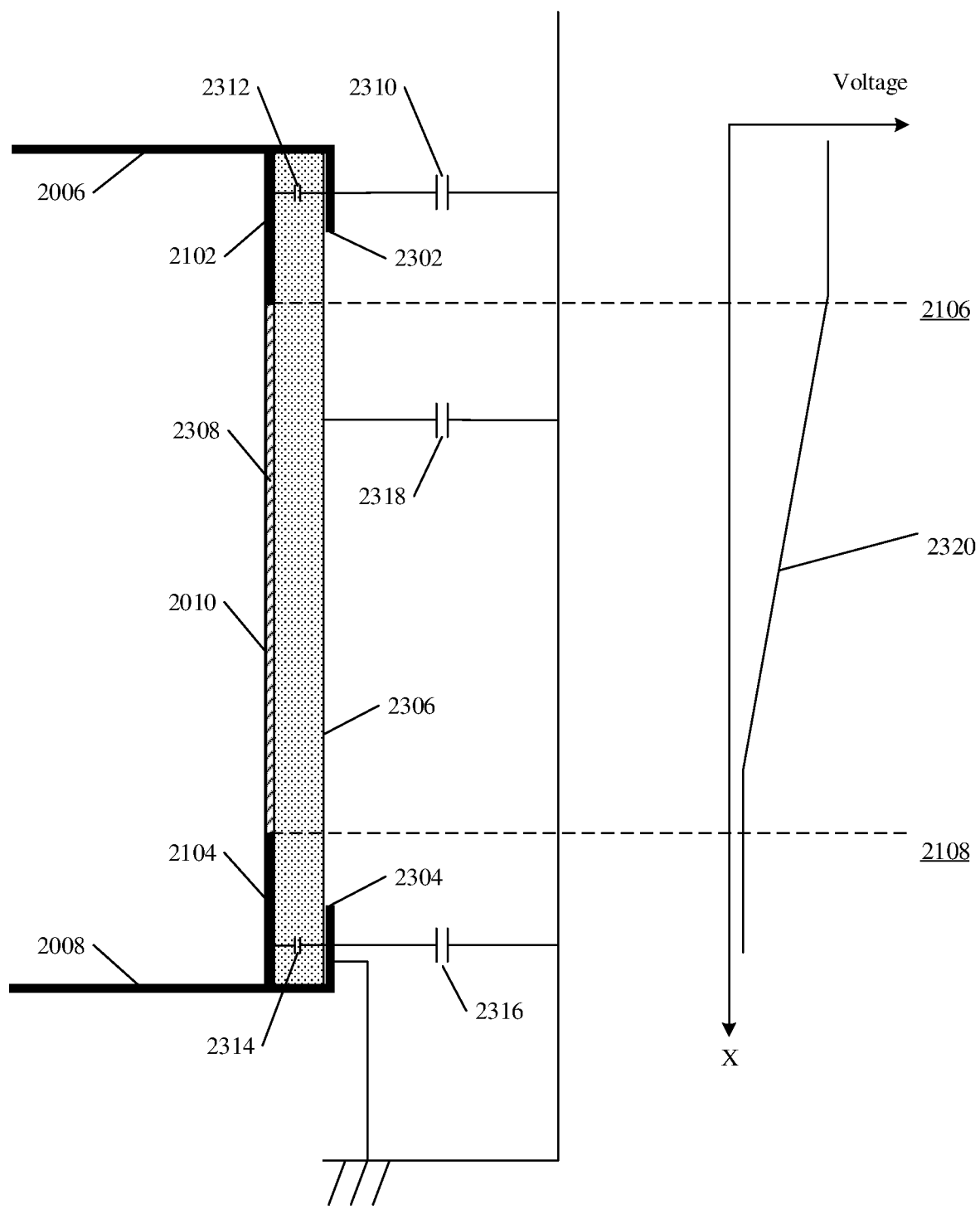
FIG. 23 is an illustration of yet another example apparatus for fast ramping of high voltage without causing discharging, consistent with some embodiments of the present disclosure.

By way of example, FIG. 23 is an illustration of an example apparatus 2300 for fast ramping of high voltage without causing discharging, consistent with some embodiments of the present disclosure. Apparatus 2300 may be similar to apparatus 2100 and include top surface 2006, bottom surface 2008, isolation surface 2010, first electrode 2102, second electrode 2104. To mitigate or eliminate the impact of the capacitive couplings from the environment (e.g., as illustrated in FIG. 22), apparatus 2300 also includes a dielectric layer 2306 (represented as a dotted area) covering first electrode 2102 and second electrode 2104 over isolation surface 2010. In FIG. 23, dielectric layer 2306 may be adhered (e.g., via glue 2308 represented as a shaded area) to isolation surface 2010. In FIG. 23, first electrode 2102 and second electrode 2104 are covered between dielectric layer 2306 and isolation surface 2010. For example, dielectric layer 2306 may be a layer of glass or ceramic.

Similar to apparatus 2200 in FIG. 22, apparatus 2300 may be capacitively coupled to objects of its surrounding environment. FIG. 23 illustrates three effective capacitors that reflect such capacitive couplings, including a first effective capacitor 2310 formed between the environment and first conductive part 2302, a second effective capacitor 2316 formed between the environment and second conductive part 2304, and a third effective capacitor 2318 formed between the environment and dielectric layer 2306.

Apparatus 2300 further includes a first conductive part 2302 and a second conductive part 2304. First conductive part 2302 may be electrically coupled to top surface 2006 and capacitively coupled to first electrode 2102. For example, as illustrated in FIG. 23, first conductive part 2302 may be a plate extending from top surface 2006 and parallel to first electrode 2102. First conductive part 2302, first electrode 2102, and the material of dielectric layer 2306 between them may form a first capacitor 2312. Second conductive part 2304 may be electrically coupled to bottom surface 2008 and capacitively coupled to second electrode 2104. For example, as illustrated in FIG. 23, second conductive part 2304 may be a plate extending from bottom surface 2008 and parallel to second electrode 2104. Second conductive part 2304, second electrode 2104, and the material of dielectric layer 2306 between them may form a second capacitor 2314. First capacitor 2312 and second capacitor 2314 may mitigate capacitive couplings between the apparatus and the environment (e.g., as represented by first effective capacitor 2310, second effective capacitor 2316, and third effective capacitor 2318) for preventing formation of concentrated electric fields that may cause field emissions.

One way to effectively mitigate the capacitive couplings between apparatus 2300 and its surrounding environment is to increase the capacitance of first capacitor 2312 and second capacitor 2314 to a level much higher than that of those capacitive couplings (e.g., capacitance of first effective capacitor 2310, second effective capacitor 2316, and third effective capacitor 2318). For example, first capacitor 2312 may have first conductive part 2302 and first electrode 2102 as its two terminals, which are distanced by a thickness of dielectric layer 2306 and having a first overlap area. Second capacitor 2314 may have second conductive part 2304 and second electrode 2104 as its two terminals, which are distanced by the thickness of dielectric layer 2306 and having a second overlap area. Because the capacitance of a capacitor is proportional to its overlap-to-distance ratio, apparatus may be configured such that first capacitor 2312 and second capacitor 2314 have high overlap-to-distance ratios. In some embodiments, the thickness of dielectric layer 2306 may be equal to or less than one tenth (i.e., 1/10) of the smaller of the first overlap area of first capacitor 2312 and the second overlap area of second capacitor 2314. In such a case, both first capacitor 2312 and second capacitor 2314 may have an overlap-to-distance ratio of at least 10, which may contribute to increase their capacitance.

To increase the capacitance of first capacitor 2312 and second capacitor 2314 to a level much higher than that of those capacitive couplings, apparatus 2300 may also be configured such that the overlap-to-distance ratios of first capacitor 2312 and second capacitor 2314 are both higher than the overlap-to-distance ratios of first effective capacitor 2310, second effective capacitor 2316, and third effective capacitor 2318. In some embodiments, the thickness of dielectric layer 2306 may be equal to or less than one fiftieth (e.g., 1/50) of a distance between a surface of dielectric layer 2306 and an object capacitively coupled to apparatus 2300 and not belonging to apparatus 2300. For example, the object may be the closest object in the environment surrounding apparatus 2300. In such a case, the capacitance of both first capacitor 2312 and second capacitor 2314 may exceed the capacitance of first effective capacitor 2310, second effective capacitor 2316, and third effective capacitor 2318 because the terminal-to-terminal distances of both first capacitor 2312 and second capacitor 2314 are much smaller (e.g., at most 1/50) than the terminal-to-terminal distances of first effective capacitor 2310, second effective capacitor 2316, and third effective capacitor 2318, which may contribute to mitigate the capacitive couplings between apparatus 2300 and its environment.

As shown in FIG. 23, the value of the voltage difference between point 2106 and point 2108 decreases along the x-direction and reaches substantially zero potential (because second electrode 2104 is grounded), represented by a voltage curve 2320. Compared with voltage curve 2204 in FIG. 23, voltage curve 2320 has a smooth slope with no abrupt change. In such a case, no concentrated electric field may be formed between point 2106 and point 2108, and thus field emission may be prevented.

Figure 24:
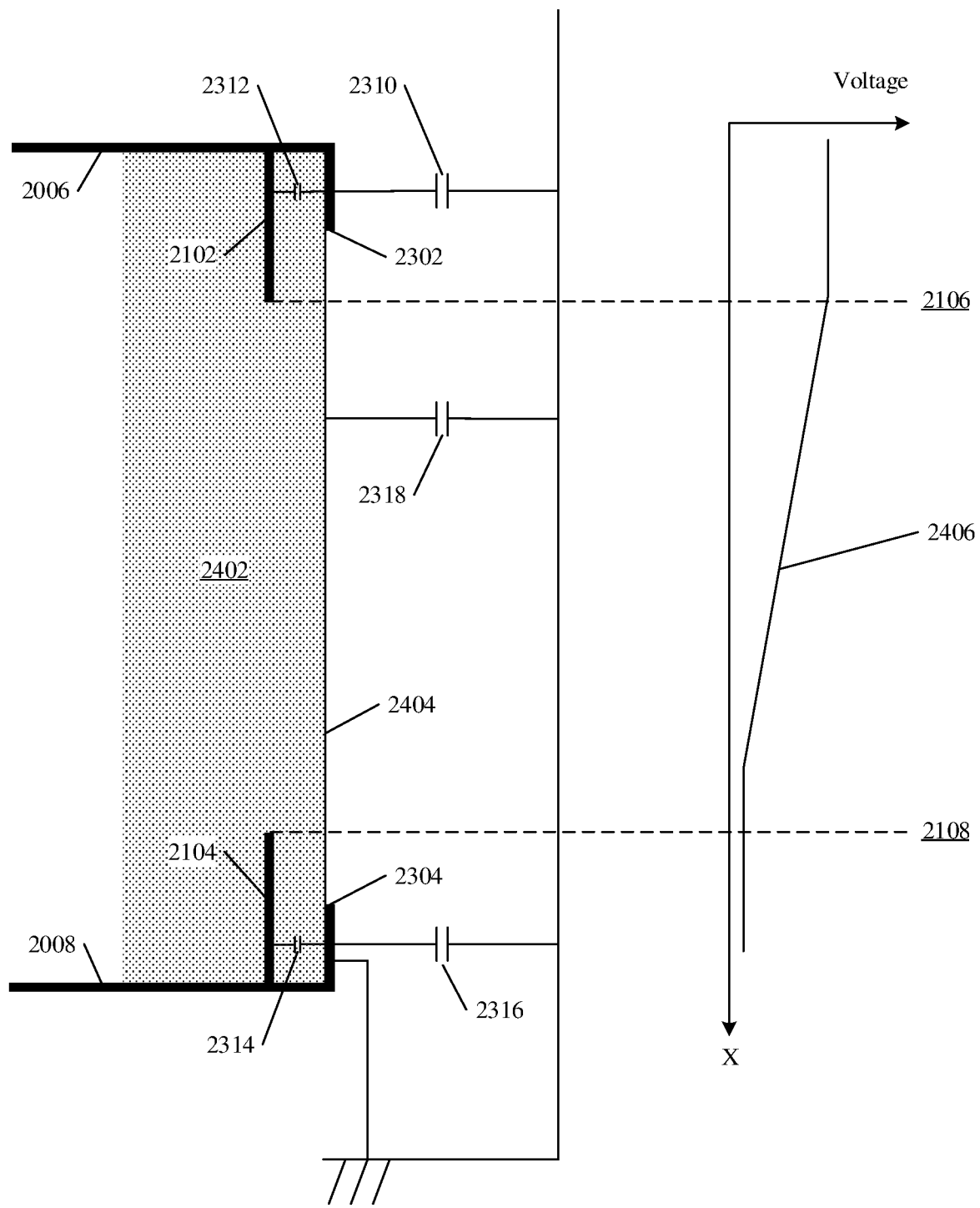
FIG. 24 is an illustration of yet another example apparatus for fast ramping of high voltage without causing discharging, consistent with some embodiments of the present disclosure.

In some embodiments, the dielectric layer may embed first electrode 2102 and second electrode 2104 internally. By way of example, FIG. 24 is an illustration of an example apparatus 2400 for fast ramping of high voltage without causing discharging, consistent with some embodiments of the present disclosure. Apparatus 2400 may be similar to apparatus 2300 in FIG. 23 and include top surface 2006, bottom surface 2008, first electrode 2102, second electrode 2104, first conductive part 2302, second conductive part 2304, first capacitor 2312, second capacitor 2314, first effective capacitor 2310, second effective capacitor 2316, and third effective capacitor 2318. Contrasting to apparatus 2300, apparatus 2400 does not include isolation surface 2010, dielectric layer 2306, or glue 2308. Instead, apparatus 2400 includes isolator 2402 that is a single dielectric body (e.g., a ceramic body or a glass body), as represented by a dotted area in FIG. 24.

Isolator 2402 may include a surface layer 2404, which may be deemed as equivalent to dielectric layer 2306 in apparatus 2300. As illustrated in FIG. 24, first electrode 2102 and second electrode 2104 may be embedded inside isolator 2402. As an example, to manufacture isolator 2402, first electrode 2102 and second electrode 2104 may be embedded into clay, and the clay that embeds the electrodes may be co-fired into a single ceramic body.

As shown in FIG. 24, the value of the voltage difference between point 2106 and point 2108 decreases along the x-direction and reaches substantially zero potential (because second electrode 2104 is grounded), represented by a voltage curve 2406 that has a smooth slope with no abrupt change. Voltage curve 2406 may be similar to voltage curve 2204 in FIG. 23. In such a case, no concentrated electric field may be formed between point 2106 and point 2108, and thus field emission may be prevented.

Figure 25:
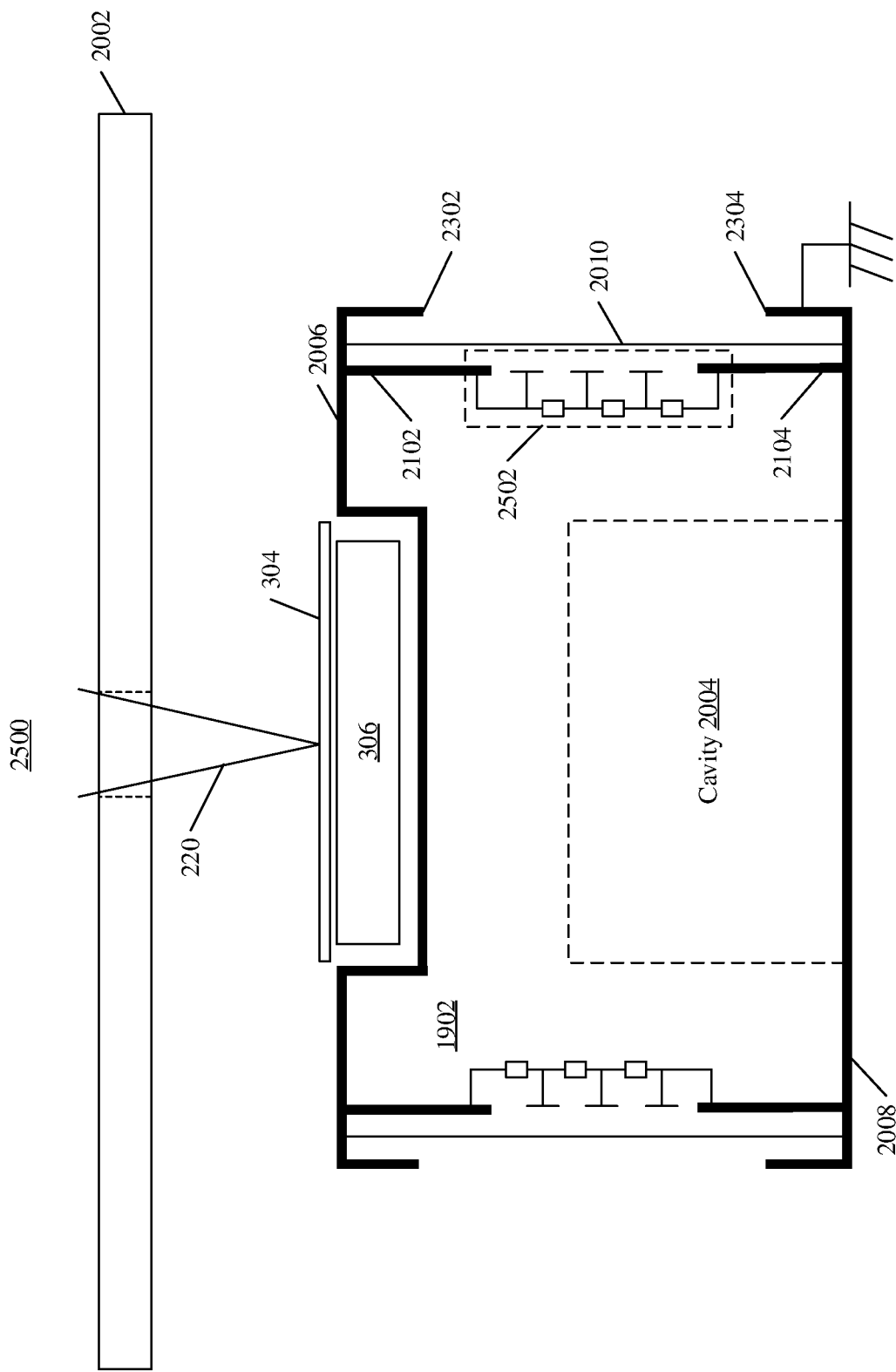
FIG. 25 a cross-sectional view of an example wafer inspection system for fast ramping of high voltage without causing discharging, consistent with some embodiments of the present disclosure.

By way of example, FIG. 25 is a cross-sectional view of an example wafer inspection system 2500 for fast ramping of high voltage without causing discharging, consistent with some embodiments of the present disclosure. System 2500 may be similar to system 2000 in FIG. 20, apparatus 2300 in FIG. 23, and apparatus 2400 in FIG. 24. System 2500 includes electrostatic holder 306, wafer 304, housing 1902, primary electron beam 220, shielding plate 2002, cavity 2004, top surface 2006, bottom surface 2008, and isolation surface 2010. Contrasting to system 2000, system 2500 further includes first electrode 2102, second electrode 2104, first conductive part 2302, second conductive part 2304, and isolator 2502. In some embodiments, isolator 2502 may be implemented similar to dielectric layer 2306 in FIG. 23. In some embodiments, isolator 2502 may be implemented similar to isolator 2402 in FIG. 24. In FIG. 25, isolator 2502 is illustrated as a set of symbols between first electrode 2102 and second electrode 2104, which represent the effective capacitive couplings and resistive couplings incurred by the dielectric material of isolator 2502.

As illustrated and described in association with FIGS. 20-25, the apparatuses and systems provided in this disclosure may prevent formation of strong electric fields. The apparatuses and systems introduce electrodes for forming a smoothly subsiding electric field between them, which may avoid abrupt change of electric field that may cause field emission. Further, by covering the first and second electrodes over an isolation surface, capacitive couplings between the apparatuses or systems and the surrounding environment may be mitigated. Overall, the apparatuses and systems may provide for fast ramping of the high-voltage without causing any undesired discharging, lower possibility of wafer sticking problem, greatly increased throughput of wafer inspection, and reduced environmental harm resulted from the undesired discharging.

It should be noted that, besides using an isolator with covered electrodes, other manner may also be used for implementing fast ramping of high voltage without causing discharging. For example, the isolator may be replaced with a resistive surface, where the covered electrodes can drop the voltage difference through the resistive couplings between them provided by the resistive surface. However, heat dissipation may occur on the resistive surface, which may cause deformation of surrounding parts.

It should also be noted that the apparatuses and systems as described in association with FIGS. 20-25 are not limited to be used in wafer grounding or wafer inspection. Instead, they can be used for any system or apparatus that includes a high-voltage part and a grounded part, and has a demand for fast ramping or ramp-down. For example, such system or apparatus may include, but not limited to, a SEM, a transmission electron microscopy (TEM), or an X-ray machine.

Further embodiments may be described in the following clauses:

1. A method for grounding a wafer, the method comprising:
   receiving a first value of an electric characteristic associated with the wafer being grounded by an electric signal;
   determining a first control parameter using at least the first value; and
   controlling a characteristic of the electric signal using the first control parameter and the first value.
2. The method of clause 1, wherein the electric characteristic is associated with an electric path comprising the wafer and a wafer mount supporting the wafer.
3. The method of clause 2, further comprising:
   based on a determination that a resistance of the electric path is greater than or equal to a predetermined threshold value, determining a second control parameter using at least the first value, wherein the second control parameter and the first control parameter have different values; and
   controlling the characteristic of the electric signal using the second control parameter and the first value.
4. The method of clause 3, wherein the predetermined threshold value is 100,000 ohms.
5. The method of any of preceding clauses, wherein determining the first control parameter comprises:
   determining the first control parameter based on a comparison of the first value and a target value of the electric characteristic.
6. The method of any of preceding clauses, wherein determining the first control parameter comprises:
   determining whether a difference between the first value and the target value satisfies a threshold condition; and
   determining the first control parameter based on a determination that the difference satisfies the threshold condition.
7. The method of any of preceding clauses, wherein the electric characteristic comprises at least one of an impedance, a resistance, a capacitive reactance, an admittance, a conductance, or a capacitive susceptance.
8. The method of clause 7, wherein the electric characteristic comprises one of a resistance between the wafer and the wafer mount or a capacitive reactance between the wafer and the wafer mount.
9. The method of clause 8, wherein the threshold condition comprises the first value being smaller than or equal to the target value.
10. The method of any of preceding clauses, wherein determining the first control parameter comprises:
    determining an initial parameter using at least the first value; and
    determining the first control parameter based on at least the initial parameter, the first value, the target value, and a type of the wafer.
11. The method of clause 10, wherein determining the first control parameter comprises:
    determining the first control parameter using a machine learning technique, wherein an input to the machine learning technique comprises the initial parameter, the first value, the target value, and the type of the wafer.
12. The method of any of preceding clauses, wherein the characteristic of the electric signal comprises at least one of a voltage, a current, a profile of the voltage or the current, a frequency of the profile, a period of the profile, a phase of the profile, an amplitude of the profile, or a duration of the voltage or the current.
13. The method of any of preceding clauses, wherein the profile comprises a sinusoidal shape.

14. The method of any of preceding clauses, wherein controlling the characteristic of the electric signal using the first control parameter and the first value comprises:
changing a value of the characteristic of the electric signal using the first control parameter and the first value.

15. The method of any of preceding clauses, wherein controlling the characteristic of the electric signal comprises:
lowering a voltage of the electric signal.

16. The method of any of preceding clauses, further comprising:
receiving a second value of the electric characteristic after controlling the characteristic of the electric signal using the first control parameter and the first value;
determining a third control parameter using at least the second value, wherein the third control parameter and the first control parameter have different values; and
controlling the characteristic of the electric signal using the third control parameter and the second value.

17. The method of clause 16, wherein the third control parameter and the first control parameter are of different types.

18. A system for grounding a wafer, the system comprising:
a sensor configured to generate a first value of an electric characteristic associated with the wafer being grounded by an electric signal;
an electric signal generator configured to generate the electric signal; and
a controller including circuitry for receiving the first value of the electric characteristic, determining a first control parameter using at least the first value, and controlling a characteristic of the electric signal using the first control parameter and the first value.

19. The system of clause 18, further comprising:
a grounding pin, electrically connected between the electric signal generator and the wafer.

20. The system of any one of clauses 18-19, wherein the electric characteristic is associated with an electric path comprising the wafer, a wafer mount supporting the wafer, and the grounding pin.

21. The system of clause 20, wherein the controller includes circuitry for:
based on a determination that a resistance of the electric path is greater than or equal to a predetermined threshold value, determining a second control parameter using at least the first value, wherein the second control parameter and the first control parameter have different values; and
controlling the characteristic of the electric signal using the second control parameter and the first value.

22. The system of clause 21, wherein the predetermined threshold value is 100,000 ohms.

23. The system of any one of clauses 18-22, wherein determining the first control parameter comprises:
determining the first control parameter based on a comparison of the first value and a target value of the electric characteristic.

24. The system of any one of clauses 18-23, wherein determining the first control parameter comprises:
determining whether a difference between the first value and the target value satisfies a threshold condition; and
determining the first control parameter based on a determination that the difference satisfies the threshold condition.

25. The system of any one of clauses 18-24, wherein the electric characteristic comprises at least one of an impedance, a resistance, a capacitive reactance, an admittance, a conductance, or a capacitive susceptance.

26. The system of clause 25, wherein the electric characteristic comprises one of a resistance between the wafer and the wafer mount or a capacitive reactance between the wafer and the wafer mount.

27. The system of clause 26, wherein the threshold condition comprises the first value being smaller than or equal to the target value.

28. The system of any one of clauses 18-27, wherein determining the first control parameter comprises:
determining an initial parameter using at least the first value; and
determining the first control parameter based on at least the initial parameter, the first value, the target value, and a type of the wafer.

29. The system of clause 28, wherein determining the first control parameter comprises:
determining the first control parameter using a machine learning technique, wherein an input to the machine learning technique comprises the initial parameter, the first value, the target value, and the type of the wafer.

30. The system of any one of clauses 18-29, wherein the characteristic of the electric signal comprises at least one of a voltage, a current, a profile of the voltage or the current, a frequency of the profile, a period of the profile, a phase of the profile, an amplitude of the profile, or a duration of the voltage or the current.

31. The system of any one of clauses 18-30, wherein the profile comprises a sinusoidal shape.

32. The system of any one of clauses 18-31, wherein controlling the characteristic of the electric signal comprises:
lowering a voltage of the electric signal.

33. The system of any one of clauses 18-32, wherein the controller includes circuitry for:
receiving, from the sensor, a second value of the electric characteristic after controlling the characteristic of the electric signal using the first control parameter and the first value;
determining a third control parameter using at least the second value, wherein the third control parameter and the first control parameter have different values; and
controlling the characteristic of the electric signal using the second control parameter and the second value.

34. The system of clause 33, wherein the third control parameter and the first control parameter are of different types.

35. A method for adjusting a grounding location for a wafer, the method comprising:
terminating an electric connection between the wafer and a grounding pin in contact with the wafer;
adjusting a relative position between the wafer and the grounding pin; and
restoring the electric connection between the grounding pin and the wafer.

36. The method of clause 35, wherein terminating the electric connection between the wafer and the grounding pin comprises:

lifting the wafer away from a wafer mount supporting the wafer using lifters in contact a bottom surface of the wafer and fixed to a bottom portion of the wafer mount, wherein the grounding pin is fixed to a top portion of the wafer mount, and the grounding pin contacts the bottom surface of the wafer when the wafer rests on the top portion.
37. The method of clause 36, wherein restoring the electric connection between the grounding pin and the wafer comprises:
lowering the wafer onto the top portion of the wafer mount using the lifters.
38. The method of clause 35, wherein terminating the electric connection between the wafer and the grounding pin comprises:
lowering the grounding pin from a bottom surface of the wafer resting on a wafer mount, wherein the grounding pin is vertically movable in the wafer mount.
39. The method of clause 38, wherein restoring the electric connection between the grounding pin and the wafer comprises:
elevating the grounding pin to contact the bottom surface of the wafer.
40. The method of clause 35, wherein terminating the electric connection between the wafer and the grounding pin comprises:
lowering a top portion of a wafer mount supporting the wafer, wherein the grounding pin is fixed to the top portion of the wafer mount, a bottom surface of the wafer contacts non-movable supporters fixed to a bottom portion of the wafer mount, and the grounding pin contacts the bottom surface of the wafer when the top portion is not lowered.
41. The method of clause 40, wherein restoring the electric connection between the grounding pin and the wafer comprises:
lifting the top portion of the wafer mount.
42. The method of clause 35, wherein terminating the electric connection between the wafer and the grounding pin comprises:
removing the wafer from a wafer mount to a platform, wherein the grounding pin is fixed to the wafer mount and contact the wafer when the wafer rests on the wafer mount.
43. The method of clause 42, wherein restoring the electric connection between the grounding pin and the wafer comprises:
moving the wafer onto the wafer mount from the platform.
44. The method of any one of clauses 35-43, wherein the grounding pin contacts the bottom surface of the wafer with pressure different from pressure between the grounding pin and the bottom surface before terminating the electric connection between the wafer and the grounding pin.
45. The method of any one of clauses 35-44, wherein the grounding pin contacts the bottom surface of the wafer at the same relative position.
46. The method of any one of clause 35-45, wherein adjusting the relative position between the wafer and the grounding pin comprises:
adjusting a relative azimuthal angle between the grounding pin and the wafer by a predetermined angle.
47. The method of clause 46, wherein the predetermined angle is a difference between a current relative azimuthal angle between the wafer and the grounding pin, and a target relative azimuthal angle between the wafer and the grounding pin.
48. The method of any one of clauses 46-47, wherein adjusting the relative azimuthal angle comprises:
rotating the top portion of the wafer mount with respect to the bottom portion of the wafer mount by the predetermined angle.
49. The method of any one of clauses 46-47, wherein adjusting the relative azimuthal angle comprises:
rotating the grounding pin with respect to the wafer mount for the predetermined angle, wherein the grounding pin is rotationally movable with respect to the wafer mount.
50. The method of any one of clauses 46-47, wherein adjusting the relative azimuthal angle comprises:
causing the platform to rotate the wafer by the predetermined angle.
51. The method of any one of clauses 35-45, wherein adjusting the relative position between the wafer and the grounding pin comprises:
adjusting a relative translational distance between the wafer and the grounding pin by a predetermined distance.
52. The method of any one of clauses 35-51, further comprising:
determining whether an electric path forms for grounding the wafer; based on a determination that the electric path does not form, terminating the electric connection between the wafer and the grounding pin.
53. A system for adjusting a grounding location for a wafer, the system comprising:
a grounding pin configured to be in contact with the wafer; and
an actuator configured to terminate an electric connection between the wafer and the grounding pin, to adjust a relative position between the wafer and the grounding pin, and to restore the electric connection between the grounding pin and the wafer.
54. The system of clause 53, further comprising:
a wafer mount comprising a bottom portion and a top portion, wherein the top portion is configured to support the wafer and fix the grounding pin, the actuator is further configured to move the top portion, and the grounding pin contact a bottom surface of the wafer when the wafer rests on the top portion.
55. The system of clause 54, wherein the actuator comprises lifters in contact with the bottom surface and fixed to the bottom portion,
the grounding pin is fixed to the top portion, and
the lifters are configured to lift the wafer away from the top portion.
56. The system of clause 55, wherein the lifters are configured to lower the wafer onto the top portion.
57. The system of clause 55, wherein the actuator further comprises non-movable supporters in contact with the bottom surface and fixed to the bottom portion, and the lifters are configured to lower the top portion.
58. The system of clause 57, wherein the lifters are configured to lift the top portion.
59. The system of clause 54, wherein the grounding pin is vertically movable in the wafer mount,
the bottom surface rests on the top portion, and
the actuator configured to detach the wafer and the grounding pin is further configured to lower the grounding pin from the bottom surface.

60. The system of clause 59, wherein the actuator configured to detach the wafer and the grounding pin is further configured to:
   elevate the grounding pin to contact the bottom surface.
61. The system of clause 54, further comprising:
   a platform configured to rotate the wafer; and
   the actuator configured to detach the wafer and the grounding pin is further configured to remove the wafer from the wafer mount to the platform.
62. The system of clause 61, wherein the actuator configured to reattach the grounding pin and the wafer is further configured to move the wafer onto the wafer mount from the platform.
63. The system of any one of clauses 53-62, wherein the grounding pin contacts the bottom surface with pressure different from pressure between the grounding pin and the bottom surface before terminating the electric connection between the wafer and the grounding pin.
64. The system of any one of clauses 53-63, wherein the grounding pin contacts the bottom surface at the same relative position.
65. The system of any one of clause 54-64, wherein the actuator configured to adjust the relative position between the wafer and the grounding pin is further configured to:
   adjust a relative azimuthal angle between the grounding pin and the wafer by a predetermined angle.
66. The system of clause 65, wherein the predetermined angle is a difference between a current relative azimuthal angle between the wafer and the grounding pin, and a target relative azimuthal angle between the wafer and the grounding pin.
67. The system of any one of clauses 65-66, wherein the actuator configured to adjust the relative azimuthal angle is further configured to rotate the top portion with respect to the bottom portion by the predetermined angle.
68. The system of any one of clauses 65-66, wherein the grounding pin is rotationally movable with respect to the top portion, and
   the actuator configured to adjust the relative azimuthal angle is further configured to rotate the grounding pin with respect to the top portion for the predetermined angle.
69. The system of any one of clauses 65-66, wherein the platform is further configured to rotate the wafer by the predetermined angle.
70. The system of any one of clauses 53-69, wherein the actuator configured to adjust the relative position between the wafer and the grounding pin is further configured to:
   adjust a relative translational distance between the wafer and the grounding pin by a predetermined distance.
71. The system of any one of clauses 53-70, wherein the actuator is further configured to:
   based on a determination that an electric path does not form for grounding the wafer, terminate the electric connection between the wafer and the grounding pin.
72. A method of grounding a wafer, the method comprising:
   establishing a set of contact points between multiple probes and the wafer;
   applying a first set of electric signals to the set of contact points via the multiple probes to facilitate breakdown of a coating of the wafer; and
   based on a determination that a resistance of an electric path between the multiple probes via the wafer is greater than or equal to a predetermined threshold value, applying a second set of electric signals to the set of contact points via the multiple probes, wherein the second set of electric signals are determined based on a value of an electric characteristic associated with the wafer when applying a first set of electric signals.
73. The method of clause 72, wherein the probes comprise grounding pins.
74. The method of any one of clauses 72-73, wherein the first set of electric signals comprise a set of voltage pulses.
75. The method of any one of clauses 72-74, wherein the breakdown comprises dielectric breakdown.
76. The method of any one of clauses 72-75, wherein the predetermined threshold value is 100,000 ohms.
77. A method of grounding a wafer, the method comprising:
   establishing a first set of contact points between multiple probes and the wafer;
   applying a first set of electric signals to the first set of contact points via the multiple probes to facilitate breakdown of a coating of the wafer;
   when a resistance of an electric path between the multiple probes via the wafer is greater than or equal to a predetermined threshold value, establishing a second set of contact points between the multiple probes and the wafer; and
   applying a second set of electric signals to the second set of contact points via the multiple probes, wherein the second set of electric signals are determined based on a value of an electric characteristic associated with the wafer when applying a first set of electric signals.
78. The method of clause 77, wherein the probes comprise grounding pins.
79. The method of any one of clauses 77-78, wherein the first set of electric signals comprise a set of voltage pulses.
80. The method of any one of clauses 77-79, wherein the breakdown comprises dielectric breakdown.
81. The method of any one of clauses 77-80, wherein the predetermined threshold value is 100,000 ohms.
82. A method of grounding a wafer, the method comprising:
   causing a grounding pin to contact the wafer;
   vibrating at least one of the grounding pin or the wafer; and
   establishing an electrical connection between the grounding pin and the wafer.
83. The method of clause 82, wherein vibrating the at least one of the grounding pin or the wafer comprises:
   vibrating a vibrator coupled to the grounding pin and a top portion of a wafer mount supporting the wafer.
84. The method of clause 83, wherein the vibrator is the top portion.
85. The method of any one of clauses 82-84, wherein vibrating the at least one of the grounding pin or the wafer comprises:
   vibrating a wafer holder securing the wafer on a wafer mount supporting the wafer.
86. The method of any one of clauses 82-85, wherein vibrating the at least one of the grounding pin or the wafer comprises:

vibrating the at least one of the grounding pin or the wafer along at least one of a direction perpendicular to a surface of the wafer or a direction parallel to the surface.
87. The method of any one of clauses 82-86, wherein establishing the electrical connection between the grounding pin or the wafer comprises:
pressing the grounding pin against a surface of the wafer through a coating of the surface to have a direct contact with the wafer.
88. The method of any one of clauses 82-87, wherein establishing the electrical connection between the grounding pin or the wafer comprises:
pressing the grounding pin against the surface of the wafer through the coating of the surface, wherein the grounding pin does not fully penetrate the coating.
89. A system comprising:
a grounding pin, configured to be in contact with a wafer; and
a controller having a circuit for:
vibrating at least one of the grounding pin or the wafer; and
establishing an electric connection between the grounding pin and the wafer.
90. The system of clause 89, further comprising:
a vibrator coupled to the grounding pin and a top portion of a wafer mount supporting the wafer, configured to vibrate at least one of the grounding pin or the wafer.
91. The system of clause 90, wherein the vibrator is the top portion.
92. The system of any one of clauses 89-91, wherein vibrating the at least one of the grounding pin or the wafer comprises:
vibrating a wafer holder securing the wafer on a wafer mount supporting the wafer.
93. The system of any one of clauses 89-92, wherein vibrating the at least one of the grounding pin or the wafer comprises:
vibrating the at least one of the grounding pin or the wafer along at least one of a direction perpendicular to a surface of the wafer or a direction parallel to the surface.
94. The system of any one of clauses 89-93, wherein establishing the electrical connection between the grounding pin or the wafer comprises:
pressing the grounding pin against a surface of the wafer through a coating of the surface to have a direct contact with the wafer.
95. The system of any one of clauses 89-94, wherein establishing the electrical connection between the grounding pin or the wafer comprises:
pressing the grounding pin against the surface of the wafer through the coating of the surface, wherein the grounding pin does not fully penetrate the coating.
96. A method of grounding a wafer, the method comprising:
causing a grounding pin to penetrate through a coating on the wafer by impact; and
establishing an electrical connection between the grounding pin and the wafer.
97. The method of clause 0, wherein the coating has a thickness exceeding 0.3 microns.
98. The method of clause 96 or 0, wherein causing the grounding pin to penetrate through the coating on the wafer by the impact comprises:
causing the grounding pin to penetrate through the coating by the impact to have a direct contact with the wafer.
99. The method of clause 96 or 0, wherein causing the grounding pin to penetrate through the coating on the wafer by the impact comprises:
causing the grounding pin to penetrate through the coating by the impact, wherein the grounding pin does not fully penetrate the coating.
100. The method of clause 0, wherein a distance between a tip of the grounding pin and a surface of the wafer after the grounding pin penetrates through the coating by impact is smaller than or equal to 0.3 microns.
101. The method of any of clauses 0-0, wherein causing the grounding pin to penetrate through the coating on the wafer by impact comprises:
actuating the grounding pin toward the wafer.
102. The method of clause 0, wherein actuating the grounding pin toward the wafer comprises:
moving the grounding pin away from the wafer for a distance; and
accelerating the grounding pin toward the wafer.
103. The method of clause 101 or 0, wherein
the actuating the grounding pin toward the wafer is configured to cause kinetic energy of the grounding pin to exceed 0.0002 joules.
104. The method of clause 0 or 103, wherein the distance exceeds 100 microns or 1 millimeter.
105. The method of any of clauses 0-0, further comprising:
determining the distance based on at least one of a type of the wafer, a type of a coating of the wafer, or thickness of the coating.
106. The method of any of clauses 0-0, further comprising:
causing the grounding pin to contact the wafer before moving the grounding pin away from the wafer.
107. The method of any of clauses 0-0, wherein causing the grounding pin to penetrate through the coating on the wafer by impact comprises:
causing a mass block to impact the grounding pin toward the wafer.
108. The method of clause 0, wherein causing the mass block to impact the grounding pin toward the wafer comprises:
actuating the mass block toward the grounding pin.
109. The method of clause 0, wherein actuating the mass block toward the grounding pin comprises:
moving the mass block away from the grounding pin for a distance; and
accelerating the mass block toward the grounding pin.
110. The method of clause 108 or 0, wherein the actuating the mass block toward the grounding pin is configured to cause kinetic energy of the mass block to exceed 0.0002 joules.
111. The method of clause 0 or 110, wherein the distance exceeds 100 microns or 1 millimeter.
112. The method of any of clauses 0-0, further comprising:
determining the distance based on at least one of a type of the wafer, a type of a coating of the wafer, or thickness of the coating.
113. The method of any of clauses 0-0, further comprising:
causing the mass block to contact the grounding pin before moving the mass block away from the grounding pin.

114. The method of any of clauses 0-0, further comprising:
   causing the grounding pin to contact the wafer before moving the mass block away from the grounding pin.
115. A system comprising:
   a grounding pin; and
   a controller having circuitry for:
   controlling the grounding pin to penetrate through a coating on the wafer by impact; and
   establishing an electrical connection between the grounding pin and the wafer.
116. The system of clause 0, further comprising:
   an actuator coupled to a wafer stage supporting the wafer.
117. The system of clause 0, wherein the actuator comprises one of an electric actuator, a magnetic actuator, an electromagnetic actuator, a spring, a pneumatic actuator, or a hydraulic actuator.
118. The system of any of clauses 0-0, wherein the actuator is configured to actuate the grounding pin.
119. The system of clause 0, wherein the coating has a thickness exceeding 0.3 microns.
120. The system of clause 0 or 119, wherein the controller having circuitry for causing the grounding pin to penetrate through the coating on the wafer by the impact comprises:
   circuitry for causing the grounding pin to penetrate through the coating by the impact, wherein the grounding pin have a direct contact with the wafer or the grounding pin does not fully penetrate the coating.
121. The system of clause 0, wherein a distance between a tip of the grounding pin and a surface of the wafer after the grounding pin penetrates through the coating by impact is smaller than or equal to 0.3 microns.
122. The system of any of clauses 0-0, wherein the controller having circuitry for controlling the grounding pin to penetrate through the coating on the wafer by impact comprises:
   circuitry for actuating the grounding pin toward the wafer.
123. The system of clause 0, wherein the controller having circuitry for actuating the grounding pin toward the wafer comprises circuitry for:
   moving the grounding pin away from the wafer for a distance; and
   accelerating the grounding pin toward the wafer.
124. The system of clause 122 or 0, wherein the circuitry for actuating the grounding pin toward the wafer is configured to cause kinetic energy of the grounding pin to exceed 0.0002 joules.
125. The system of clause 0 or 124, wherein the distance exceeds 100 microns or 1 millimeter.
126. The system of any of clauses 0-0, wherein the controller having the circuitry is further for:
   determining the distance based on at least one of a type of the wafer, a type of a coating of the wafer, or thickness of the coating.
127. The system of any of clauses 0-0, wherein the controller having the circuitry is further for:
   controlling the grounding pin to contact the wafer before moving the grounding pin away from the wafer.
128. The system of any of clauses 0-0, further comprising:
   a mass block, wherein the actuator is configured to actuate the mass block.
129. The system of clause 0, wherein the controller having circuitry for controlling the grounding pin to penetrate through the coating on the wafer by impact comprises:
   circuitry for actuating the mass block to impact the grounding pin toward the wafer.
130. The system of clause 0, wherein the controller having circuitry for actuating the mass block to impact the grounding pin toward the wafer comprises:
   circuitry for actuating the mass block toward the grounding pin.
131. The system of clause 0, wherein the controller having circuitry for actuating the mass block toward the grounding pin comprises circuitry for:
   moving the mass block away from the grounding pin for a distance; and
   accelerating the mass block toward the grounding pin.
132. The system of clause 130 or 0, wherein the circuitry for actuating the mass block toward the grounding pin to cause kinetic energy of the mass block to exceed 0.0002 joules.
133. The system of clause 0 or 132, wherein the distance exceeds 100 microns or 1 millimeter.
134. The system of any of clauses 0-0, wherein the controller having the circuitry is further for:
   determining the distance based on at least one of a type of the wafer, a type of a coating of the wafer, or thickness of the coating.
135. The system of any of clauses 0-0, wherein the controller having the circuitry is further for:
   controlling the mass block to contact the grounding pin before moving the mass block away from the grounding pin.
136. The system of any of clauses 0-0, wherein the controller having the circuitry is further for:
   controlling the grounding pin to contact the wafer before moving the mass block away from the grounding pin.
137. A non-transitory computer-readable medium that stores a set of instructions that is executable by at least one processor of an apparatus to cause the apparatus to perform a method, the method comprising:
   causing a grounding pin to penetrate through the coating on the wafer by impact; and
   establishing an electrical connection between the grounding pin and the wafer.
138. A system for wafer grounding, comprising:
   a first grounding pin;
   an electrostatic holder comprising a first electrode inside the electrostatic holder; and
   a first overvoltage protection device electrically coupled between the first grounding pin and the first electrode, wherein the first overvoltage protection device is configured to:
   conduct electricity when a first voltage applied on the first overvoltage protection device exceeds a threshold voltage; and
   stop conducting electricity when the first voltage does not exceed the threshold voltage.
139. The system of clause 0, wherein the first overvoltage protection device is configured to allow conducting the electricity in a plurality of directions.
140. The system of any of clauses 0-0, wherein the threshold voltage is an electric characteristic of the first overvoltage protection device.
141. The system of any of clauses 0-0, wherein the threshold voltage is adjustable.

142. The system of any of clauses 0-0, wherein the first overvoltage protection device includes at least one of a transient-voltage-suppression (TVS) diode, a Zener diode, a varistor, or a silicon diode for alternating current (SIDAC).

143. The system of any of clauses 0-0, further comprising:
a housing comprising a concave surface configured to surround the electrostatic holder and the first grounding pin, and at least one of a first interface on the concave surface, the first interface configured to mate with wiring of the first electrode and a second interface on the concave surface, the second interface configured to mate with wiring of the first grounding pin.

144. The system of clause 0, wherein the first overvoltage protection device is inside the housing.

145. The system of clause 0, wherein the first overvoltage protection device is outside the housing.

146. The system of any of clauses 0-0, wherein the electrostatic holder comprises a second electrode inside the electrostatic holder.

147. The system of clause 0, further comprising:
a second overvoltage protection device electrically coupled between the first grounding pin and the second electrode, wherein the second overvoltage protection device is configured to:
conduct electricity when a second voltage applied on the second overvoltage protection device exceeds the threshold voltage; and
stop conducting electricity when the second voltage does not exceed the threshold voltage.

148. The system of any of clauses 0-0, further comprising:
a second grounding pin;
a third overvoltage protection device electrically coupled between the second grounding pin and the first electrode, wherein the third overvoltage protection device is configured to:
conduct electricity when a third voltage applied on the third overvoltage protection device exceeds the threshold voltage; and
stop conducting electricity when the third voltage does not exceed the threshold voltage.

149. An apparatus for fast ramping of high voltage, comprising:
an isolator arranged between a high-voltage part of the apparatus and a grounded part of the apparatus;
a first electrode electrically coupled to the high-voltage part;
a second electrode electrically coupled to the grounded part and non-conductive to the first electrode; and
a dielectric layer covering the first electrode and the second electrode over the isolator.

150. The apparatus of clause 0, wherein the dielectric layer is adhered to a surface of the isolator, and the first electrode and the second electrode are covered between the dielectric layer and the surface of the isolator.

151. The apparatus of clause 0, wherein the isolator comprises the dielectric layer, and the first electrode and the second electrode are embedded inside the isolator.

152. The apparatus of any of clauses 0-0, further comprising:
a first conductive part electrically coupled to the high-voltage part of the apparatus and capacitively coupled to the first electrode; and
a second conductive part electrically coupled to the grounded part of the apparatus and capacitively coupled to the second electrode.

153. The apparatus of clause 0, wherein a thickness of the dielectric layer is equal to or less than one tenth of the smaller of a first overlap area between the first conductive part and the first electrode, and a second overlap area between the second conductive part and the second electrode.

154. The apparatus of any of clauses 0-0, wherein a thickness of the dielectric layer is equal to or less than one fiftieth of a distance between a surface of the dielectric layer and an object capacitively coupled to the apparatus and not belonging to the apparatus.

155. The apparatus of any of clauses 0-0, wherein a material of the dielectric layer has a dielectric constant greater than or equal to $3 \times 10^{-11}$ farads per meter.

156. The apparatus of clause 0, wherein the material comprises glass or ceramic.

157. The apparatus of any of clauses 0-0, wherein the high-voltage part comprises a first surface, the grounded part comprises a second surface parallel to the first surface, and the isolator comprises a surface perpendicular to the first surface and the second surface.

158. The apparatus of any of clauses 0-0, further comprising:
a housing configured to enclose a stage supporting a wafer, wherein the high-voltage part comprises a top surface of the housing, the grounded part comprises a bottom surface of the housing, and the isolator comprises a wall of the housing.

A non-transitory computer readable medium may be provided that stores instructions for a processor (for example, processor of controller 109 of FIG. 1) to carry out image processing, data processing, database management, graphical display, operations of a charged particle beam apparatus, or another imaging device, controlling wafer grounding, controlling wafer grounding location adjustment, implementing a pin-impact method, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures illustrate the architecture, functionality, and operation of possible implementations of systems, methods, and computer hardware or software products according to various example embodiments of the present disclosure. In this regard, each block in a flowchart or block diagram may represent a module, segment, or portion of code, which includes one or more executable instructions for implementing the specified logical functions. It should be understood that in some alternative implementations, functions indicated in a block may occur out of order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

What is claimed is:

1. A system comprising:
  a grounding pin;
  a controller having circuitry for:
    controlling the grounding pin to penetrate through a coating on the wafer by impact; and
    establishing an electrical connection between the grounding pin and the wafer; and
  an actuator coupled to a wafer stage supporting the wafer and configured to actuate the grounding pin,
  wherein the controller having circuitry for controlling the grounding pin to penetrate through the coating on the wafer by impact comprises circuitry for actuating the grounding pin toward the wafer, and
  wherein the controller having circuitry for actuating the grounding pin toward the wafer comprises circuitry for:
    moving the grounding pin away from the wafer for a distance, the distance being based on at least one of a type of the wafer, a type of a coating of the wafer, or thickness of the coating; and
    accelerating the grounding pin toward the wafer.

2. The system of claim 1, wherein after the grounding pin penetrates through the coating on the wafer, the grounding pin is configured to have a direct contact with the wafer or the grounding pin does not fully penetrate the coating.

3. The system of claim 1, wherein the controller having the circuitry is further for:
  controlling the grounding pin to contact the wafer before moving the grounding pin away from the wafer.

4. The system of claim 1, further comprising:
  a mass block, wherein the actuator is configured to actuate the mass block.

5. The system of claim 4, wherein the controller having circuitry for controlling the grounding pin to penetrate through the coating on the wafer by impact comprises:
  circuitry for actuating the mass block to impact the grounding pin toward the wafer.

6. The system of claim 5, wherein the controller having circuitry for actuating the mass block to impact the grounding pin toward the wafer comprises:
  circuitry for actuating the mass block toward the grounding pin.

7. The system of claim 6, wherein the controller having circuitry for actuating the mass block toward the grounding pin comprises circuitry for:
  moving the mass block away from the grounding pin for a distance; and
  accelerating the mass block toward the grounding pin.

8. The system of claim 7, wherein the controller having the circuitry is further for:
  determining the distance based on at least one of a type of the wafer, a type of a coating of the wafer, or thickness of the coating.

9. The system of claim 7, wherein the controller having the circuitry is further for:
  controlling the mass block to contact the grounding pin before moving the mass block away from the grounding pin.

10. A non-transitory computer-readable medium that stores a set of instructions that is executable by at least one processor of an apparatus to cause the apparatus to perform a method, the method comprising:
  moving a grounding pin away from a wafer for a distance based on at least one of a type of the wafer, a type of a coating of the wafer, or thickness of the coating;
  causing the grounding pin to penetrate through the coating on the wafer by impact; and
  establishing an electrical connection between the grounding pin and the wafer.

* * * * *